United States Patent
Kimura et al.

(10) Patent No.: US 10,613,178 B2
(45) Date of Patent: Apr. 7, 2020

(54) MAGNETIC RESONANCE IMAGING APPARATUS AND IMAGE ANALYSIS APPARATUS

(71) Applicant: TOSHIBA MEDICAL SYSTEMS CORPORATION, Otawara-shi (JP)

(72) Inventors: Tokunori Kimura, Yaita (JP); Naotaka Sakashita, Utsunomiya (JP)

(73) Assignee: Canon Medical Systems Corporation, Otawara-shi (JP)

( * ) Notice: Subject to any disclaimer, the term of this patent is extended or adjusted under 35 U.S.C. 154(b) by 190 days.

(21) Appl. No.: 15/712,327

(22) Filed: Sep. 22, 2017

(65) Prior Publication Data
US 2018/0095153 A1    Apr. 5, 2018

(30) Foreign Application Priority Data

Sep. 23, 2016  (JP) ................................ 2016-186060
Sep. 23, 2016  (JP) ................................ 2016-186061

(51) Int. Cl.
*G01V 3/00*        (2006.01)
*G01R 33/54*       (2006.01)
*G01R 33/563*      (2006.01)
*G01R 33/56*       (2006.01)

(52) U.S. Cl.
CPC ....... *G01R 33/54* (2013.01); *G01R 33/56316* (2013.01); *G01R 33/56333* (2013.01); *G01R 33/5608* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | | |
|---|---|---|---|---|
| 2004/0030240 A1* | 2/2004 | Kimura | ................ | A61B 5/0263 600/420 |
| 2004/0162483 A1* | 8/2004 | Kimura | ............ | G01R 33/56308 600/419 |
| 2013/0249548 A1* | 9/2013 | Stemmer | ............ | G01R 33/4835 324/309 |
| 2013/0266199 A1* | 10/2013 | Nishihara | ............... | A61B 5/055 382/131 |
| 2015/0216428 A1* | 8/2015 | Zhou | .................... | A61B 5/0263 600/413 |

FOREIGN PATENT DOCUMENTS

JP         2004-242948         9/2004

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

In one embodiment, an MRI apparatus includes: a scanner equipped with at least a static magnetic field magnet configured to generate a static magnetic field, a gradient coil configured to apply gradient pulses, and an RF coil configured to apply RF pulses to an object and receive magnetic resonance signals from the object; and processing circuitry configured to set at least one pulse sequence which includes a labeling pulse for labeling fluid in the object, an excitation pulse applied after the labeling pulse, and a bipolar or unipolar velocity encoding gradient pulse for encoding velocity information of the fluid, and generate an image of the fluid from the magnetic resonance signals which the scanner acquires by performing the at least one pulse sequence.

16 Claims, 42 Drawing Sheets

FIG. 6B FAIR TYPE

FIG. 6A STAR TYPE

TWO-POINT METHOD

| SEQUENCE | LABELING TYPE | VENC TYPE | | |
|---|---|---|---|---|
| | | X | Y | Z |
| A | control | NOT APPLIED | NOT APPLIED | VENC + |
| B | tag | NOT APPLIED | NOT APPLIED | VENC − |

| CALCULATION | AMPLITUDE | PHASE |
|---|---|---|
| A−B | \|Scont\| −p \|Stag\| | 2Φm |

$p = -1 \ (TI < |Tinull|)$
$p = +1 \ (TI \geq |Tinull|)$

⇑ ABBREVIATION

TWO-POINT METHOD (ABBREVIATED)

| SEQUENCE | LABELING TYPE | VENC TYPE | | |
|---|---|---|---|---|
| | | X | Y | Z |
| A | 1 | 0 | 0 | 1 |
| B | −1 | 0 | 0 | −1 |

| CALCULATION | AMPLITUDE | PHASE |
|---|---|---|
| A−B | 2 | 2 |

FIG. 16

SIX-POINT METHOD (ABBREVIATED)

| SEQUENCE | LABELING TYPE | VENC TYPE | | |
|---|---|---|---|---|
| | | X | Y | Z |
| A | 1 | 1 | 0 | 0 |
| B | −1 | −1 | 0 | 0 |
| C | 1 | 0 | 1 | 0 |
| D | −1 | 0 | −1 | 0 |
| E | 1 | 0 | 0 | 1 |
| F | −1 | 0 | 0 | −1 |

| CALCULATION | AMPLITUDE | PHASE | | |
|---|---|---|---|---|
| P=A−B | 2 | 2 | 0 | 0 |
| Q=C−D | 2 | 0 | 2 | 0 |
| R=E−F | 2 | 0 | 0 | 2 |
| S=A+B+C+D+E+F | 0 | 0 | 0 | 0 |

FIG. 17

HADAMARD FOUR-POINT METHOD (ABBREVIATED)

| SEQUENCE | LABELING TYPE | VENC TYPE | | |
|---|---|---|---|---|
| | | X | Y | Z |
| A | 1 | 1 | 1 | 1 |
| B | −1 | −1 | 1 | −1 |
| C | 1 | 1 | −1 | −1 |
| D | −1 | −1 | −1 | 1 |

| CALCULATION | AMPLITUDE | PHASE | | |
|---|---|---|---|---|
| P=A−B+C−D | 4 | 4 | 0 | 0 |
| Q=A+B−C−D | 0 | 0 | 4 | 0 |
| R=A−B−C+D | 0 | 0 | 0 | 4 |
| S=A+B+C+D | 0 | 0 | 0 | 0 |

FIG. 18

MULTI-LABELING/MULTI-TI/HADAMARD FOUR-POINT METHOD
(ABBREVIATED)

| SEQUENCE | LABELING TYPE | | | | VENC TYPE | | |
|---|---|---|---|---|---|---|---|
| | TI4 | TI3 | TI2 | TI1 | X | Y | Z |
| A | 1 | 1 | 1 | 1 | 1 | 1 | 1 |
| B | −1 | 1 | −1 | 1 | −1 | 1 | −1 |
| C | 1 | −1 | −1 | 1 | 1 | −1 | −1 |
| D | −1 | −1 | 1 | 1 | −1 | −1 | 1 |

| CALCULATION | AMPLITUDE | | | | PHASE | | |
|---|---|---|---|---|---|---|---|
| P=A−B+C−D | 4 | 0 | 0 | 0 | 4 | 0 | 0 |
| Q=A+B−C−D | 0 | 4 | 0 | 0 | 0 | 4 | 0 |
| R=A−B−C+D | 0 | 0 | 4 | 0 | 0 | 0 | 4 |
| S=A+B+C+D | 0 | 0 | 0 | 4 | 0 | 0 | 0 |

MULTI-LABELING/MULTI-TI/HADAMARD EIGHT-POINT METHOD

| SEQUENCE | LABELING TYPE ||||||||| late phase VENC TYPE ||| early phase VENC TYPE |||
|---|---|---|---|---|---|---|---|---|---|---|---|---|---|---|
| | TI8 | TI7 | TI6 | TI5 | TI4 | TI3 | TI2 | TI1 | X | Y | Z | X | Y | Z |
| A | 1 | 1 | 1 | 1 | 1 | 1 | 1 | 1 | 1 | 1 | 1 | 1 | 1 | 1 |
| B | -1 | 1 | 1 | 1 | 1 | 1 | -1 | 1 | -1 | 1 | -1 | -1 | -1 | -1 |
| C | 1 | -1 | 1 | 1 | -1 | -1 | 1 | 1 | -1 | -1 | -1 | -1 | 1 | 1 |
| D | -1 | 1 | -1 | 1 | 1 | -1 | 1 | -1 | -1 | -1 | 1 | 1 | -1 | 1 |
| E | 1 | 1 | -1 | 1 | -1 | 1 | -1 | -1 | -1 | 1 | -1 | -1 | -1 | 1 |
| F | -1 | -1 | 1 | 1 | -1 | 1 | 1 | -1 | 1 | 1 | -1 | 1 | -1 | -1 |
| G | 1 | -1 | -1 | 1 | 1 | -1 | -1 | 1 | -1 | 1 | 1 | -1 | 1 | -1 |
| H | -1 | -1 | 1 | 1 | 1 | 1 | -1 | -1 | -1 | 1 | 1 | 1 | 1 | -1 |

| CALCULATION | AMPLITUDE ||||||||| PHASE ||| PHASE |||
|---|---|---|---|---|---|---|---|---|---|---|---|---|---|---|
| P=A-B+C-D+E-F+G-H | 8 | 0 | 0 | 0 | 0 | 0 | 0 | 0 | 0 | 0 | 0 | 0 | 0 | 0 |
| Q=A+B-C-D+E+F-G-H | 0 | 8 | 0 | 0 | 0 | 0 | 0 | 0 | 0 | 0 | 0 | 0 | 0 | 0 |
| R=A-B-C+D+E-F-G+H | 0 | 0 | 8 | 0 | 0 | 0 | 0 | 0 | 0 | 0 | 8 | 0 | 0 | 0 |
| S=A+B+C+D+E+F+G+H | 0 | 0 | 0 | 0 | 0 | 0 | 0 | 8 | 8 | 0 | 0 | 8 | 0 | 0 |
| T=A+B+C+D-(E-F+G-H) | 0 | 0 | 0 | 8 | 0 | 0 | 0 | 0 | 0 | 0 | 0 | 0 | 8 | 0 |
| U=A+B-C-D-(E+F-G-H) | 0 | 0 | 0 | 0 | 8 | 0 | 0 | 0 | 0 | 0 | 0 | 0 | 0 | 0 |
| V=A-B-C+D-(E-F-G+H) | 0 | 0 | 0 | 0 | 0 | 8 | 0 | 0 | 0 | 8 | 0 | 0 | 0 | 0 |
| W=A+B+C+D-(E+F+G+H) | 0 | 0 | 0 | 0 | 0 | 0 | 8 | 0 | 0 | 0 | 0 | 0 | 0 | 0 |

MULTI-LABELING/MULTI-TI/HADAMARD/DUAL FOUR-POINT METHOD (ABBREVIATED)

| SEQUENCE | LABELING TYPE ||||||||| VENC TYPE |||
|---|---|---|---|---|---|---|---|---|---|---|---|
| | TI8 | TI7 | TI6 | TI5 | TI4 | TI3 | TI2 | TI1 | X | Y | Z |
| A | 1 | 1 | 1 | 1 | 1 | 1 | 1 | 1 | 1 | 1 | 1 |
| B | -1 | 1 | -1 | 1 | -1 | 1 | -1 | 1 | -1 | 1 | -1 |
| C | 1 | -1 | -1 | 1 | 1 | -1 | -1 | 1 | 1 | -1 | -1 |
| D | -1 | -1 | 1 | 1 | -1 | -1 | 1 | 1 | -1 | -1 | 1 |
| E | 1 | 1 | 1 | 1 | 1 | 1 | 1 | 1 | 1 | 1 | 1 |
| F | -1 | 1 | -1 | 1 | -1 | 1 | -1 | 1 | -1 | 1 | -1 |
| G | 1 | -1 | -1 | 1 | 1 | -1 | -1 | 1 | 1 | -1 | -1 |
| H | -1 | -1 | 1 | 1 | -1 | -1 | 1 | 1 | -1 | -1 | 1 |

| CALCULATION | AMPLITUDE ||||||||| PHASE |||
|---|---|---|---|---|---|---|---|---|---|---|---|
| | | | | | | | | | X | Y | Z |
| P=A-B+C-D | 4 | 0 | 0 | 0 | 4 | 0 | 0 | 0 | 4 | 0 | 0 |
| Q=A+B-C-D | 0 | 4 | 0 | 0 | 0 | 0 | 0 | 0 | 0 | 4 | 0 |
| R=A-B-C+D | 0 | 0 | 4 | 0 | 0 | 4 | 4 | 0 | 0 | 0 | 4 |
| S=A+B+C+D | 0 | 0 | 0 | 4 | 0 | 0 | 0 | 4 | 0 | 0 | 0 |
| T=E-F+G-H | 4 | 0 | 0 | 0 | -4 | 0 | 0 | 0 | 4 | 0 | 0 |
| U=E+F-G-H | 0 | 4 | 0 | 0 | 0 | -4 | 0 | 0 | 0 | 4 | 0 |
| V=E-F-G+H | 0 | 0 | 4 | 0 | 0 | 0 | -4 | 0 | 0 | 0 | 4 |
| W=E+F+G+H | 0 | 0 | 0 | 4 | 0 | 0 | 0 | -4 | 0 | 0 | 0 |

FIG. 27

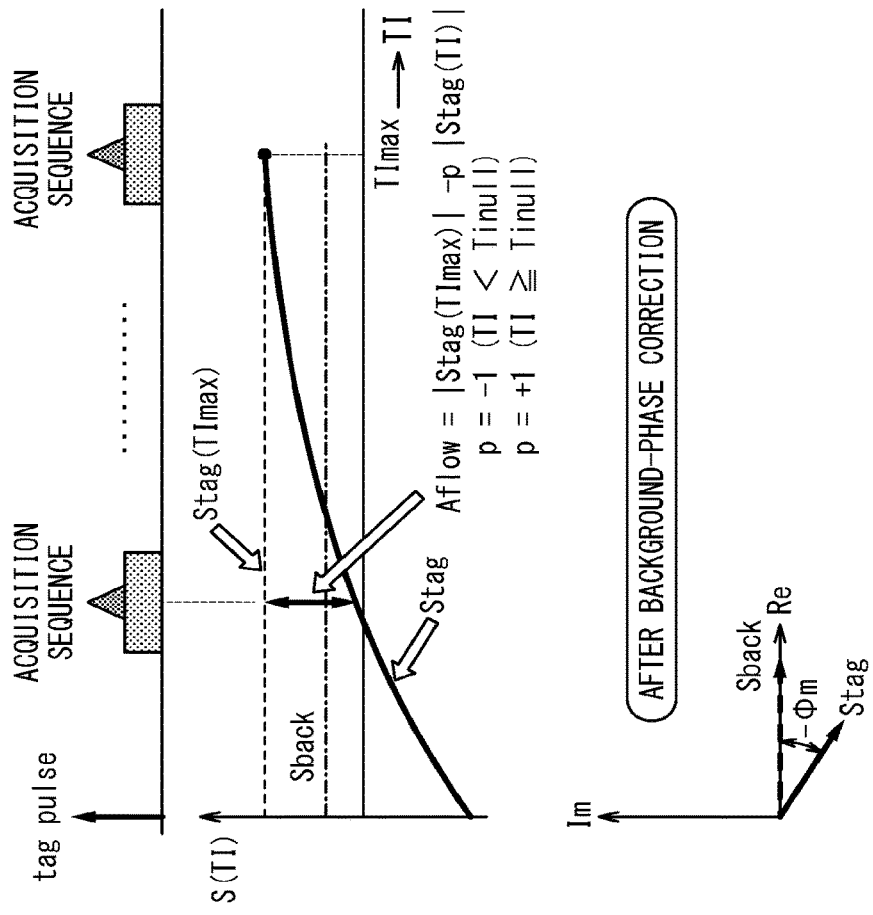
FIG. 30B
FIG. 30C
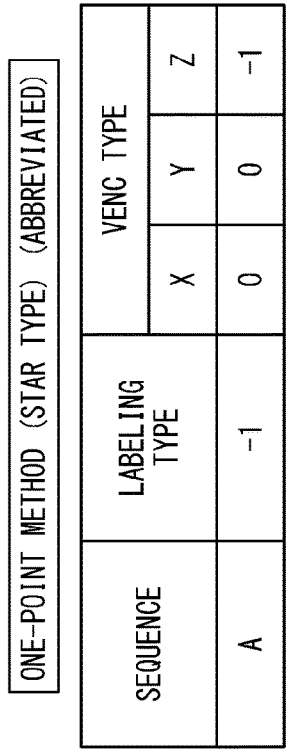
FIG. 30D
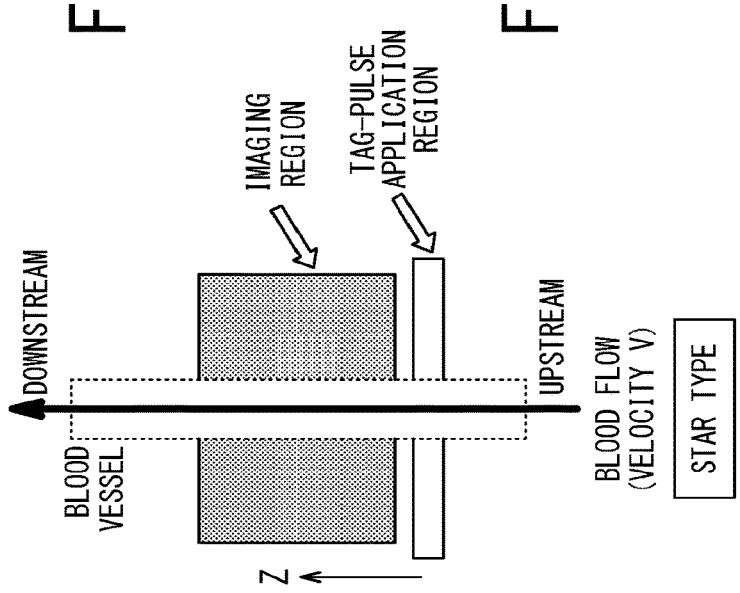
FIG. 30A

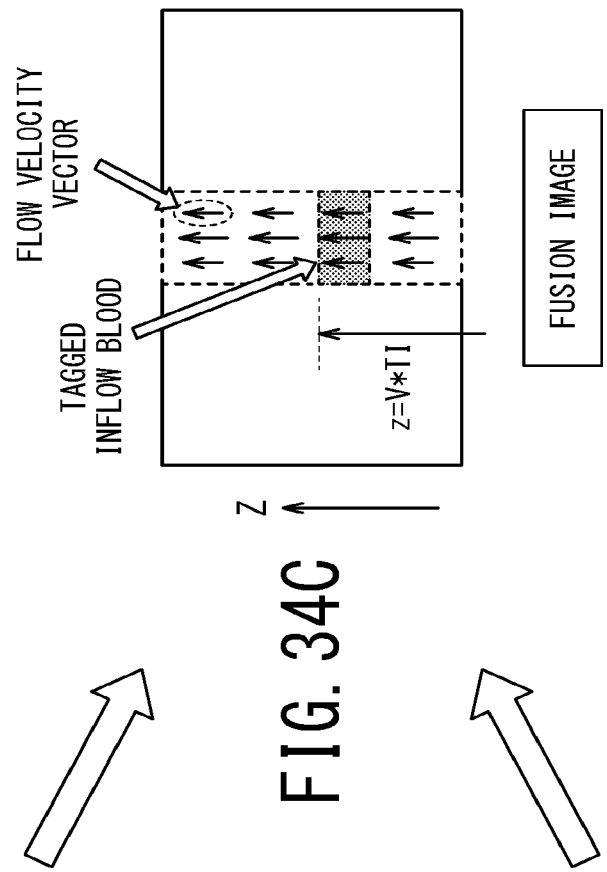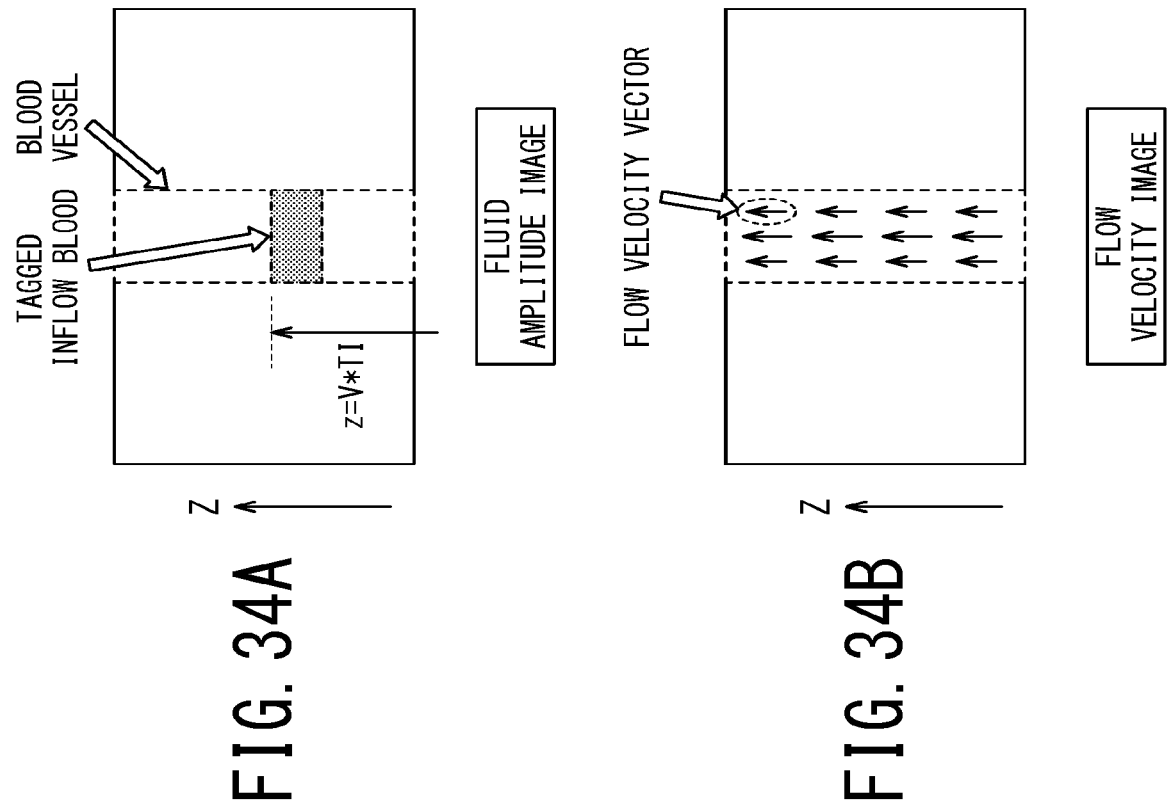

PERIPHERAL ARTERY AND VEIN EXTRACTED FROM FLOW VELOCITY-IMAGE

ARTERY EXTRACTED FROM FLUID AMPLITUDE-IMAGE

FLOW VELOCITY VECTOR
(AFTER CORRECTION)

FLOW VELOCITY VECTOR
(BEFORE CORRECTION)

POSITION Pa OF LABELED FLUID CALCULATED
FROM FLUID AMPLITUDE-IMAGE
AND FLOW VELOCITY VECTOR CALCULATED
FROM FLOW VELOCITY IMAGE

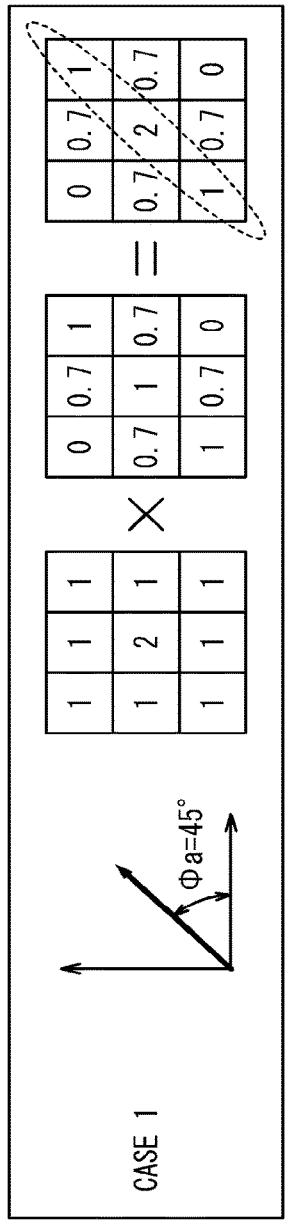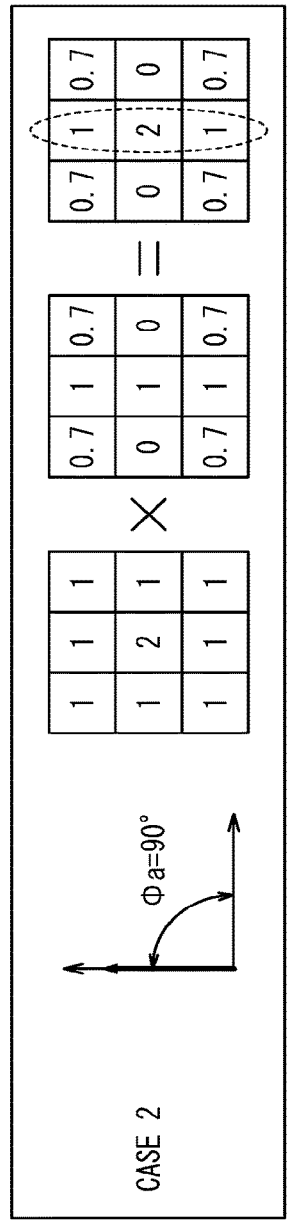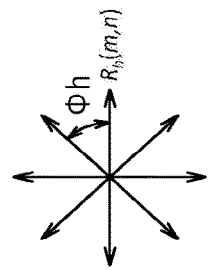
$$N(m,n,i,j) = \langle R_h(m,n), R_a(i,j)\rangle / \{\|R_h(m,n)\| \cdot \|R_a(i,j)\|\} = \cos(\Phi_a - \Phi_h)$$
$$H_1(m,n,i,j) = \langle H_0(m,n), N(m,n,i,j)\rangle$$
FIG. 41

MAGNETIC RESONANCE IMAGING APPARATUS AND IMAGE ANALYSIS APPARATUS

CROSS-REFERENCE TO RELATED APPLICATIONS

This application is based upon and claims the benefit of priority from Japanese Patent Applications No. 2016-186060, filed on Sep. 23, 2016 and No. 2016-186061 filed on Sep. 23, 2016, the entire contents of each of which are incorporated herein by reference.

FIELD

Embodiments described herein relate generally to a magnetic resonance imaging (MRI) apparatus.

BACKGROUND

An MRI apparatus is an imaging apparatus which magnetically excites nuclear spin of an object placed in a static magnetic field with a radio frequency (RF) pulse having the Larmor frequency and reconstructs an image on the basis of magnetic resonance (MR) signals emitted from the object due to the excitation.

In the field of MRI, there are known imaging methods such as the arterial spin labeling (ASL) method and the phase contrast (PC) method.

The ASL method is an imaging method in which longitudinal magnetization of fluid such as intravascular blood and/or cerebrospinal fluid (CSF) is labeled by a labeling pulse and then MR signals are acquired after a predetermined waiting time by applying an imaging sequence with an excitation pulse. Under the ASL method, it is possible to generate an image in which the position of the labeled fluid after the predetermined waiting time is correctly depicted. Under the ASL method, it is also possible to correctly trace change in the position of the labeled fluid (i.e., movement of the labeled fluid) by performing plural imaging sequences, waiting times of which are different from each other.

However, it is impossible under the ASL method to depict a position and/or movement of unlabeled fluid. Thus, it is difficult to grasp movement of fluid in the entire FOV (Field of View) space from data obtained by the ASL method.

The PC method is an imaging method in which a gradient magnetic field called a velocity encoding pulse is applied posterior to application of each excitation pulse and then each MR signal is acquired by applying a readout gradient pulse. The phase of each MR signal is changed by the velocity encoding pulse depending on velocity of fluid at each position in an FOV (Field of View). As the result, it is possible to obtain velocity information of the fluid for each pixel position in the entire FOV space from phase change of each MR signal acquired by the PC method.

However, information obtained by the PC method is velocity information in an FOV at a certain time. Thus, it is impossible under the PC method to obtain trace information indicative of how specific blood moves in an FOV.

Although the ASL method and the PC method are different in merit and demerit from each other as described above, in conventional technology, each of imaging under the ASL method and imaging under the PC method has been performed by a separate pulse sequence. Thus, in order to obtain respective merits of the ASL method and the PC method, both of imaging under the ASL method and imaging under the PC method are required for generating each image, and thus its total imaging time has become long. Additionally, in the conventional technology, since it has been impossible to perform imaging under the ASL method and imaging under the PC method at the same time, there has been a time gap between execution of the ASL method and execution of the PC method. This time gap causes a risk that behaviors of fluid to be imaged, such as a position and velocity do not coincide between the ASL method and the PC method.

BRIEF DESCRIPTION OF THE DRAWINGS

In the accompanying drawings:

FIG. 16 is a schematic diagram illustrating notation methods of abbreviating pulse sequences in the fourth embodiment and the subsequent embodiments;

FIG. 17 is a table illustrating respective pulse sequences of the independent six-point method and calculation of the fourth embodiment in the abbreviated notation shown in FIG. 16;

FIG. 18 is a table illustrating respective pulse sequences of the Hadamard four-point method and calculation of the fifth embodiment in the abbreviated notation;

FIG. 21 is a table illustrating respective pulse sequences and calculation of the sixth embodiment in the abbreviated notation;

FIG. 26 is a table illustrating pulse sequences of the second modification of the sixth embodiment;

FIG. 27 is a table illustrating pulse sequences of the third modification of the sixth embodiment;

FIG. 30A to FIG. 30D are conceptual diagrams illustrating processing of generating a fluid amplitude image and a fluid phase image from one pulse sequence (A) of the STAR type;

FIG. 34A to FIG. 34C are conceptual diagrams illustrating a fusion image which is generated from a fluid amplitude image and a flow velocity image;

FIG. 41 is a schematic diagram illustrating a concept of correcting a velocity vector in the thirteenth embodiment.

DETAILED DESCRIPTION

Hereinbelow, embodiments of MRI apparatuses and image analysis apparatuses will be described with reference to the accompanying drawings.

In one embodiment, an MRI apparatus includes: a scanner equipped with at least a static magnetic field magnet configured to generate a static magnetic field, a gradient coil configured to apply gradient pulses, and an RF coil configured to apply RF pulses to an object and receive magnetic resonance signals from the object; and processing circuitry configured to set at least one pulse sequence which includes a labeling pulse for labeling fluid in the object, an excitation pulse applied after the labeling pulse, and a bipolar or unipolar velocity encoding gradient pulse for encoding velocity information of the fluid, and to generate an image of the fluid from the magnetic resonance signals which the scanner acquires by performing the at least one pulse sequence.

First Embodiment

Figure 1:
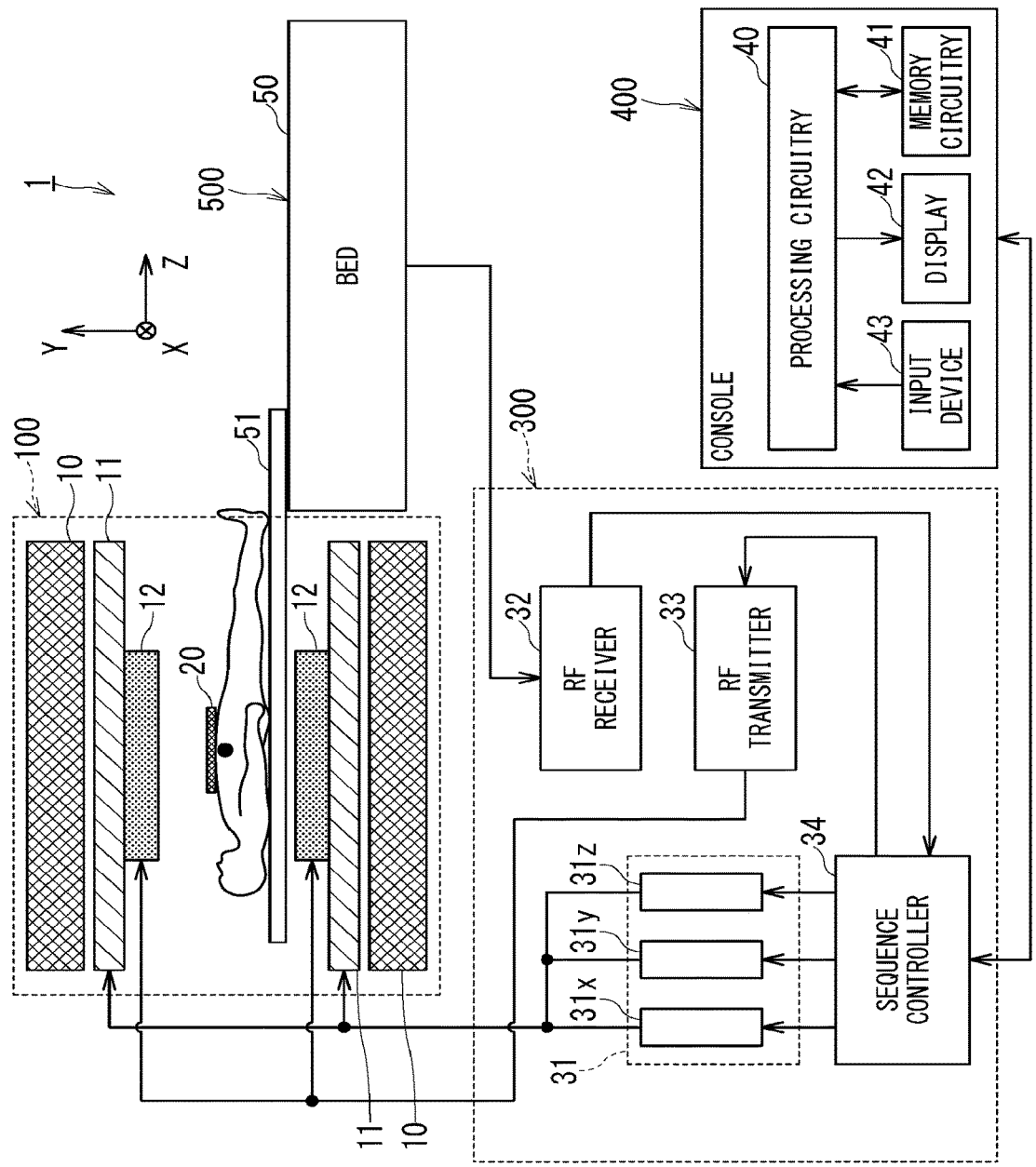
FIG. 1 is a block diagram showing overall configuration of the MRI apparatus of the first embodiment.

FIG. 1 is a block diagram illustrating overall configuration of the MRI apparatus 1 of the first embodiment. The MRI apparatus 1 of first embodiment includes at least a gantry 100, a control cabinet 300, a console 400, and a bed 500.

The gantry 100 includes, e.g., a static magnetic field magnet 10, a gradient coil 11, and a whole body (WB) coil 12, and these components are included in a cylindrical housing. The bed 500 includes a bed body 50 and a table 51. Additionally, the MRI apparatus 1 further includes an array coil 20 to be placed onto an object.

The control cabinet 300 includes three gradient coil power supplies 31 (31$x$ for an X-axis, 31$y$ for a Y-axis, and 31$z$ for a Z-axis), an RF receiver 32, an RF transmitter 33, and a sequence controller 34.

The static magnetic field magnet 10 of the gantry 100 is substantially in the form of a cylinder, and generates a static magnetic field inside a bore, which is an imaging region of an object (i.e., a patient). The bore is a space inside the cylindrical structure of the static magnetic field magnet 10. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a non-illustrated static magnetic field power supply in an excitation mode. Afterward, the static magnetic field magnet 10 shifts to a permanent current mode, and the static magnetic field supply 30 is separated. Once it enters the permanent current mode, the static magnetic field magnet 10 continues to generate a strong static magnetic field for a long time, e.g., over one year. Note that the static magnetic field magnet 10 may be configured as a permanent magnet.

The gradient coil 11 is also substantially in the form of a cylinder, and is fixed to the inside of the static magnetic field magnet 10. This gradient coil 11 applies gradient magnetic fields to an object in the respective directions of the X-axis, the Y-axis, and the Z-axis by using electric currents supplied from the gradient coil power supplies 31x, 31y, and 31z.

The bed body 50 of the bed 500 can move the table 51 in the upward and downward directions, and moves the table 51 with the object loaded thereon to a predetermined height before imaging. Afterward, when the object is imaged, the bed body 50 moves the table 51 in the horizontal direction so as to move the object to inside of the bore.

The WB body coil 12 is shaped substantially in the form of a cylinder so as to surround an object, and is fixed to the inside of the gradient coil 11. The WB coil 12 applies RF pulses transmitted from the RF transmitter 33 to the object, and receives MR signals emitted from the object due to excitation of hydrogen nuclei.

The array coil 20 is an RF coil, and receives MR signals emitted from the object at positions adjacent to the object. The array coil 20 is, for instance, configured of plural coil elements. Although there are various types for the array coil 20 such as a head coil, a chest coil, a spine coil, a lower limb coil, and a whole-body type coil according to an anatomical imaging part of the object, the array coil 20 for the chest part is illustrated in FIG. 1.

The RF transmitter 33 transmits RF pulses to the WB coil 12 on the basis of commands inputted from the sequence controller 34.

The RF receiver 32 receives MR signals received by the WB coil 12 and/or the array coil 20, and transmits raw data obtained by digitizing the received MR signals to the sequence controller 34.

The sequence controller 34 performs a scan of the object by driving the gradient coil power supplies 31x, 31y, and 31z, the RF transmitter 33, and the RF receiver 32 under the control of the console 400. When the sequence controller 34 receives raw data from the RF receiver 32 by performing a scan, the sequence controller 34 transmits the received raw data to the console 400.

The sequence controller 34 includes non-illustrated processing circuitry which is configured of a processor for executing predetermined programs and/or hardware such as a field programmable gate array (FPGA) and an application specific integrated circuit (ASIC).

The console 400 is configured as a computer which includes processing circuitry 40, memory circuitry 41, a display 42, and an input device 43.

The memory circuitry 41 is a recording medium including a read-only memory (ROM) and a random access memory (RAM) in addition to an external memory device such as a hard disk drive (HDD) and an optical disc device. The memory circuitry 41 stores various programs executed by a processor of the processing circuitry 40 as well as various types of data and information.

The input device 43 includes various devices for an operator to input various types of information and data, and is configured of, e.g., a mouse, a keyboard, a trackball, and/or a touch panel.

The display 42 is a display device such as a liquid crystal display panel, a plasma display panel, and an organic EL panel.

The processing circuitry 40 is, e.g., a circuit equipped with a central processing unit (CPU) and/or a special-purpose or general-purpose processor. The processor implements various functions described below by executing programs stored in the memory circuitry 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 controls the entirety of the MRI apparatus 1 by controlling each of the above-described components. Specifically, the console 400 receives commands and various types of information such as imaging conditions inputted via, e.g., a mouse and a keyboard (of the input device 43) operated by an operator such as an MRI imaging technician. Further, the processing circuitry 40 causes the sequence controller 34 to perform a scan on the basis of the inputted imaging conditions, and then reconstructs images on the basis of raw data transmitted from the sequence controller 34. Reconstructed images are displayed on the display 42 and stored as image data in the memory circuitry 41.

Moreover, the MRI apparatus 1 of the first embodiment acquires MR signals by performing a predetermined scan described below, reconstructs complex images from the acquired MR signals, and generates a fluid amplitude image and a flow velocity image from the complex images.

Figure 2:
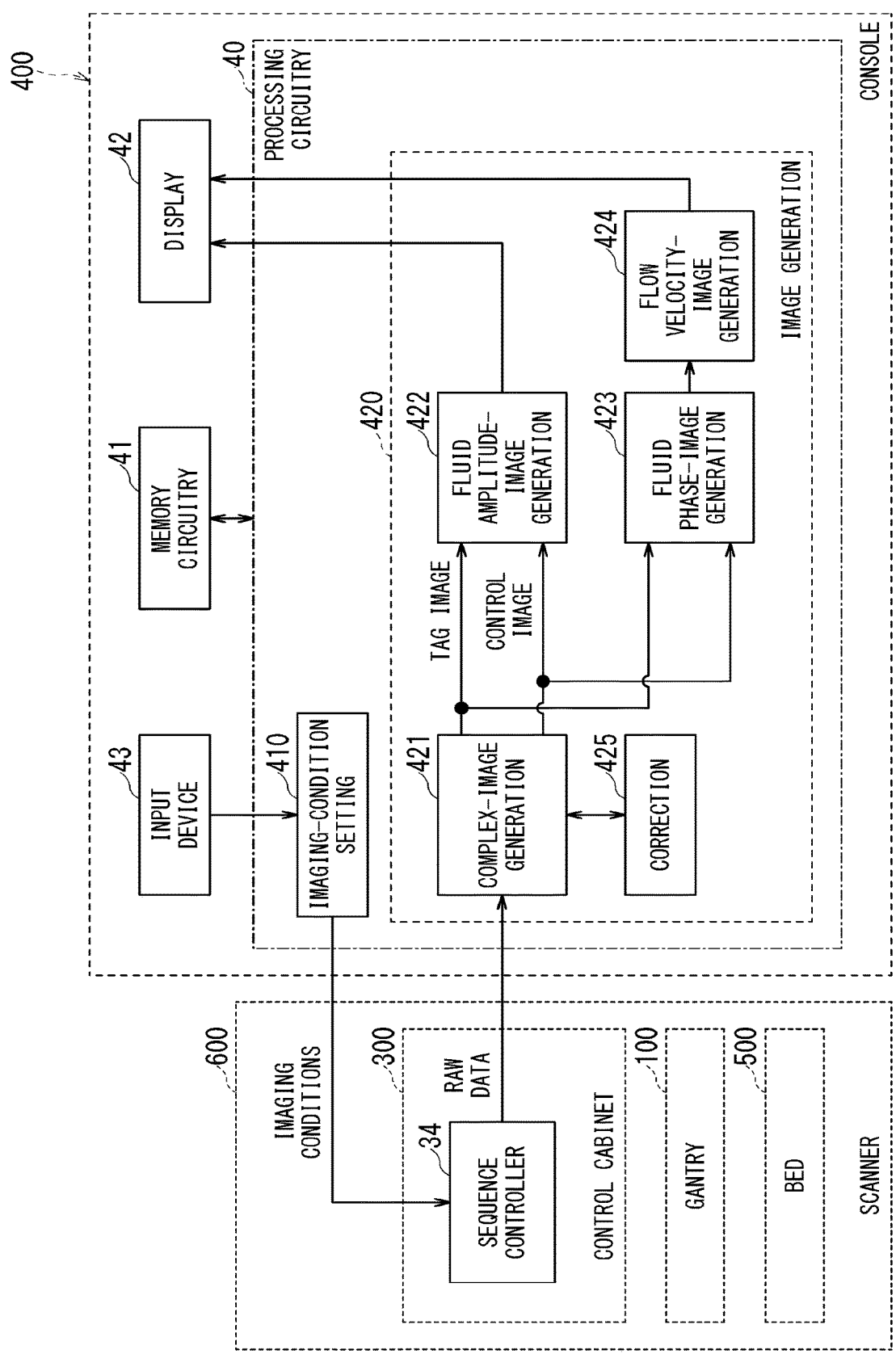
FIG. 2 is a block diagram illustrating components related to image generation according to the MRI apparatus of the first embodiment.

FIG. 2 is a block diagram illustrating components related to the above-described generation of a fluid amplitude image and a flow velocity image in the MRI apparatus 1. As shown in FIG. 2, the processing circuitry 40 of the MRI apparatus 1 implements each of an imaging-condition setting function 410, a complex-image generation function 421, a fluid-amplitude-image generation function 422, a fluid-phase-image generation function 423, a flow-velocity-image generation function 424, and a correction function 425. The entirety of the complex-image generation function 421, the fluid-amplitude-image generation function 422, the fluid-phase-image generation function 423, the flow-velocity-image generation function 424, and the correction function 425 constitutes an image generation function 420. As described above, the processor of the processing circuitry 40 implements each of those functions by executing predetermined programs, for example.

Out of the components of the MRI apparatus 1 shown in FIG. 1, all the components except the console 400 (i.e., the control cabinet 300, the gantry 100, and the bed 500) constitute a scanner 600.

Out of the above-described components, the imaging-condition setting function 410 sets imaging conditions such as types of pulse sequences to be used in actual imaging and various parameters of the pulse sequences on the sequence controller 34. For instance, these imaging conditions are inputted by an operator via the input device 43. Additionally or alternatively, an operator can change previously stored imaging conditions by operating the input device 43.

Figure 3:
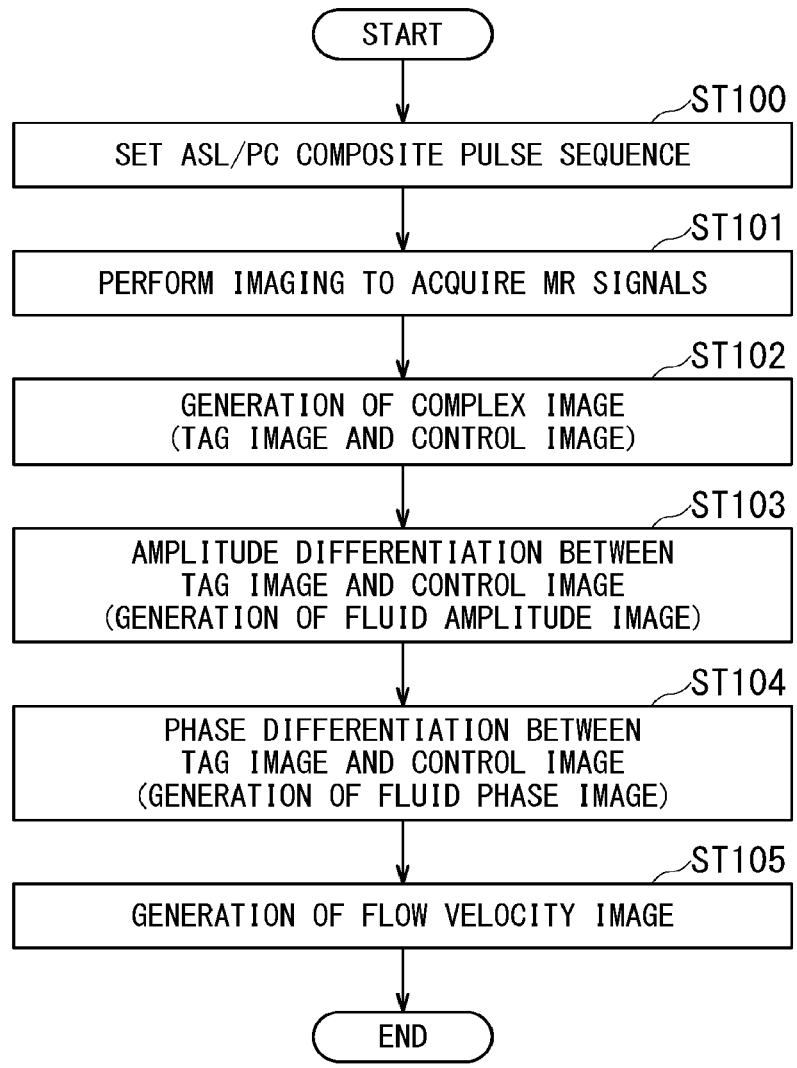
FIG. 3 is a flowchart illustrating an operation performed by the MRI apparatus of the first embodiment.

FIG. 3 is a flowchart illustrating an operation performed by the MRI apparatus 1 of the first embodiment. On the basis of the flowchart of FIG. 3, the operation of the MRI apparatus 1 of the first embodiment will be described in detail by referring to FIG. 4 to FIG. 9 as required.

In the step ST100 of FIG. 3, the imaging-condition setting function 410 (FIG. 2) sets a composite pulse sequence in which the ASL method and the PC method are composed.

Figure 4:
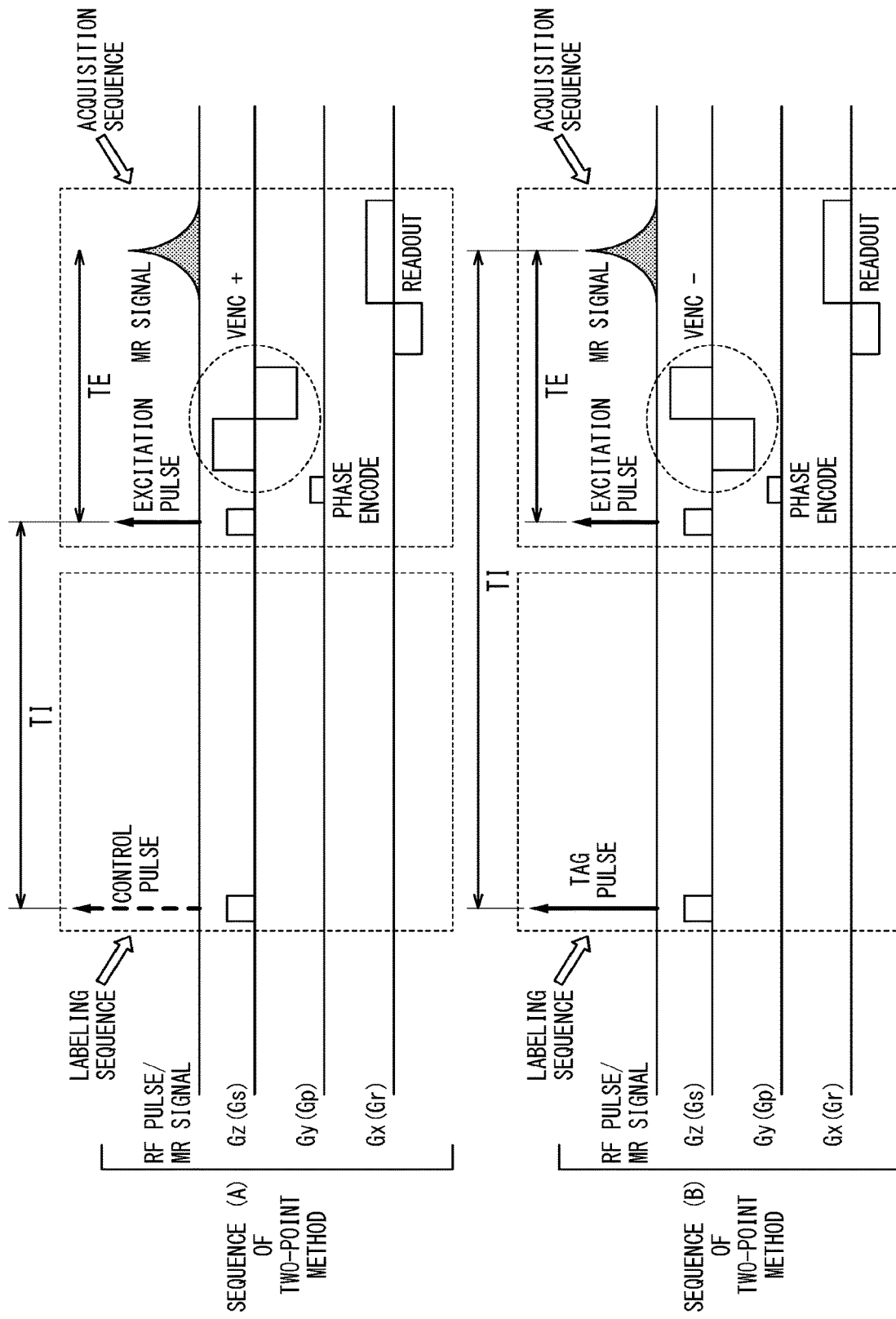
FIG. 4 is the first timing chart illustrating pulse sequences performed by the MRI apparatus of the first embodiment.

FIG. 4 is a timing chart illustrating pulse sequences to be set in the first embodiment. In the first embodiment, the MRI apparatus 1 performs two types of pulse sequences including the pulse sequence (A) and the pulse sequence (B) shown in FIG. 4 so as to separately acquire MR signals. Thus, the method of acquiring MR signals in the first embodiment is referred to as the independent two-point method.

Each of the pulse sequences (A) and (B) includes a labeling sequence and an acquisition sequence. In each of the pulse sequences (A) and (B) shown in FIG. 4, the top part indicates an application timing of each RF pulse and an acquisition timing of each MR signal, the second top part indicates an application timing of each Z-axis gradient pulse Gz, the third top part indicates an application timing of each Y-axis gradient pulse Gy, and the bottom part indicates an application timing of each X-axis gradient pulse Gx.

Although each Z-axis gradient pulse Gz, each Y-axis gradient pulse Gy, and each X-axis gradient pulse Gx respectively corresponds to a slice selection gradient pulse Gs, a phase encode gradient pulse Gp, and a readout gradient pulse Gr, these logical gradient pulses Gs, Gp, and Gr may be set independently of the physical three-axial gradient pulses Gz, Gy, and Gx.

Each labeling sequence includes an arterial spin labeling (ASL) pulse which changes magnitude of longitudinal magnetization of spin of fluid. An ASL pulse is also called a labeling pulse in some cases. ASL pulses include two types which are a tag pulse and a control pulse. Hereinafter, the tag pulse and the control pulse are collectively referred to as ASL pulse(s). In the case of FIG. 4, the pulse sequence (A) includes a control pulse as an ASL pulse and the pulse sequence (B) includes a tag pulse as an ASL pulse. Note that although respective flip angles of the control pulse and the tag pulse are the same in the case of FIG. 4, respective application regions of the control pulse and the tag pulse are different from each other.

The acquisition sequence is applied after a predetermined waiting time TI from the application of the ASL pulse of the labeling sequence. The acquisition sequence has a velocity encode (VENC) pulse, which is a gradient pulse for changing a phase of transverse magnetization of fluid depending on velocity of the fluid. Hereinafter, a velocity encode pulse is referred to as a VENC pulse. For the case of the field echo (FE) method, a VENC pulse is a bipolar type as shown in FIG. 4. On the other hand, for the case of the spin echo (SE) method, though it is not illustrated, two gradient pulses of the same polarity (i.e., a pair of unipolar gradient pulses) are applied as one VENC pulse with a refocusing pulse (180° RF pulse) interposed therebetween. A VENC pulse is applied between the excitation pulse and the readout gradient pulse.

There are two types of VENC pulses. The first type is such a VENC pulse that a positive gradient pulse is followed by a negative gradient pulse, and this VENC pulse is referred to as a positive VENC pulse and abbreviated as a "VENC (+) pulse" in the following description. The second type is such a VENC pulse that a negative gradient pulse is followed by a positive gradient pulse, and this VENC pulse is referred to as a negative VENC pulse and abbreviated as a "VENC (−) pulse" in the following description. In the case of FIG. 4, the acquisition sequence of the pulse sequence (A) includes a VENC (+) pulse and the acquisition sequence of the pulse sequence (B) includes a VENC (−) pulse.

A combination of a type of ASL pulse and a type of VENC pulse is not limited to the case of FIG. 4. It is sufficient that the type of the ASL pulse included in one of the two pulse sequences (A) and (B) is different from the type of the ASL pulse included in the other of the two pulse sequences (A) and (B). Similarly, it is sufficient that the type of the VENC pulse included in one of the two pulse sequences (A) and (B) is different from the type of the VENC pulse included in the other of the two pulse sequences (A) and (B).

Although the respective acquisition sequences of the two pulse sequences (A) and (B) are different in type of a VENC pulse from each other, the rest of the gradient pulses (i.e., the slice selection gradient pulse, the phase encoding gradient pulse, and the readout gradient pulse) and the excitation pulse are the same between the pulse sequences (A) and (B).

Although only one acquisition sequence corresponding to one phase encode is shown in FIG. 4 for avoiding complication, actually plural phase encodes are necessary for reconstructing one image.

Figure 5:
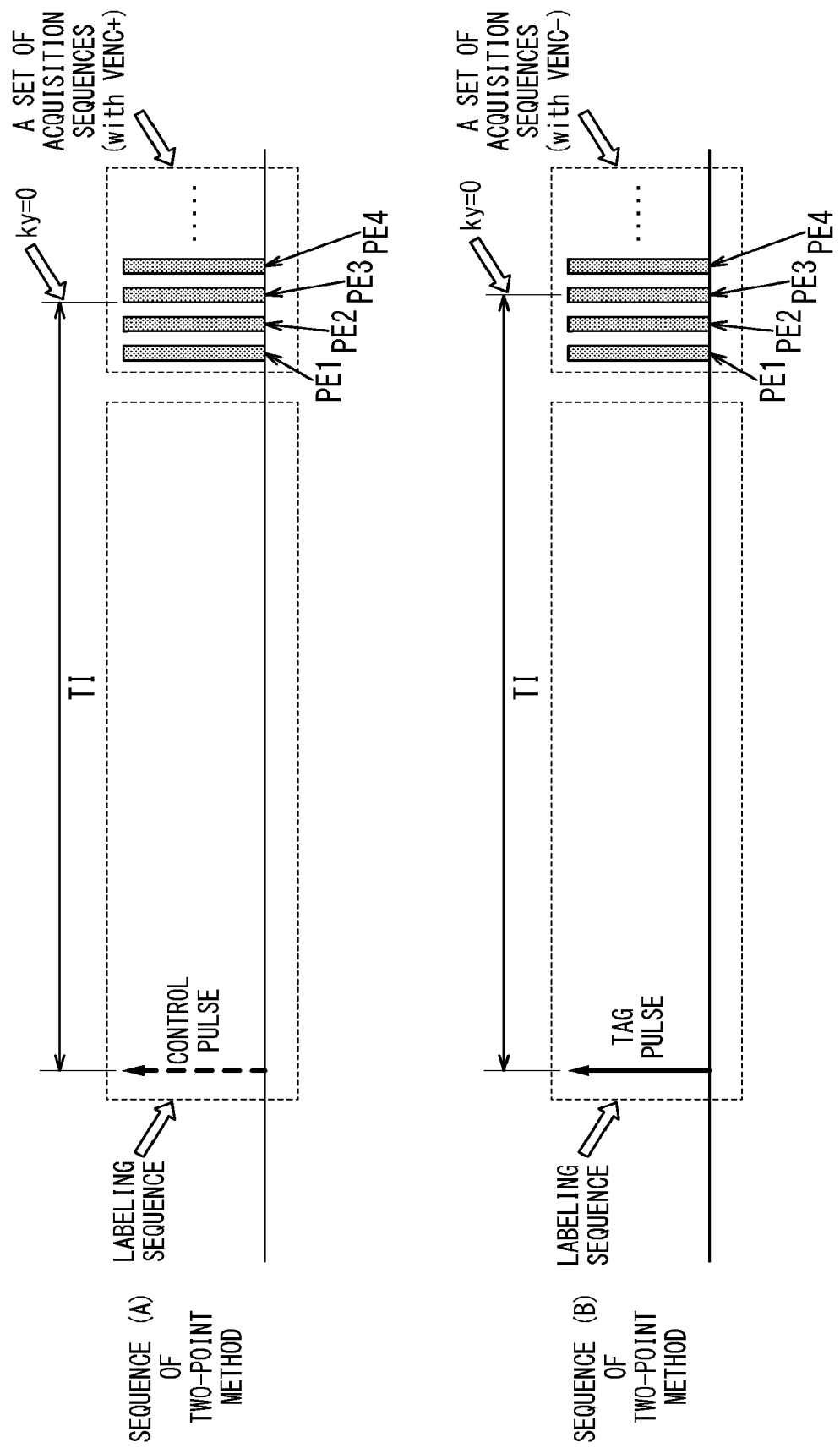
FIG. 5 is the second timing chart illustrating pulse sequences performed by the MRI apparatus of the first embodiment.
Figure 6:
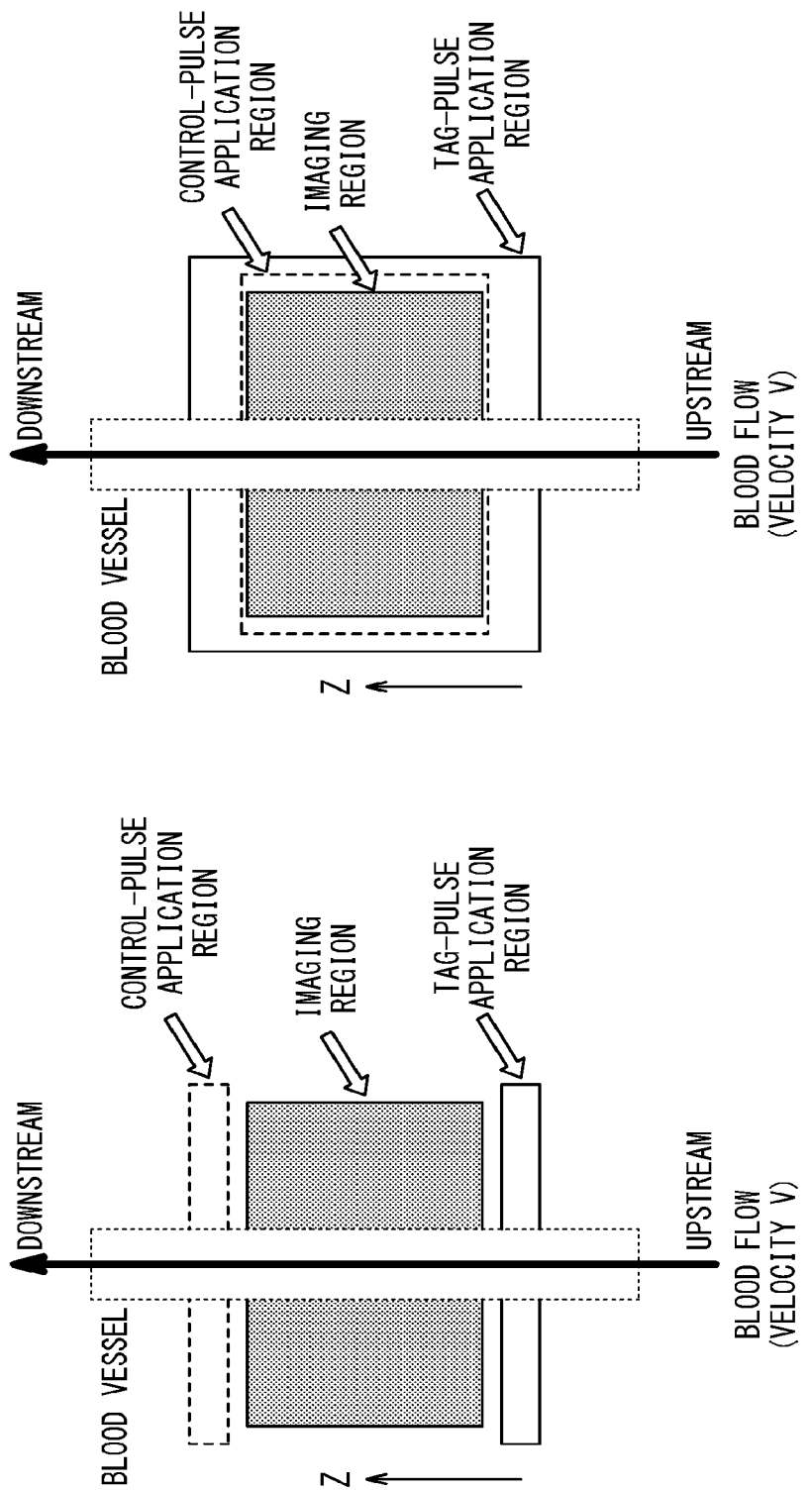
FIG. 6A is a schematic diagram illustrating relationship between an application region of each ASL pulse and an imaging region in a STAR type.
FIG. 6B is a schematic diagram illustrating relationship between an application region of each ASL pulse and an imaging region in a FAIR type.

FIG. 5 is a timing chart illustrating relationship between a labeling sequence and plural acquisition sequences (i.e., one set of acquisition sequences) which correspond to respective phase encodes (PE1, PE2, PE3, PE4, . . . ). Each hatching region in one set of the acquisition sequences corresponds to the acquisition sequence in FIG. 4.

When the number of phase encodes necessary for generating one image is, e.g., 128, one set of the acquisition sequences includes 128 acquisition sequences. In this case, a waiting time TI of each of the pulse sequences (A) and (B) is the time from application timing of its ASL pulse to start of the acquisition sequence which corresponds to the phase encode amount of zero (i.e., ky=0).

Alternatively, MR signals for generating one image may be acquired by repeating the pulse sequences (A) and (B) plural times. For instance, when 32 acquisition sequences are included in each of the pulse sequences (A) and (B), it is possible to acquire MR signals corresponding to phase encode amount of 128 necessary for generating one image by repeating each of the pulse sequences (A) and (B) four times.

FIG. 6A and FIG. 6B are schematic diagrams each illustrating relationship between an application region of a control pulse, an application region of a tag pulse, and an imaging region.

The application region of the control pulse, the application region of the tag pulse, and the imaging region in each of the pulse sequences (A) and (B) of the present embodiment are different between a flow-sensitive alternating inversion recovery (FAIR) type and a signal targeting with alternating radiofrequency (STAR) type, similarly to the conventional ASL method. The STAR type includes, e.g., an EPISTAR (Echo-Planar Imaging and Signal Targeting with Alternating Radiofrequency) and an ASTAR (Signal Targeting Alternating Radio frequency with Asymmetric inversion slabs).

In the STAR type, a tag pulse is applied to a region on the upstream side of the imaging region as shown in FIG. 6A. Magnitude of longitudinal magnetization of fluid such as blood flowing into the imaging region is changed by application of the tag pulse. In other words, fluid flowing into the imaging region is labeled. On the other hand, a control pulse is applied to a region on the downstream side of the imaging region. The control pulse is applied for the purpose of suppressing a magnetic transfer (MT) effect, and it is preferable that the control pulse is applied so as not to change longitudinal magnetization of inflow fluid.

In the FAIR type, the tag pulse is applied to the entire region, including the imaging region and its upstream side and downstream side as shown in FIG. 6B. Meanwhile, the control pulse is applied to almost the same region as the imaging region.

Note that the respective excitation pulses of the pulse sequences (A) and (B) are applied to the imaging region in both of the STAR type and the FAIR type.

Figure 7:
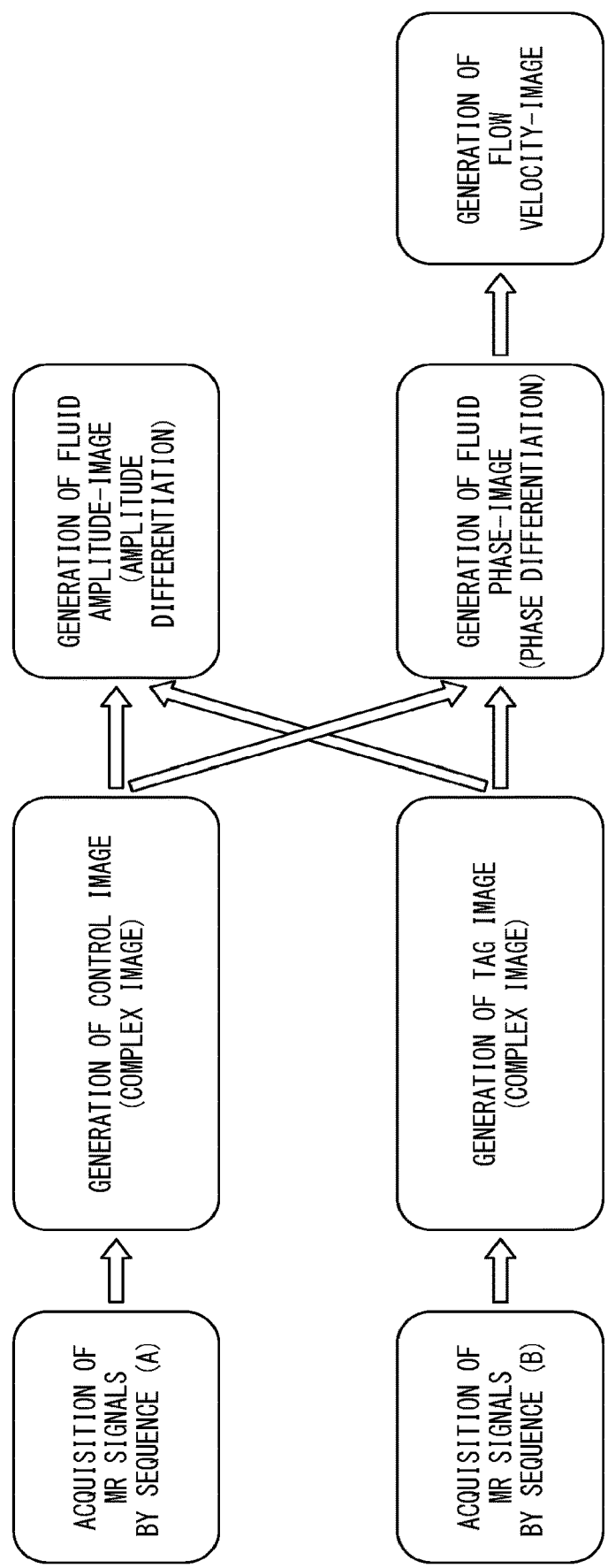
FIG. 7 is a conceptual diagram illustrating processing in which a fluid amplitude image and a flow velocity image are generated from acquired MR signals.

FIG. 7 is a conceptual diagram illustrating the processing from the steps ST101 to ST105 in the flowchart of FIG. 3.

The processing in the leftmost column of FIG. 7 corresponds to the step ST101 in FIG. 3. In the step ST101, the above-described two pulse sequences (A) and (B) are applied to an object and MR signals corresponding to the respective pulse sequences are acquired. The processing of the step ST101 is performed by the scanner 600 in FIG. 2.

The processing in the second column from the left in FIG. 7 corresponds to the step ST102 in FIG. 3. In the step ST102, MR signals acquired in each of the pulse sequences (A) and (B) are reconstructed by processing such as inverse Fourier transform and then used for generating complex images. The processing of the step ST102 is performed by the complex-image generation function 421 in FIG. 2.

Since the pulse sequence (A) includes a control pulse in the labeling sequence, a complex image corresponding to the pulse sequence (A) is hereinafter referred to as a control image. On the other hand, since the pulse sequence (B) includes a tag pulse in the labeling sequence, a complex image corresponding to the pulse sequence (B) is hereinafter referred to as a tag image.

When amplitude of each pixel value of the control image is defined as $A_{cont}$, and the phase of the control image is defined as $\Phi_{cont}$, each pixel value (complex number) $S_{cont}$ is indicated by the following equation (1).

$$S_{cont} = A_{cont} \exp[j\Phi_{cont}] \quad \text{Equation (1)}$$

Similarly, when amplitude of each pixel value of the tag image is defined as $A_{tag}$, and the phase of the tag image is defined as $\Phi_{tag}$, each pixel value (complex number) $S_{tag}$ is indicated by the following equation (2).

$$S_{tag} = A_{tag} \exp[j\Phi_{tag}] \quad \text{Equation (2)}$$

The processing the third column from the left in the upper part of FIG. 7 corresponds to the step ST103 in FIG. 3. In the step ST103, difference in amplitude between the control image and the tag image is calculated to generate a fluid amplitude image. The processing of the step ST103 is performed by the fluid-amplitude-image generation function 422 in FIG. 2. Specifically, each pixel value $A_{flow}$ of the fluid amplitude image is calculated by taking the difference (in amplitude at the same position) between amplitude Acont of each pixel in the control image and the amplitude Atag of the corresponding pixel in the tag image, as indicated by the following equation (3). A fluid amplitude image is generated by performing the difference processing of the equation (3) for all the pixels.

$$A_{flow} = |S_{cont}| - |S_{tag}| = A_{cont} - A_{tag} \quad \text{Equation (3)}$$

Figure 8C:
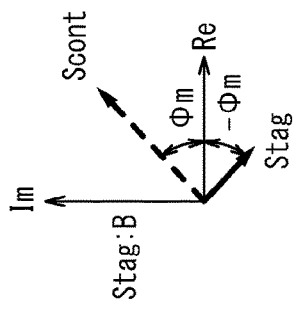
FIG. 8A to FIG. 8C are conceptual diagrams illustrating processing of generating a fluid amplitude image and a fluid phase image.
Figure 8A:
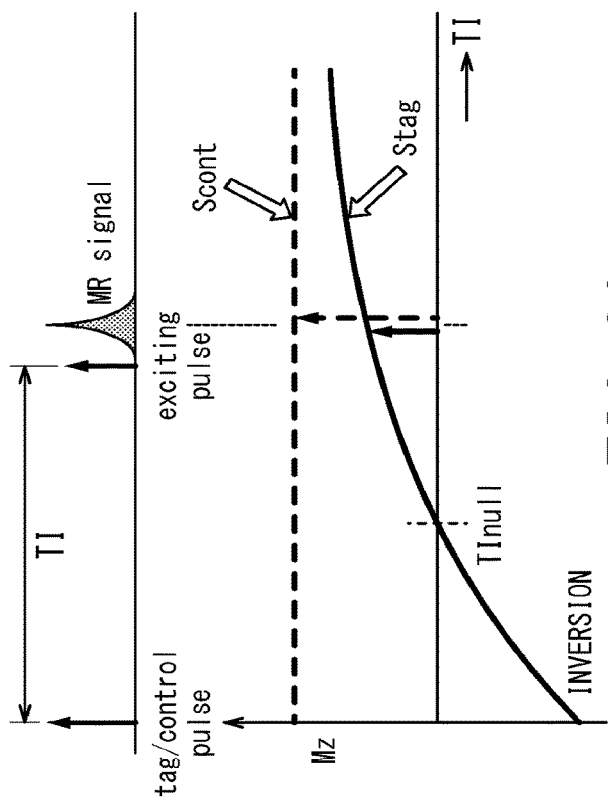
Figure 8B:
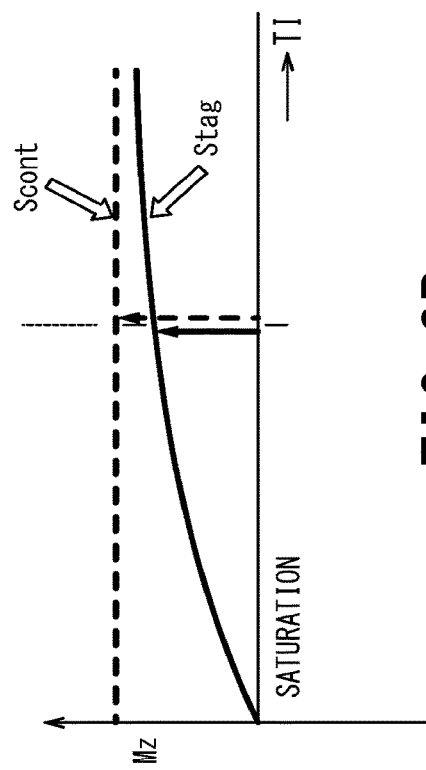

The equation (3) holds under the condition in which the acquisition sequence is applied to a region where longitudinal magnetization, which has been flipped down or inverted by the tag pulse, recovers to positive, as shown in FIG. 8A and FIG. 8B. When the acquisition sequence is applied to the region where longitudinal magnetization is negative, the equation (3) needs to be slightly modified and its details will be described below with reference to FIG. 13A to FIG. 13C.

The concept of generating a fluid amplitude image will be further described with reference to FIG. 8A to FIG. 8C, and FIG. 9A. Although fluid targeted by the present embodiment includes at least blood and CSF, it is assumed that fluid is blood in the following description.

The upper part of FIG. 8A shows the application timing of the ASL pulse (tag pulse or control pulse), the application timing of the excitation pulse, and the acquisition timing of each MR signal. Although a VENC (−) pulse or a VENC (+) pulse is applied posterior to application of the excitation pulse, the VENC pulse is omitted in FIG. 8A.

The lower part of FIG. 8A shows change in longitudinal magnetization by a solid line, when the flip angle of the tag pulse is larger than 90°. When the flip angle of the tag pulse is larger than 90° (e.g., when the flip angle is set to 180° for inverting longitudinal magnetization), longitudinal magnetization of blood in the application region of the tag pulse becomes negative immediately after application of the tag pulse and then recovers to a positive value as longitudinal magnetization recovers.

In any of the STAR type and the FAIR type, the tag pulse is applied to the region on the upstream side of the imaging region as shown in FIG. 6A and FIG. 6B. Blood subjected to application of the tag pulse (i.e., blood labeled by the tag pulse) flows into the imaging region from the region on the upstream side of the imaging region. The longitudinal magnetization of the inflow blood component in a recovery process is flipped by the excitation pulse, causing transverse magnetization component to generate an MR signal. Thus, magnitude of the MR signal of inflow blood labeled by the tag pulse is proportional to the magnitude of longitudinal magnetization shown by the solid line, and shows a value which varies depending on the waiting time TI from the application timing of the tag pulse to the application timing of the excitation pulse.

In the STAR type, any tag pulse is not applied to the imaging region. Thus, application of a tag pulse does not have influence on blood existing in the imaging region and the substantial part other than blood in the imaging region (hereinafter, referred to as a background) at the time of application of the tag pulse. Hence, in the case of the tag image generated from the MR signals acquired by the pulse sequence (B) which includes the tag pulse, only the blood flowing into the imaging region after elapse of the waiting time TI from application of the tag pulse is subjected to change in longitudinal magnetization due to the tag pulse as shown by the solid line $S_{tag}$, in FIG. 8A.

The control pulse included in the pulse sequence (A) is applied to the region on the downstream side of the imaging region. Thus, neither the blood existing in the imaging region at the time of application of the control pulse nor the blood flowing into the imaging region after application of the control pulse is subjected to change in longitudinal magnetization by the control pulse, and takes a constant value as indicated by the broken line $S_{cont}$ in FIG. 8B. Additionally, the background within the imaging region is not influenced by the control pulse. Thus, amplitude of MR signals of the background in the imaging region is basically the same between the control image and the tag image, and amplitude of MR signals of the blood existing in the imaging region at the time of application of the control pulse is basically the same between the control image and the tag image.

As the result, the image, which is obtained by performing difference processing between amplitude of each pixel value of the control image and amplitude of each pixel value of the tag image, becomes a fluid amplitude image in which only the blood flowing into the imaging region after elapse of the waiting time TI from application of the tag pulse is enhanced. In other words, when moving velocity of blood is defined as V, bolus of labeled (i.e., tagged) inflow blood is depicted in the fluid amplitude image at the position separated from the original position by the traveling distance (Z=V*TI) by which the labeled inflow blood has traveled during the waiting time TI, as shown in FIG. 9A.

FIG. 8B shows change in longitudinal magnetization when the flip angle of the tag pulse is 90°. When the flip angle of the tag pulse is 90°, longitudinal magnetization of the blood in the application region of the tag pulse becomes zero and thereafter recovers to a positive value as longitudinal magnetization recovers. Even in this case, it is possible to generate a gap between the longitudinal magnetization $S_{tag}$ of the inflow blood of the tag image indicated by the solid line and the longitudinal magnetization $S_{cont}$ of the blood or the background of the control image indicated by the broken line. Thus, as shown in FIG. 9A, it is possible to generate a fluid amplitude image in which bolus of labeled (tagged) inflow blood is depicted.

Additionally, the flip angle of the tag pulse (or the control pulse) is not necessarily required to be a 180° pulse or a 90° pulse, and it suffices as long as the magnitude of the longitudinal magnetization can be changed. In this respect, the flip angle of each of the tag pulse and the control pulse can be set to an arbitrary angle.

Returning to FIG. 7 and FIG. 3, the processing of the third column from the left in the lower part of FIG. 7 corresponds to the step ST104 in FIG. 3. In the step ST104, difference in phase between the control image and the tag image is calculated to generate a fluid phase image. The processing of the step ST104 is performed by the fluid-phase-image generation function 423 in FIG. 2.

As shown in FIG. 4, each pulse sequence applied in the first embodiment (as well as the other embodiments) includes a VENC pulse after application of an excitation pulse in each acquisition sequence. Due to this VENC pulse (VENC (+) pulse or VENC (−) pulse), a phase of transverse magnetization caused by an excitation pulse changes, depending on velocity of blood flow.

Here, a gradient magnetic field of a VENC pulse is defined as G(t), blood flow velocity in the application direction (i.e., positive direction) of a VENC pulse is defined as V(t), and a time from an application timing of an excitation pulse to the peak of an MR signal (i.e., echo time) is defined as TE. When the VENC (−) pulse is used as a VENC pulse, the phase change amount of transverse magnetization is negative (clockwise, mathematically negative) and is expressed by the following equation (4).

$$\Phi_m(TE) = -\gamma \cdot \int_0^{TE} V(t) \cdot G(t) dt \quad \text{Equation (4)}$$

In the equation (4), γ is the gyromagnetic ratio.

Normally, since an echo time TE is sufficiently short for velocity change such as blood flow in a living body, it can be assumed that velocity at the time of measurement at t=TI(n) is kept constant during the echo time TE. Thus, when it is defined as V(t)=V[TI(n)] wherein "n" is a positive integer, the equation (4) becomes the following equation (5).

$$\Phi_m(n, TE) = V[TI(n)] \{\gamma \int_0^{TE} \cdot G(t) dt\} \quad \text{Equation (5)}$$

Here, M is defined by the following equation.

$$M = \gamma \int_0^{TE} G(t) dt$$

By using M as defined above, the equation (5) becomes the following equation (6).

$$\Phi_m(n) = -V[TI(n)] \cdot M \quad \text{Equation (6)}$$

The equation (6) is applied to the case when plural waiting times TI(s) are used. As shown in FIG. 4, for the case when only one waiting time TI is used, the equation (6) becomes the following equation (7).

$$\Phi_m = -V[TI] \cdot M \quad \text{Equation (7)}$$

When the VENC (+) pulse is used as a VENC pulse, the phase rotation is in the inverse direction (i.e., in the positive direction) and the phase change amount in this case is expressed by the following equation (8).

$$\Phi_m = V[TI] \cdot m \quad \text{Equation (8)}$$

FIG. 8C illustrates phase relationship between a pixel value (complex number) $S_{cont}$ of the control image (complex image) generated from MR signals acquired by the pulse sequence (A) corresponding to the VENC (+) pulse and a pixel value (complex number) $S_{tag}$ of the tag image (complex image) generated from MR signals acquired by the pulse sequence (B) corresponding to the VENC (−) pulse.

In the step ST104, difference processing between the phase of each pixel value of the control image and the phase of each pixel value of the tag image is performed to generate a fluid phase image. When the phase of each pixel value of the control image is defined as Φcont and the phase of each pixel value of the tag image is defined as Φtag, the phase Φflow of the fluid phase image is expressed by the following equation (9).

$$\Phi\text{flow} = \Phi\text{cont} - \Phi\text{tag} = \Phi m - (-\Phi m) = 2\Phi m \quad \text{Equation (9)}$$

The equation (9) holds under the condition in which the acquisition sequence is applied to a region where longitudinal magnetization is caused (or inverted) to become positive by the tag pulse as shown in FIG. 8A and FIG. 8B. When the acquisition sequence is applied to the region where longitudinal magnetization is negative, the equation (9) needs to be slightly modified and its details will be described below with reference to FIG. 13A to FIG. 13C.

Returning to FIG. 7 and FIG. 3 again, the processing in rightmost column of FIG. 7 corresponds to the step ST105 of FIG. 3. In the step ST105, a flow velocity image is generated from the fluid phase image generated in the above-described manner. Specifically, flow velocity V[TI] is calculated for each pixel on the basis of the equations (7) to (9) by using the following equations (10) and (10-1).

$$2V[TI] = 2\Phi m/M = \Phi\text{flow}/M \quad \text{Equation (10)}$$

$$V[TI] = \Phi m/M = (\Phi\text{flow}/M)/2 \quad \text{Equation (10-1)}$$

Figure 9B:
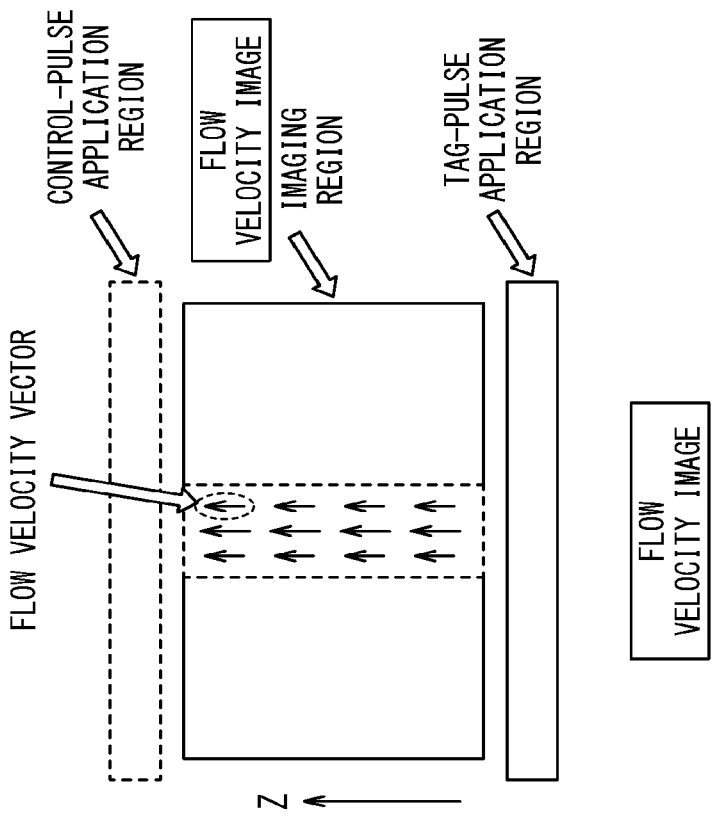
FIG. 9B is a conceptual diagram illustrating a flow velocity image.
Figure 9A:
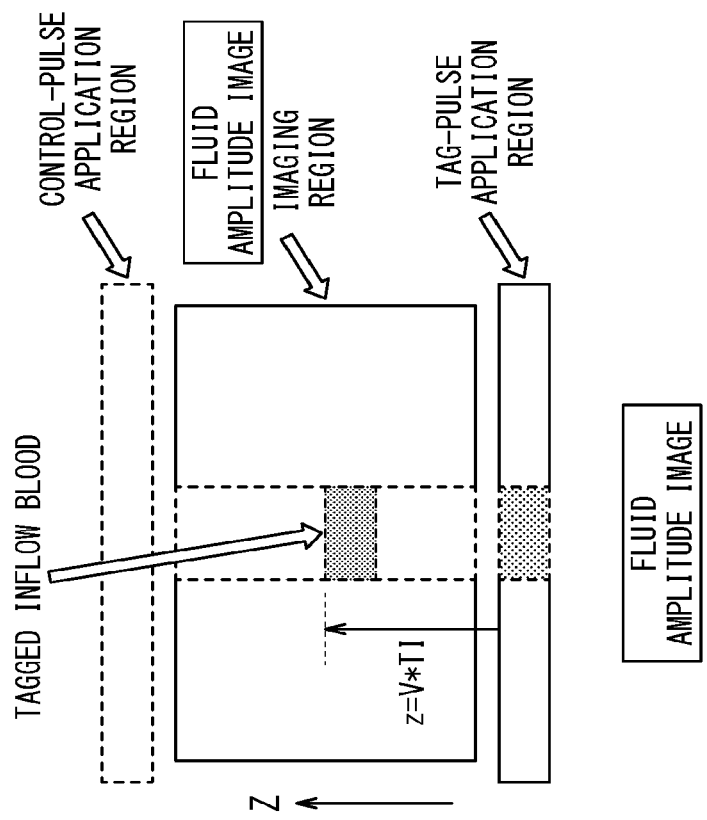
FIG. 9A is a conceptual diagram illustrating a fluid amplitude image.

FIG. 9B is a schematic diagram illustrating a flow velocity image. For instance, velocity of each pixel calculated by the equation (10) is made to correspond to length of each vector, and the flow velocity image is generated by arranging vectors for respective pixels. Additionally or alternatively, pixels in a predetermined range may be grouped, and a vector corresponding to the average velocity of all the pixels in the group may be arranged for each group.

When respective complex images corresponding to plural waiting times TI are generated, as will be described below, the equation (10) becomes the following equation (11) by defining number of waiting times TI as "n".

$$V[TI(n)] = 2\Phi m(n)/M = \Phi\text{flow}(n)/M \quad \text{Equation (11)}$$

In the pulse sequences of the independent two-point method shown in FIG. 4, the VENC (−) pulse and the VENC (+) pulse are applied only in the Z-axis direction. Thus, velocity of blood flow obtained by the equations (10) and (11) includes only the Z-axis direction component.

In order to obtain velocity information as a vector in the three axial directions, it is necessary to apply the VENC (−) pulse and the VENC (+) pulse in each of the X-axis, Y-axis, and Z-axis directions. Such an imaging method will be described below as the independent six-point method or the Hadamard four-point method.

The above-described independent two-point method has an advantage that an imaging time is shorter than the independent six-point method or the Hadamard four-point method. Further, since a traveling direction in main blood vessels in a human body is basically a head-to-foot direction (i.e., the Z-axis direction), the above-described independent two-point method is useful in many cases.

Second Embodiment

Figure 10:
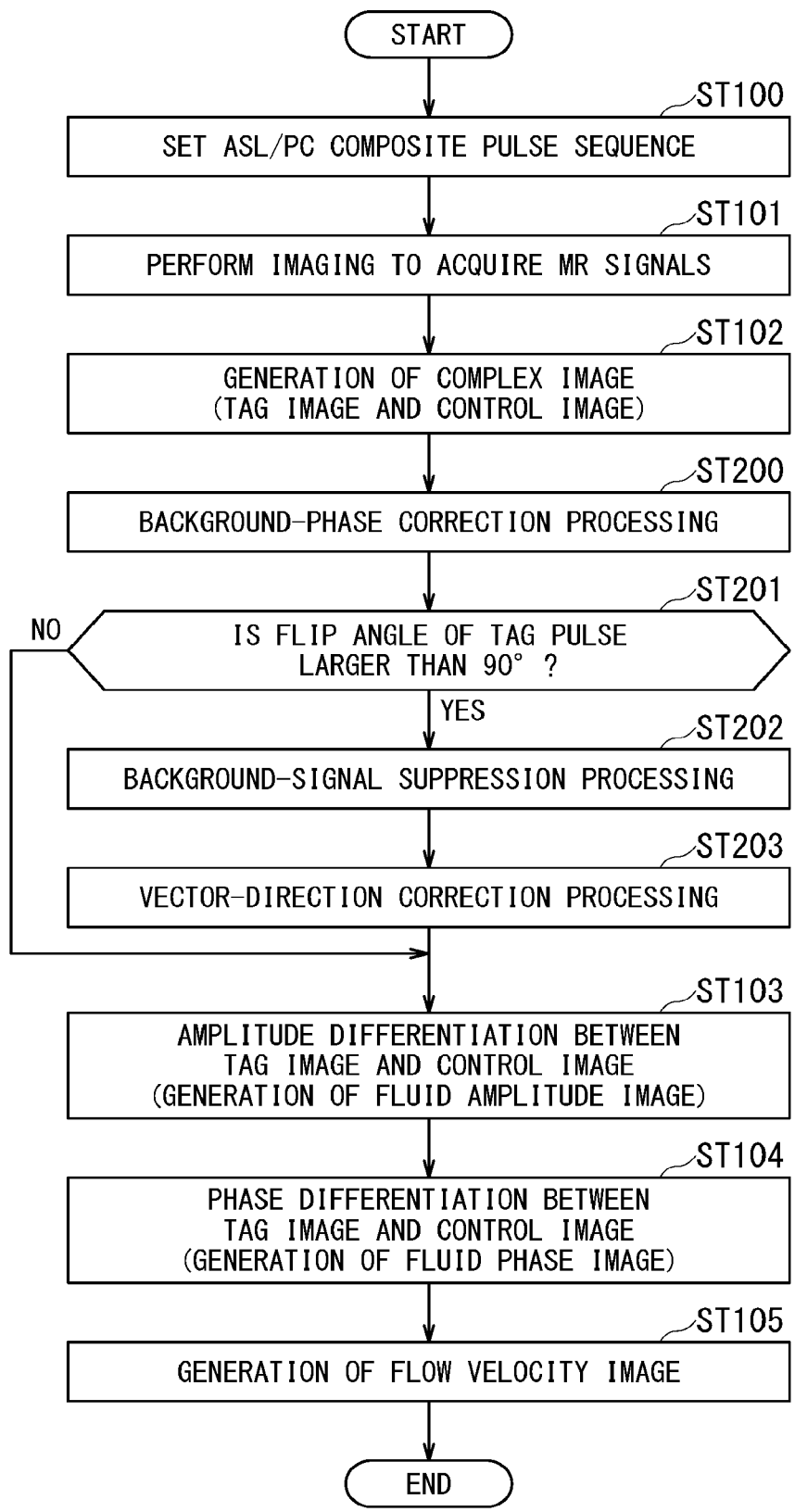
FIG. 10 is a flowchart illustrating an operation performed by the MRI apparatus of the second embodiment.

FIG. 10 is a flowchart illustrating an operation performed by the MRI apparatus 1 of the second embodiment. In the second embodiment, background-phase correction processing (step ST200), background-signal suppression processing (step ST202), and vector-direction correction processing (step ST203) are added to the processing in the first embodiment (FIG. 3), and are performed by the correction function 425 in FIG. 2. In terms of hardware, configuration of the MRI apparatus 1 of the second embodiment is the same as that of the first embodiment (FIG. 1 and FIG. 2).

Figure 11:
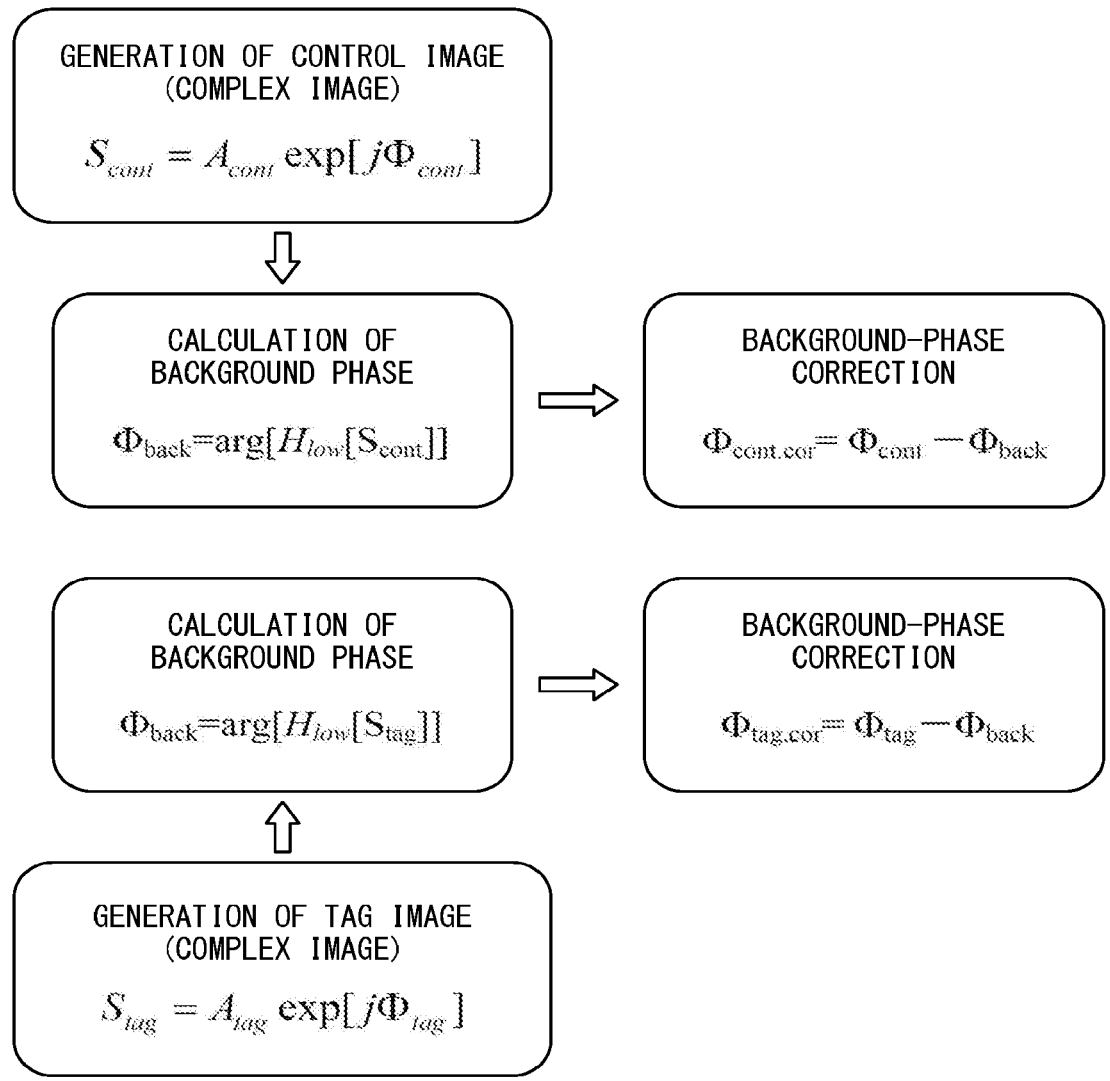
FIG. 11 is a conceptual diagram illustrating background-phase correction processing.

FIG. 11 is a conceptual diagram illustrating the background-phase correction processing in the step ST200. The background-phase correction processing is processing in which a background phase caused by non-uniformity of a static magnetic field and/or Maxwell term is determined, and then the determined background phase is eliminated from respective phases of a control image and a tag image. Specifically, the background phase Φback of the control image is calculated by the following equation (12), and the background phase Φback of the tag image is calculated by the following equation (13).

$$\Phi back = \arg[H_{low}[Scont]] \qquad \text{Equation (12)}$$

$$\Phi back = \arg[H_{low}[Stag]] \qquad \text{Equation (13)}$$

In the equations (12) and (13), $H_{low}[\bullet]$ indicates calculation such as a homodyne filter method which removes a low frequency component of complex number in [•] by a low pass filter, and arg[•] indicates calculation of determining a phase of a complex number in [•].

In the case of the independent six-point method and the four-point method described below, a "base image" can be obtained by calculation. In this case, the background phase Φback may be calculated by using each pixel value (i.e., complex pixel signal) Sbase of the calculated base image under the following equation (14).

$$\Phi back = \arg[H_{low}[Sbase]] \qquad \text{Equation (14)}$$

By using the calculated background phase Φback, the phase Φcont,cor of the control image after correction is calculated on the basis of the following equation (15) and the phase Φtag, cor of the tag image after correction is calculated on the basis of the following equation (16).

$$\Phi cont,cor = \Phi cont - \Phi back \qquad \text{Equation (15)}$$

$$\Phi tag,cor = \Phi tag - \Phi back \qquad \text{Equation (16)}$$

Next, a description will be given of the background-signal suppression processing (in the step ST202), and the vector-direction correction processing (in the step ST203).

As shown in FIGS. 8A to 8C, when the flip angle of the tag pulse is larger than 90°, longitudinal magnetization of spin of labeled blood returns from a negative value to a positive value. Thus, longitudinal magnetization of blood changes from negative to positive, at a waiting time when the longitudinal magnetization becomes zero (hereinafter, this waiting time is referred to as TInull). The background-signal suppression processing (in the step ST202) and the vector-direction correction processing (in the step ST203) are processing to be performed when the flip angle of the tag pulse is larger than 90°. Thus, when the flip angle of the tag pulse is 90° or smaller, the background-signal suppression processing and the vector-direction correction processing are unnecessary.

The background-signal suppression processing is processing for suppressing signal amplitude of a stationary tissue portion close to zero without changing signal amplitude of a blood flow portion so much.

Figure 12:
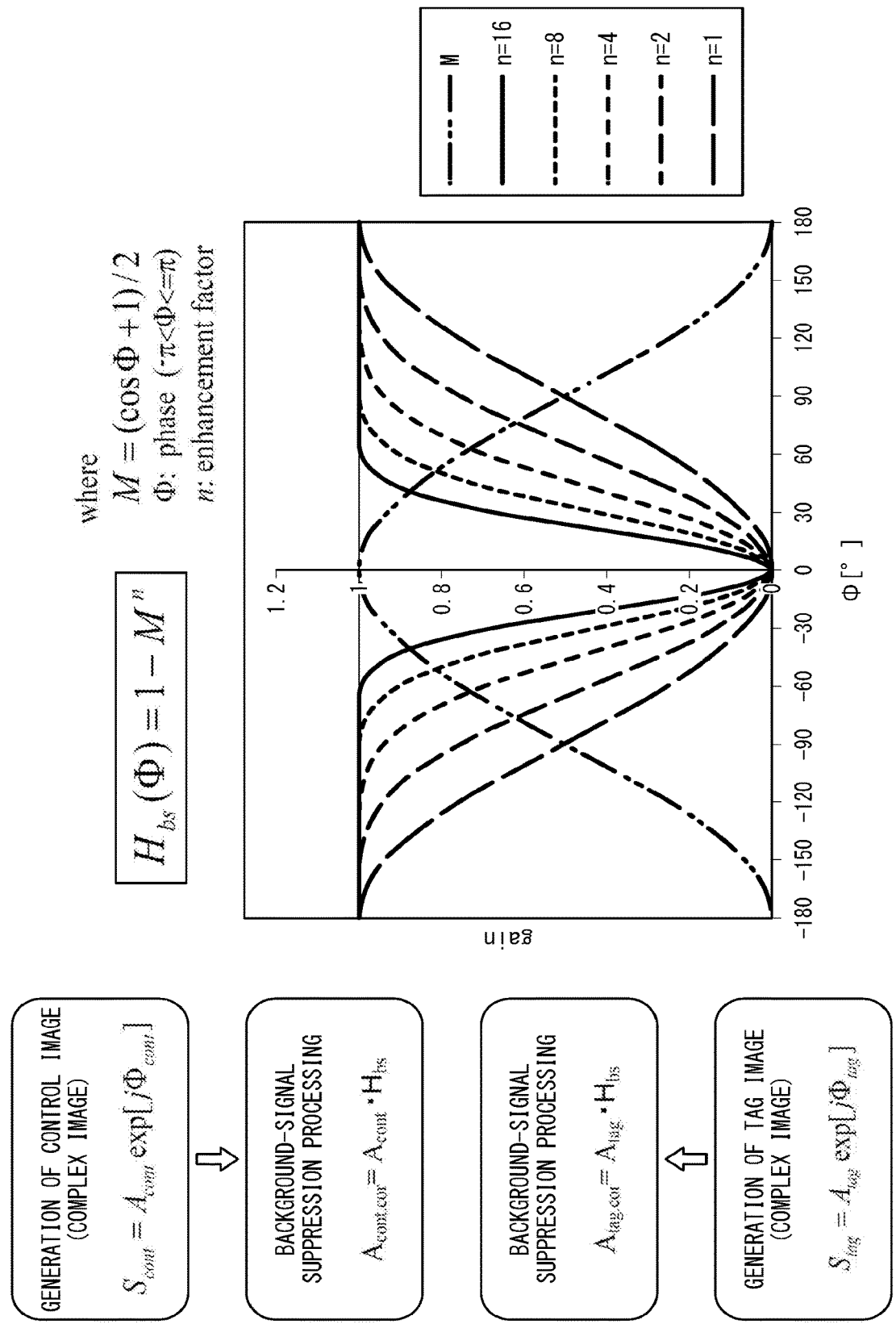
FIG. 12 is a conceptual diagram illustrating background-signal suppression processing.

FIG. 12 is a conceptual diagram illustrating the background-signal suppression processing. When respective complex signals of the control image and the tag image are expressed by the equations (1) and (2), calculations expressed by the respective equations (17) and (18) are performed on the control image and the tag image in the background-signal suppression processing.

$$A cont,cor = A cont \cdot Hbs(\Phi) \qquad \text{Equation (17)}$$

$$A tag,cor = A tag \cdot Hbs(\Phi) \qquad \text{Equation (18)}$$

In the equations (17) and (18), Notation of "Acont, cor" indicates an amplitude of the control image after the background-signal suppression processing, while notation of "Atag, cor" indicates an amplitude of the tag image after the background-signal suppression processing. In addition, notation of "Hbs(Φ)" indicates a filter function which brings the gain closer to 1 as the phase is separated away from zero and brings the gain closer to zero as the phase approaches zero. The filter function Hbs(Φ) is a function expressed by, e.g., the following equation (19).

$$Hbs(\Phi) = 1 - M^n$$

$$M = (\cos \Phi + 1)/2$$

$$-\pi < \Phi \le +\pi \qquad \text{Equation (19)}$$

n: enhancement factor

FIG. 12 shows a graph of the filter function Hbs(Φ). As is clear from this graph, the filter function Hbs(Φ) exhibits characteristics of steeply attenuating in the vicinity of Φ=0 as n (i.e., enhancement factor) increases.

Since the sign of the difference processing of signal amplitude is reversed near the waiting time TInull at which longitudinal magnetization becomes zero, MR signals from each stationary structure remain strong after the difference processing, if the background-signal such as stationary tissue signal is remained high. The above background-signal suppression processing is processing for suppressing this phenomenon.

The vector-direction correction processing in the step ST203 is processing of changing the sign of the difference processing of amplitude and the sign of phase difference processing before and after the waiting time TInull.

Figure 13A:
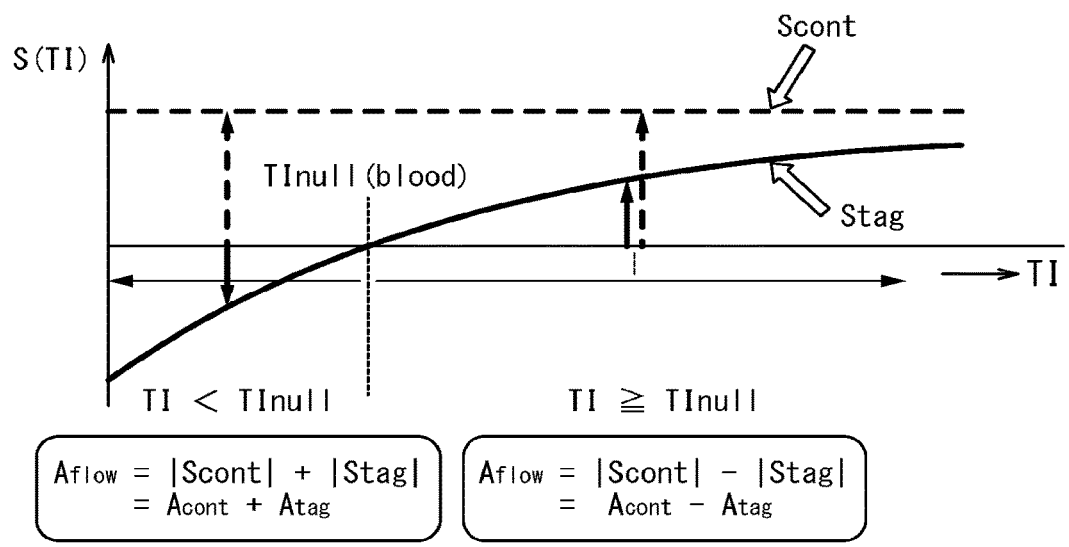
FIG. 13A to FIG. 13C are conceptual diagrams illustrating vector-direction correction processing.
Figures 13B, 13C:
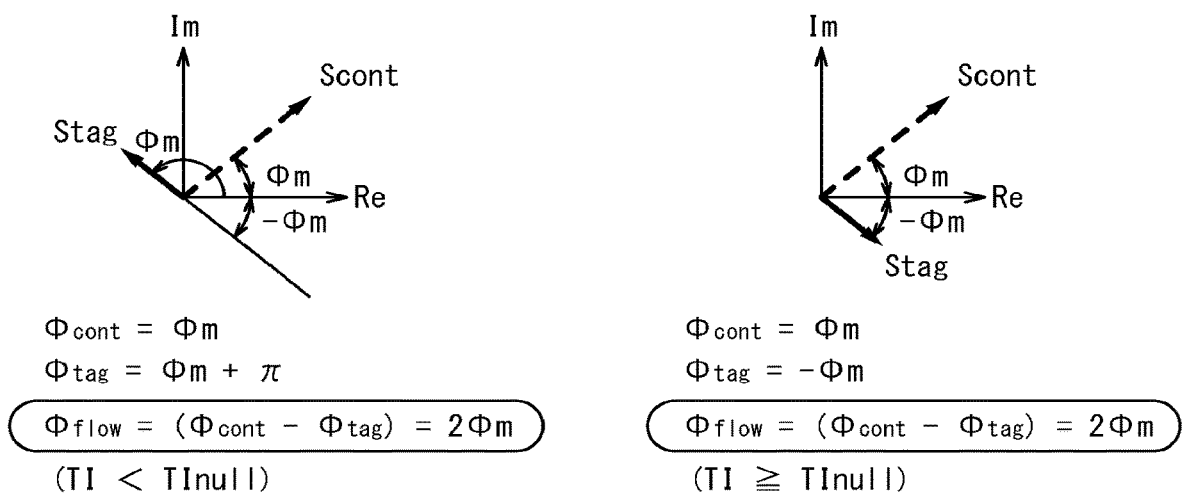

FIG. 13A to FIG. 13C are conceptual diagrams illustrating the vector-direction correction processing. When a waiting time TI is shorter than TInull as to amplitude difference processing as shown in FIG. 13A, amplitude Aflow of a fluid amplitude image is calculated by adding amplitude |Scont| of the control image to amplitude |Stag| of the tag image. Conversely, when the waiting time TI is equal to or longer than TInull, amplitude Aflow of the fluid amplitude image is calculated by subtracting amplitude |Stag| of the tag image from amplitude |Scont| of the control image. In other words, calculation expressed by the following equations (20) and (21) is performed.

$$A flow = |Scont| + |Stag| = A cont + A tag \quad (TI < TInull) \qquad \text{Equation (20)}$$

$$A flow = |Scont| - |Stag| = A cont - A tag \quad (TI \ge TInull) \qquad \text{Equation (21)}$$

With respect the phase difference processing, when awaiting time TI is shorter than TInull as shown in FIG. 13B, the phase Φflow of the fluid phase image is calculated by taking the difference between the phase of the control image and the phase of the tag image after correcting the phase Φ of the tag image by adding 180° to the phase Φ of the tag image.

On the other hand, when a waiting time is equal to or longer than TInull as shown in FIG. 13C, the phase Φflow of the fluid phase image is calculated by taking the difference between the phase of the control image and the phase of the tag image without correcting the phase Φ of the tag image. In other words, Φtag after correction is calculated by performing the calculation of the following equations (22) and (23) on the phase Φ of the tag image, and then the phase Φflow of the fluid phase image is calculated by the following equation (24).

$$\Phi tag = -\Phi m + \pi (TI < TInull) \qquad \text{Equation (22)}$$

$$\Phi tag = -\Phi m (TI \geq TInull) \qquad \text{Equation (23)}$$

$$\Phi flow = (\Phi cont - \Phi tag) = 2\Phi m \qquad \text{Equation (24)}$$

Even when the sign of longitudinal magnetization of blood changes across the point of TInull, the phase Φflow of the fluid image can be quantitatively correctly determined by the equations (22) to (24).

The amplitude correction of the equations (20) and (21) is not for the purpose of correct quantification but for the purpose of enhancing a contrast to noise ratio (CNR) of blood flow and a background. Thus, when a CNR is sufficiently high, it is also possible to omit the amplitude correction of the equations (20) and (21). In this case, since inversion of the sign of the amplitude difference processing (sign inversion attributable to whether this processing is addition or subtraction) does not occur near the waiting time TInull, it is also possible to omit the above-described background-signal suppression processing.

Third Embodiment

The third embodiment is a modification of the first embodiment such that a part of the acquisition sequence of the entire pulse sequence of the first embodiment is modified.

Figure 14:
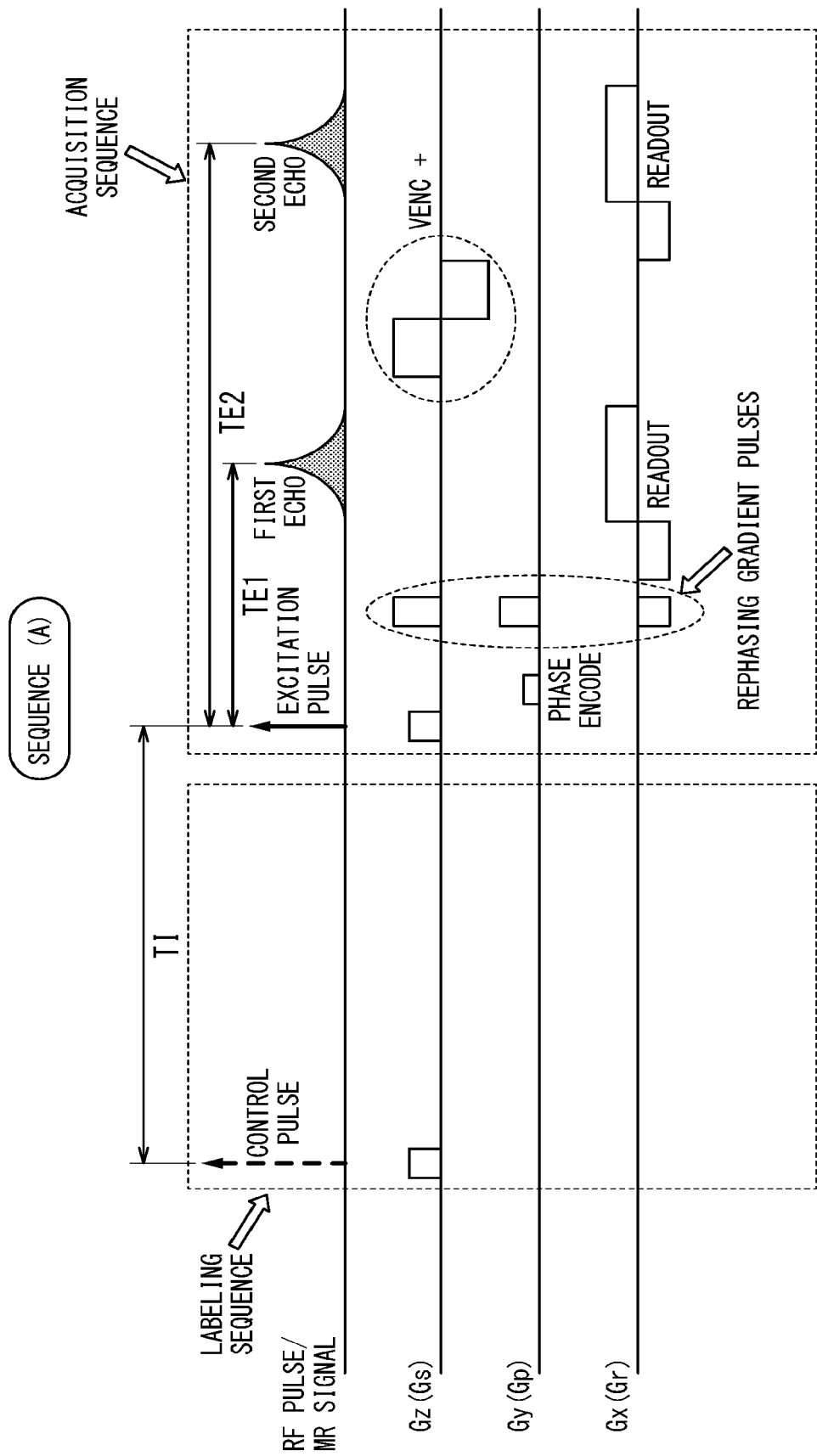
FIG. 14 is a timing chart illustrating pulse sequences of the third embodiment.

FIG. 14 is a timing chart illustrating one of the pulse sequences of the third embodiment. The MRI apparatus 1 of the third embodiment also applies the pulse sequence (A) which includes a VENC (+) pulse in its acquisition sequence and the pulse sequence (B) which includes VENC (−) pulse in its acquisition sequence. Out of these pulse sequences (A) and (B), only the pulse sequence (A) is shown in FIG. 14.

The third embodiment differs from the first embodiment in that two MR signals including the first echo and the second echo are acquired in the acquisition sequence of each pulse sequence of the third embodiment. In the first embodiment, both of a fluid amplitude image and a fluid phase image are generated from one echo (i.e., one MR signal) acquired in each acquisition sequence. In the third embodiment, a fluid amplitude image is generated from the first echo, whereas a fluid phase image is generated from the second echo.

As shown in FIG. 14, the first echo is acquired by applying rephasing gradient pulses after application of the excitation pulse and then applying a readout gradient pulse, without applying VENC (+) pulse or a VENC (−) pulse. Additionally or alternatively, the first echo may be acquired after application of the excitation pulse by omitting application of the rephasing gradient pulses.

In both of the above-described cases, the first echo is acquired without applying a VENC (+) pulse or a VENC (−) pulse and thus amplitude of fluid is not subjected to attenuation which is caused by a VENC (+) pulse or a VENC (−) pulse. Hence, it is possible to enhance a signal to noise ratio (SNR) of the fluid amplitude image generated from the first echo. Additionally, by applying the rephasing gradient pulses, it is possible to make phases of respective fluid portions coincident with each other and to further enhance its SNR.

The second echo is acquired posterior to acquisition of the first echo by applying a VENC (+) pulse (or a VENC (−) pulse) and then applying a readout gradient pulse. The second echo is subjected to phase change depending on flow velocity due to the VENC (+) pulse (or the VENC (−) pulse), and the flow velocity image is generated from each second echo.

Figures 15A, 15B:
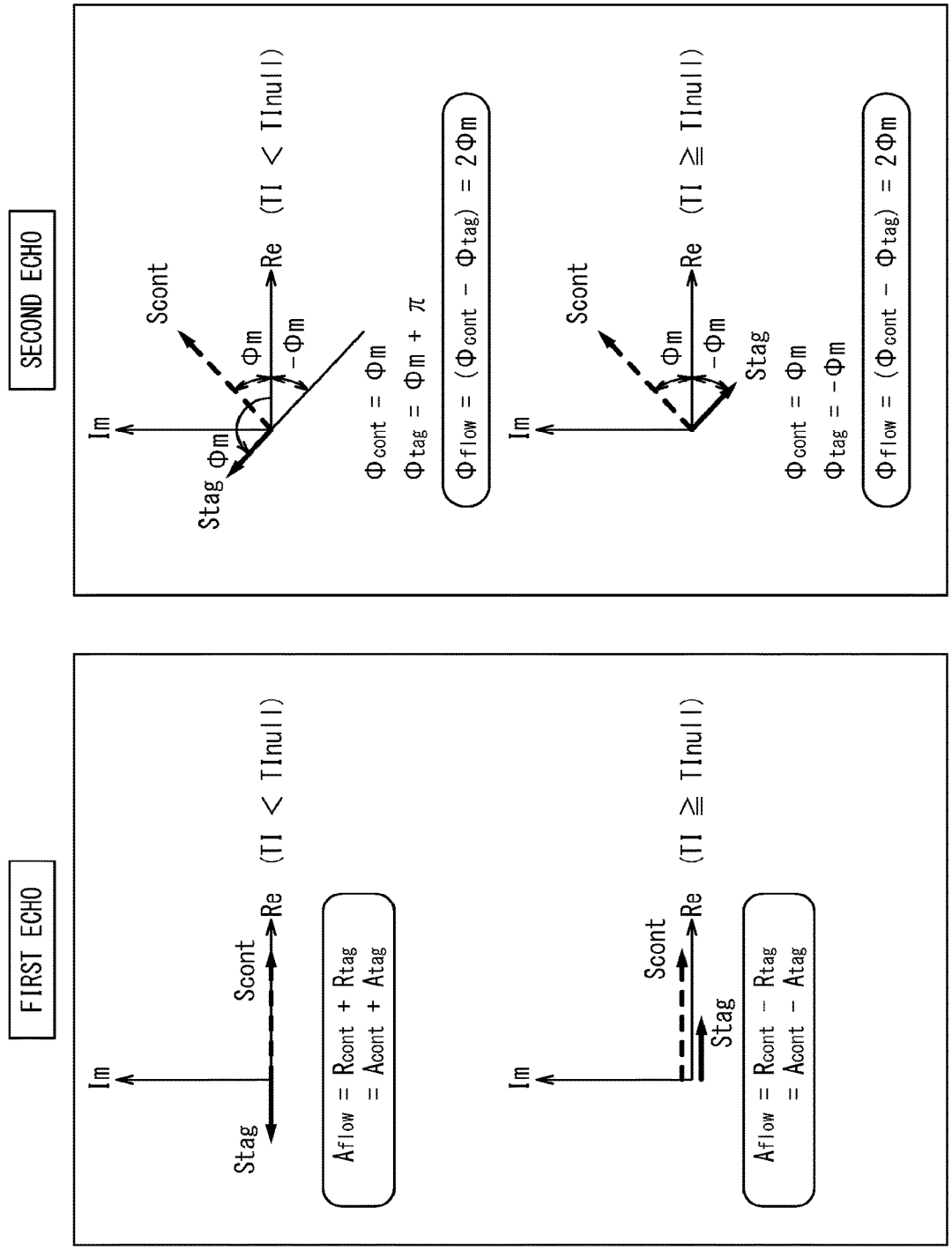
FIG. 15A and FIG. 15B are schematic diagrams illustrating an operational concept of the third embodiment.

FIG. 15A and FIG. 15B are schematic diagrams illustrating an operational concept of the third embodiment. As shown in FIG. 15A, by adding a rephasing gradient pulse in accordance with flow velocity, it is possible to set respective phases of the control image and the tag image, both of which are generated from each first echo, to 0° or 180°. As the result, the complex signal of the control image includes only the real part component represented by Rcont and the complex signal of the tag image includes only the real part component represented by Rtag. Thus, the process of obtaining fluid amplitude is simplified by the following equations (25) and (26).

$$A flow = Re(Scont) + Re(Stag) = Rcont + Rtag (TI < TInull) \qquad \text{Equation (25)}$$

$$A flow = Re(Scont) - Re(Stag) = Rcont - Rtag (TI \geq TInull) \qquad \text{Equation (26)}$$

The control image generated from the second echo is the same as the control image in the first embodiment, and the tag image generated from the second echo is the same as the tag image in the first embodiment. As shown in FIG. 15B, the processing of calculating a phase of a flow velocity image from respective phases of the control image and the tag image is the same as the first embodiment.

Fourth Embodiment

In the first embodiment, since two pulse sequence (A) and (B) are applied, the method of the first embodiment is referred to as the independent two-point method. By contrast, the fourth embodiment uses six pulse sequences (A) to (F) and thus is hereinafter referred to as the independent six-point method.

Since the number of types of pulse sequences used in the fourth embodiment (or other subsequent embodiments) increases, notation and calculation of pulse sequences become complicated. Thus, notation and calculation of pulse sequences will be simplified in the following description. FIG. 16 is a schematic diagram illustrating these abbreviated methods for the case of the above-described independent two-point method.

The pulse sequence (A) of the independent two-point method includes a control pulse as a type of an ASL pulse in the labeling sequence, and further includes a VENC (+) pulse to be applied only in the Z-axis direction as a type of VENC pulse in the acquisition sequence. Thus, as notation of the pulse sequence (A), the labeling type corresponding to the control pulse (i.e., type of ASL pulse) is abbreviated to "1" as shown on the right side of FIG. 16. As a type of VENC pulse for each direction, the X-axis and Y-axis directions are abbreviated to "0" and the Z-axis direction is abbreviated to "1" As to a VENC type, "1" means that a VENC (+) pulse is applied in the corresponding (i.e., X-axis, Y-axis, or Z-axis) direction, "−1" means that a VENC (−) pulse is applied in the corresponding direction, and "0" means that a VENC pulse is not applied in the corresponding direction.

Similarly, the pulse sequence (B) of the independent two-point method includes a tag pulse as a type of a labeling pulse in the labeling sequence, and further includes a VENC (−) pulse to be applied only in the Z-axis direction as a type of VENC pulse in the acquisition sequence. Thus, as notation of the pulse sequence (B), the labeling type corresponding to the tag pulse (i.e., type of ASL pulse) is abbreviated to "−1" as shown on the right side of FIG. 16. Additionally, as a type of VENC pulse for each direction, the X-axis and Y-axis directions are abbreviated to "0" and the Z-axis direction is abbreviated to "−1".

Since calculation of generating a fluid amplitude image and a fluid phase image from a control image (i.e., image generated from the pulse sequence (A)) and a tag image (i.e., image generated from the pulse sequence (B)) is difference processing in the case of the independent two-point method, this difference processing is abbreviated to "A-B".

Further, amplitude Aflow of a fluid amplitude image generated by the above difference processing is given by the following equation (27) on the basis of the equations (20) and (21).

$$A\text{flow}=|S\text{cont}|-p|S\text{tag}| \quad \text{Equation (27)}$$

$$p=-1 \ (TI<TI\text{null})$$

$$p=+1 \ (TI\geq TI\text{null})$$

When the flip angle of the tag pulse is 180° and the waiting time TI is close to zero, the amplitude value of the fluid amplitude image calculated by the equation (27) is twice the amplitude value of each of the control image and the tag image. For this reason, the amplitude obtained by the above calculation (i.e., equation (27)) is abbreviated to "2".

The difference between the phase $\Phi$m of the control image and the phase −$\Phi$m of the tag image is 2$\Phi$m as shown in FIG. 13B and FIG. 13C. For this reason, the phase after calculation of "A-B" is abbreviated to "2".

FIG. 17 is a table illustrating the respective pulse sequences of the independent six-point method in the fourth embodiment in the abbreviated notation. In the independent six-point method, a control pulse (abbreviated to "1" in FIG. 17) is used as an ASL pulse of the labeling sequence of each of the pulse sequences (A), (C), and (E), and a tag pulse (abbreviated to "−1" in FIG. 17) is used as an ASL pulse of the labeling sequence of each of the pulse sequences (B), (D), and (F). As to each acquisition sequence, a VENC (+) pulse is applied in the X-axis direction in the pulse sequence (A), a VENC (−) pulse is applied in the X-axis direction in the pulse sequence (B), a VENC (+) pulse is applied in the Y-axis direction in the pulse sequence (C), a VENC (−) pulse is applied in the Y-axis direction in the pulse sequence (D), a VENC (+) pulse is applied in the Z-axis direction in the pulse sequence (E), and a VENC (−) pulse is applied in the Z-axis direction in the pulse sequence (F).

The MRI apparatus 1 performs calculations of P=A−B, Q=C−D, and R=E−F on the respective images A to F acquired by the pulse sequences (A) to (F) as shown in the lower part of FIG. 17 so as to generate respective fluid amplitude images P, Q, and R, and respective fluid phase images P, Q, and R.

Respective velocity components in the X-axis, Y-axis, and Z-axis directions can be obtained for each pixel from the fluid phase images P, Q, and R. In this manner, three-directional components of flow velocity are obtained, which makes it possible to express the flow velocity image as velocity-vector distribution in three-dimensional space.

Additionally, by calculating S=A+B+C+D+E+F, it is possible to obtain a base image in which the effects of ASL pulses and VENC pulses are canceled out.

Further, by performing calculation of P+Q+R(=2+2+2), it is possible to obtain a fluid amplitude image, amplitude of which is three times larger than the fluid amplitude image obtained by the independent two-point method. In other words, in the independent six-point method, it is possible to obtain a fluid amplitude image, SNR of which is √3 times higher than the fluid amplitude image obtained by the independent two-point method.

Fifth Embodiment

Although the independent six-point method can obtain three-directional velocity components in the X-axis, Y-axis, and Z-axis directions as described above, six pulse sequences are used and thus an imaging time of the independent six-point method is three times longer than that of the independent two-point method. In the fifth embodiment, a technique called Hadamard encode is used as to combination of a VENC (+) pulse and a VENC (−) pulse such that three-directional velocity components in the X-axis, Y-axis, and Z-axis directions can be obtained by executing four pulse sequences. This method is hereinafter referred to as the Hadamard four-point method.

FIG. 18 is a table illustrating the four pulse sequences (A) to (D) under the Hadamard four-point method and calculation performed on the respective images A to D which are obtained by the four pulse sequences (A) to (D), in the above-described abbreviated notation.

Each acquisition sequence of the Hadamard four-point method includes the VENC (−) pulses or the VENC (+) pulses which are simultaneously applied in the respective three (i.e., X-axis, Y-axis, and Z-axis) directions.

Figure 19:
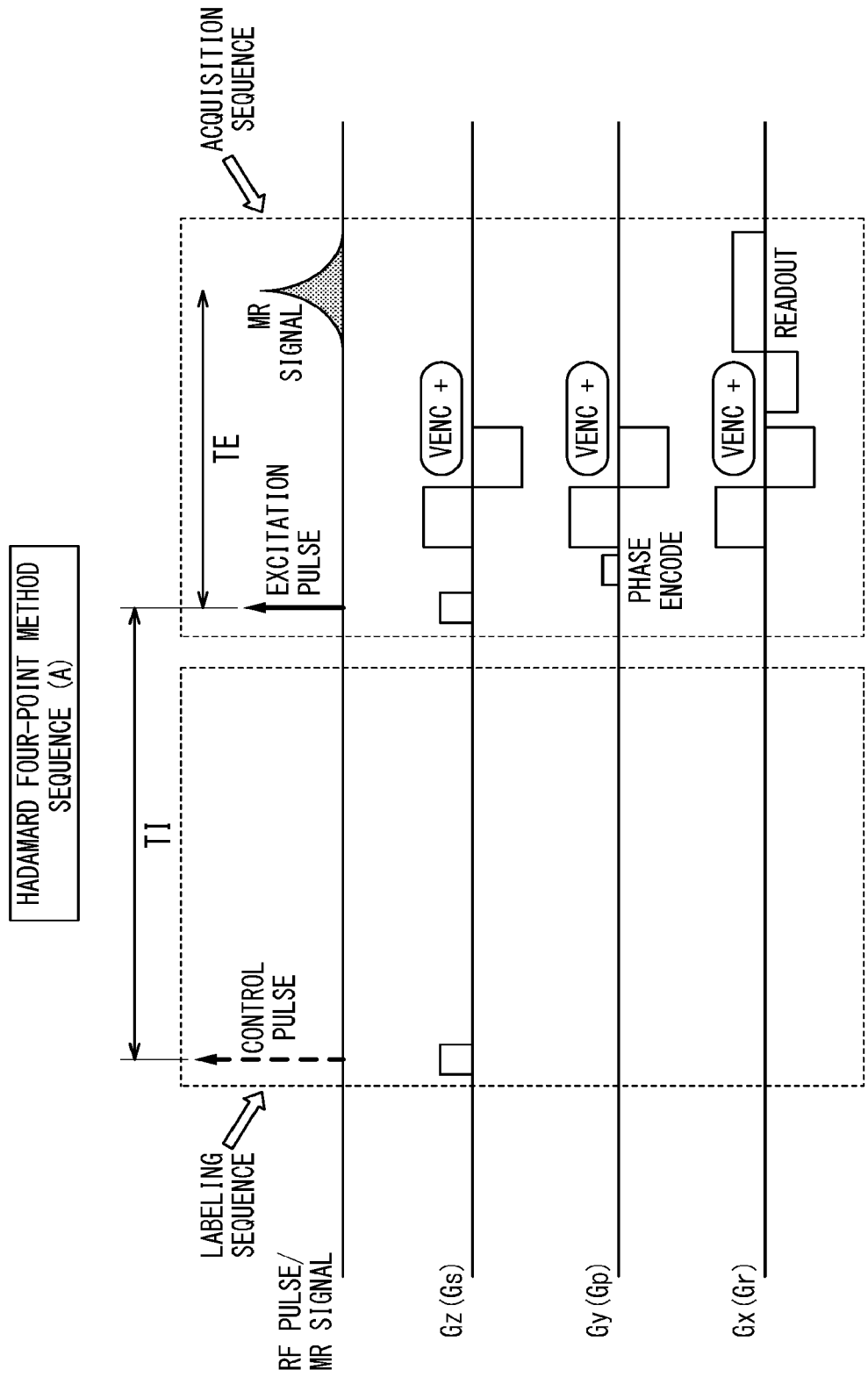
FIG. 19 is a timing chart illustrating a pulse sequence (A) of the Hadamard four-point method.

FIG. 19 is a timing chart illustrating the pulse sequence (A) of the Hadamard four-point method.

Figure 20:
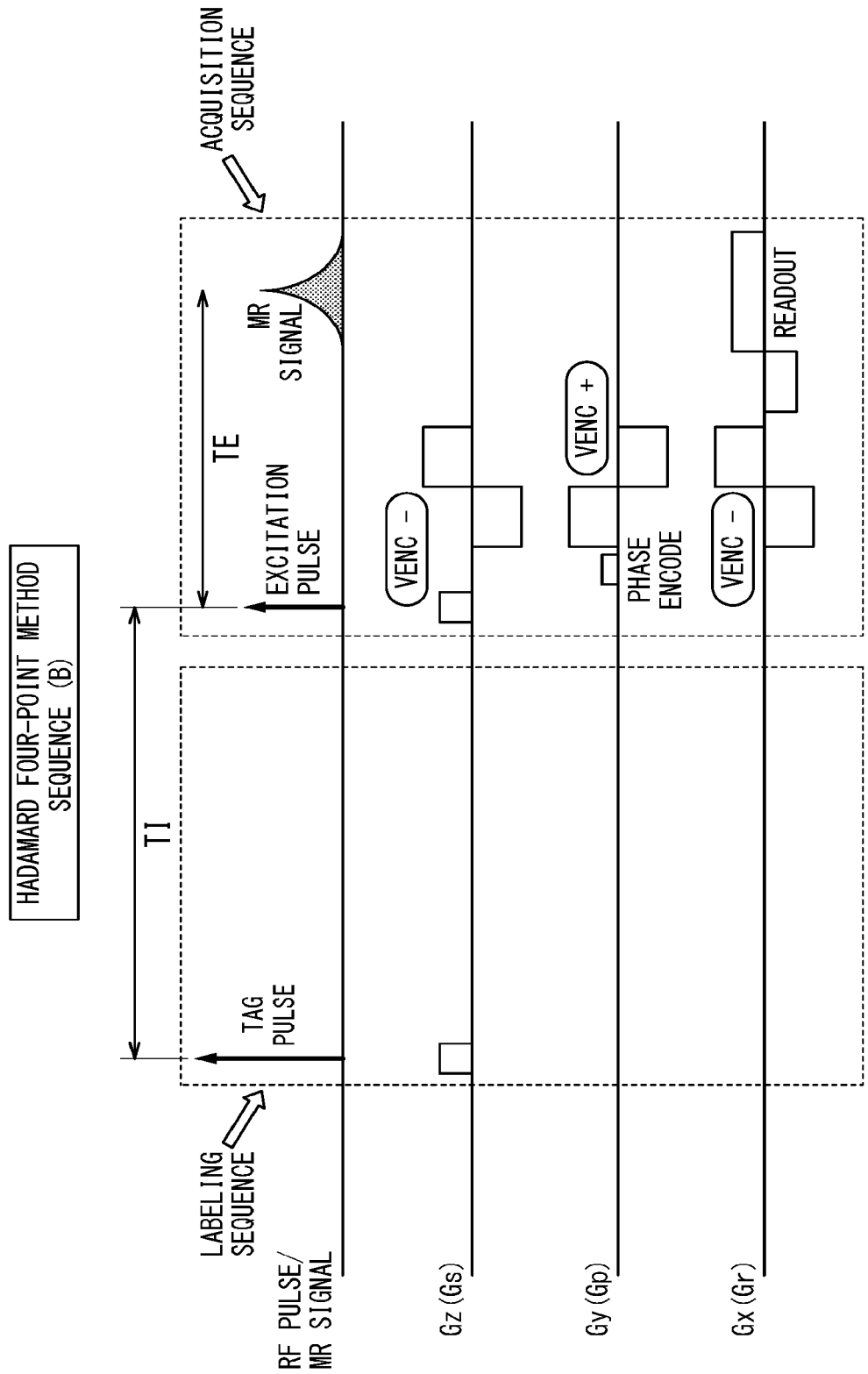
FIG. 20 is a timing chart illustrating a pulse sequence (B) of the Hadamard four-point method.

FIG. 20 is a timing chart illustrating the pulse sequence (B) of the Hadamard four-point method.

As shown in FIG. 19, the pulse sequence (A) includes a control pulse in the labeling sequence (as its labeling type is abbreviated to "1" in FIG. 18), and further includes VENC (+) pulses to be applied in the respective X-axis, Y-axis, and Z-axis directions in the acquisition sequence. These three VENC (+) pulses in the acquisition sequence corresponds to the abbreviated notation "1", "1", "1" of the VENC type in the respective X-axis, Y-axis, and Z-axis directions in FIG. 18.

Incidentally, the name "Hadamard encode" comes from a "Hadamard matrix". A Hadamard matrix is a square matrix in which each element is either "1" or "−1" and each row is orthogonal to each other. When the right side of the upper table of FIG. 18 is assumed to be a 3×4 matrix in which the three columns correspond to the respective X-axis, Y-axis, and Z-axis directions and the four rows correspond to the respective A to D directions, this matrix is a part of a Hadamard matrix.

On the other hand, as shown in FIG. 20, the pulse sequence (B) includes a tag pulse in the labeling sequence (as its labeling type is abbreviated to "−1" in FIG. 18), includes VENC (−) pulses in the respective X-axis and Z-axis directions in the acquisition sequence, and further includes the VENC (+) pulse in the Y-axis direction in the acquisition sequence. These two VENC (−) pulses correspond to the abbreviated notation "−1" of the VENC type in the respective X-axis and Z-axis directions in FIG. 18, and the VENC (+) pulse corresponds to the abbreviated notation "1" of the VENC type in the Y-axis direction in FIG. 18.

In the Hadamard four-point method, a fluid amplitude image and a fluid phase image are generated by performing calculations of addition and subtraction on the respective images A to D acquired by the pulse sequence (A) to (D). For instance, as shown in the lower part of FIG. 18, the fluid amplitude images P, Q, R and fluid phase images P, Q, R are generated by performing respective calculations of P=A−B+C−D, Q=A+B−C−D, and R=A−B−C+D.

Velocity components in the respective X-axis, Y-axis, and Z-axis directions are obtained for each pixel from the fluid phase images P, Q, and R. In this manner, three directional components of the flow velocity can be obtained in a manner similar to the independent six-point method, and it becomes possible to express the flow velocity image as velocity-vector distribution in three-dimensional space. Additionally, an amplitude image of labeled blood is generated from the fluid amplitude image P.

The Hadamard four-point method shortens an imaging time by 4/6 times compared with the independent six-point method. Nevertheless, the SNR of each of the velocity components in the X-axis, Y-axis, and Z-axis directions in the flow velocity image after calculation in the Hadamard four-point method are improved by $\sqrt{2}$ times compared with the independent six-point method. Additionally, the SNR of the fluid amplitude image P after calculation in the Hadamard four-point method also increases to $\sqrt{2}$ times the independent six-point method.

Further, by calculating S=A+B+C+D, it is possible to obtain a base image in which the effects of ASL pulses and VENC pulses are canceled out.

Sixth Embodiment

The independent two-point method, the independent six-point method, and the Hadamard four-point method described above are methods for generating a fluid amplitude image and a flow velocity image, both of which correspond to one waiting time TI (time from application of an ASL pulse to start of an acquisition sequence). By contrast, each of the embodiments described below provides a method for generating respective fluid amplitude images corresponding to plural waiting times TI and respective flow velocity images corresponding to plural waiting times TI.

In one case of the sixth embodiment, fluid amplitude images and flow velocity images are generated by setting plural ASL pulses in each labeling sequence of the Hadamard four-point method, such that the respective fluid amplitude images correspond to plural waiting times TI and the respective flow velocity images correspond to the plural waiting times TI. This method is hereinafter referred to as a "multi-labeling/multi-TI/Hadamard four-point method".

FIG. 21 is a table illustrating the four pulse sequences (A) to (D) of the multi-labeling/multi-TI/Hadamard four-point method and the method for calculating the images A to D obtained in the respective pulse sequence (A) to (D), in the abbreviated notation. In the above-described fifth embodiment, a technique called Hadamard encode is used for the combination of the VENC (+) pulse and VENC (−) pulse in the acquisition sequence. In the sixth embodiment, the Hadamard encode method is further used for a combination of the control pulse (abbreviated to "1") and the tag pulse (abbreviated to "−1") in each labeling sequence.

Figure 22:
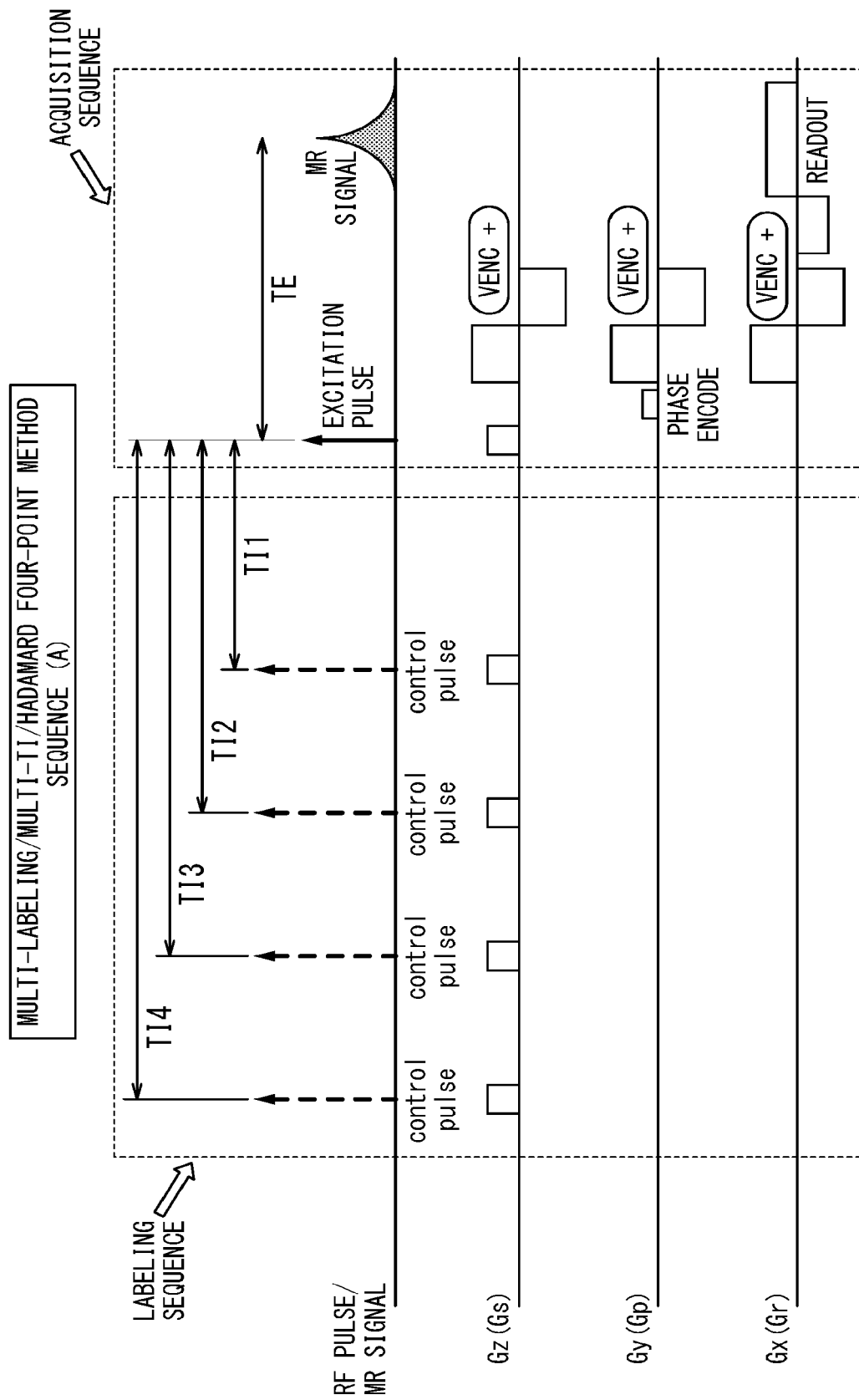
FIG. 22 is a timing chart illustrating a pulse sequence (A) of the sixth embodiment.
Figure 23:
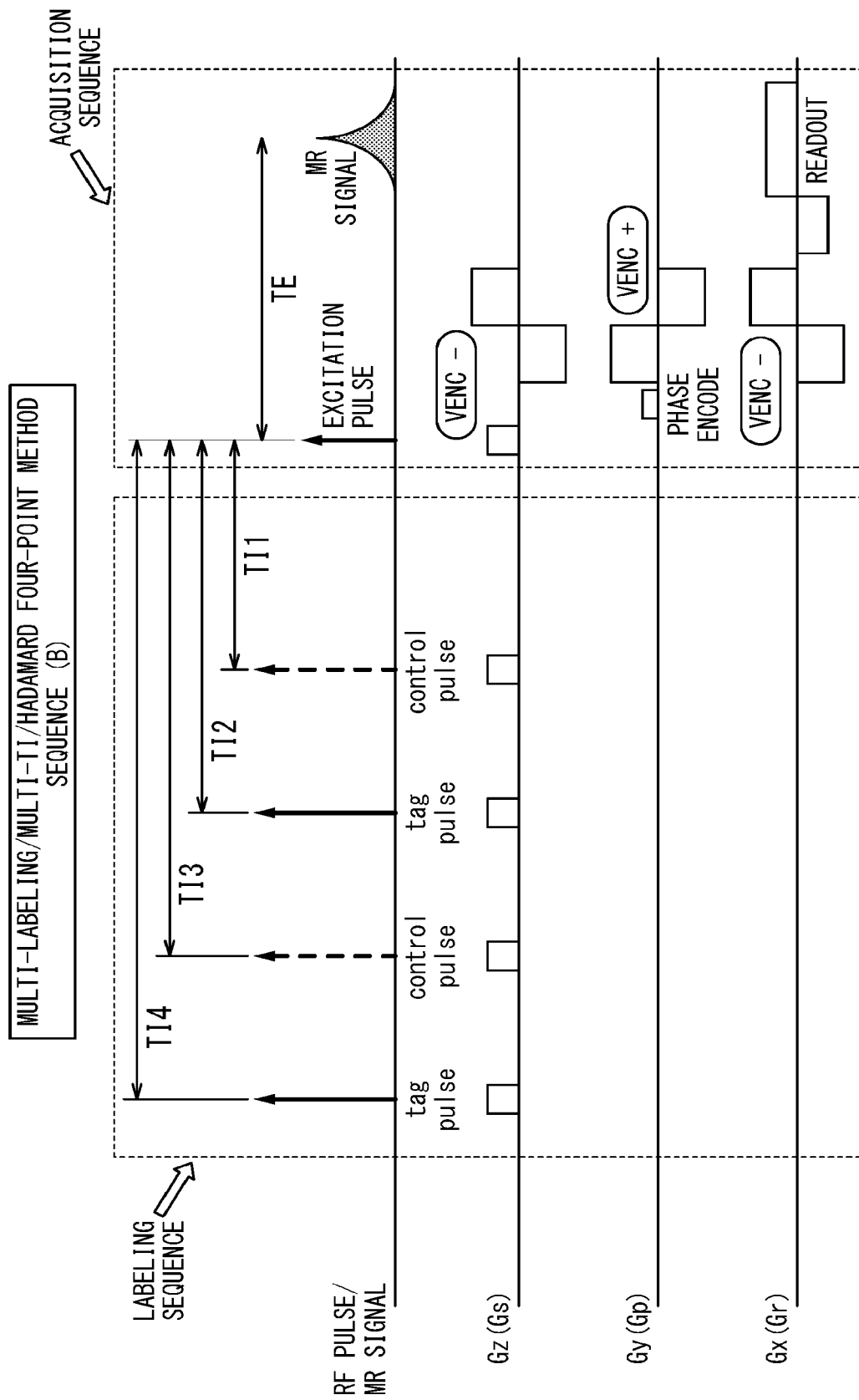
FIG. 23 is a timing chart illustrating a pulse sequence (B) of the sixth embodiment.

FIG. 22 and FIG. 23 are timing charts illustrating the pulse sequences (A) and (B) of the multi-labeling/multi-TI/Hadamard four-point method according to the sixth embodiment, respectively.

For instance, in the pulse sequence (A) shown in FIG. 22, four control pulses are applied in the labeling sequence such that the respective four control pulses correspond to different waiting times TI4, TI3, TI2, and TI1.

In the pulse sequence (B) shown in FIG. 23, a control pulse and a tag pulse are alternately applied in the labeling sequence such that two tag pulses corresponding to respective waiting times TI4 and TI2 are applied and two control pulses corresponding to respective waiting times TI3 and TI1 are applied.

Also in the multi-labeling/multi-TI/Hadamard four-point method, fluid amplitude images and fluid phase images are generated by performing addition/subtraction on the images A to D acquired in the respective pulse sequence (A) to (D) in a manner similar to the Hadamard four-point method of the fifth embodiment. For instance, as shown in the lower part of FIG. 21, four fluid amplitude images P, Q, R, and S and four fluid phase images P, Q, R, and S are generated by performing respective calculations of P=A−B+C−D, Q=A+B−C−D, R=A−B−C+D, and S=A+B+C+D.

Respective velocity components in the X-axis, Y-axis, and Z-axis directions are acquired for each pixel from the fluid phase images P, Q, and R in a manner similar to the fifth embodiment. Three directional components of flow velocity are also acquired from the fluid phase images P, Q, and R in a manner similar to the fifth embodiment.

However, it should be noted that, in the sixth embodiment, out of the four fluid amplitude images, the fluid amplitude image P is a fluid amplitude image corresponding to the waiting time TI4. In other words, blood labeled on the upstream region of the imaging region moves into the imaging region during the waiting time TI4, and this labeled blood is emphasized and depicted at the position after this movement in the fluid amplitude image P.

Similarly, the fluid amplitude images Q, R, and S respectively correspond to the waiting time TI3, TI2, and TI1.

Figure 24:
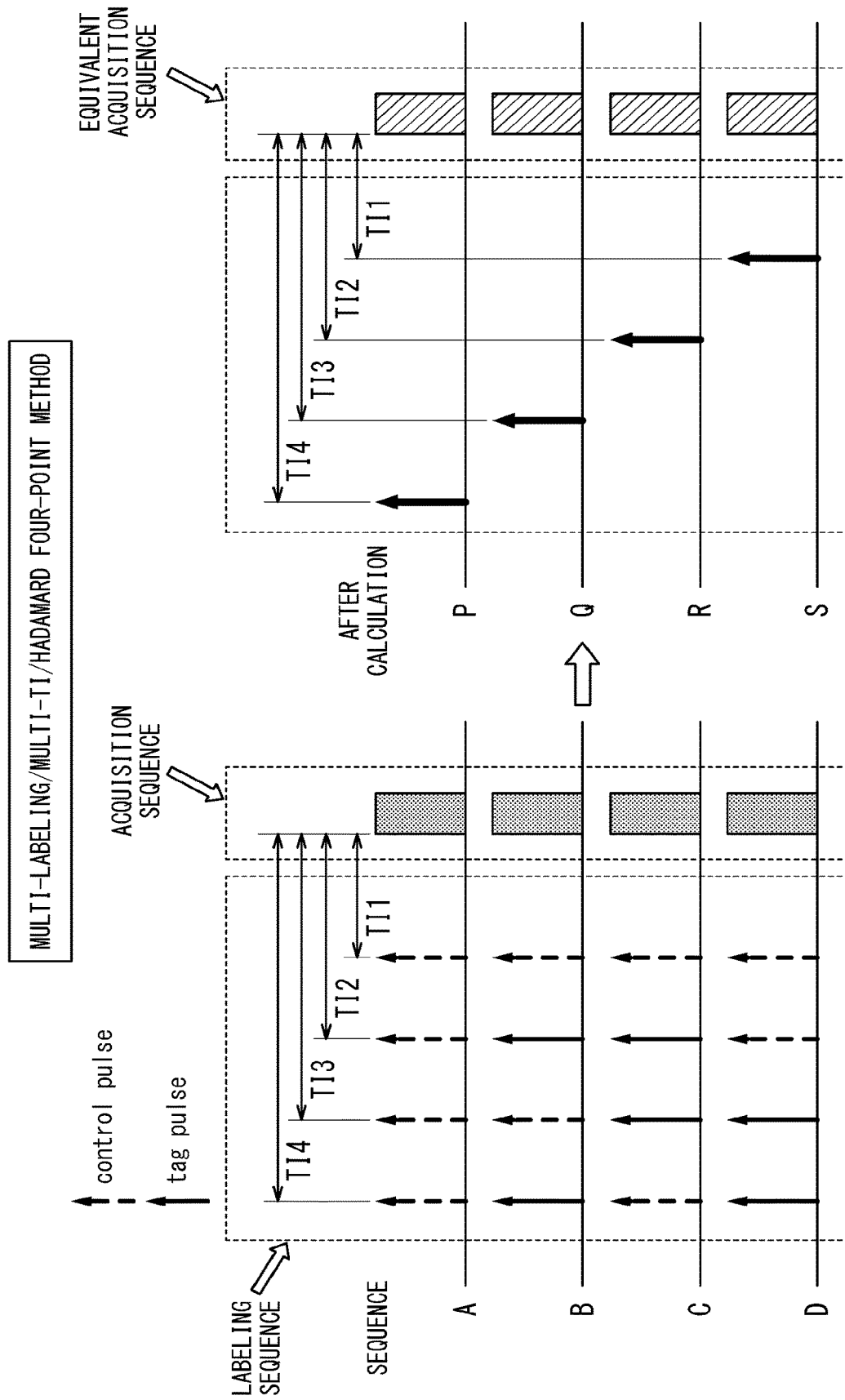
FIG. 24 is a schematic timing chart illustrating relationship between actually applied pulse sequences and equivalent pulse sequences corresponding to respective fluid amplitude images which are calculated from MR signals acquired by the actually applied pulse sequences.

FIG. 24 is a schematic timing chart illustrating relationship between the actually applied pulse sequences (A) to (D) and equivalent pulse sequences which correspond to respective fluid amplitude images P, Q, R, and S obtained by performing calculation on MR signals actually acquired by the pulse sequences (A) to (D).

First Modification of Sixth Embodiment

In each of the above-described embodiments, an RF pulse having a predetermined flip angle is used as a labeling signal of blood. This labeling method is a so-called PASL (Pulsed-ASL) method. Contrastively, there is a method of using a continuous wave (CW) as a labeling signal, and this labeling method is called a CASL method.

The first modification of the sixth embodiment is such a sequence that the CASL method is applied to the labeling signal in the above-described sixth embodiment, and is hereinafter referred to as the multi-labeling/multi-TI/Hadamard/CW/4-point method.

Figure 25:
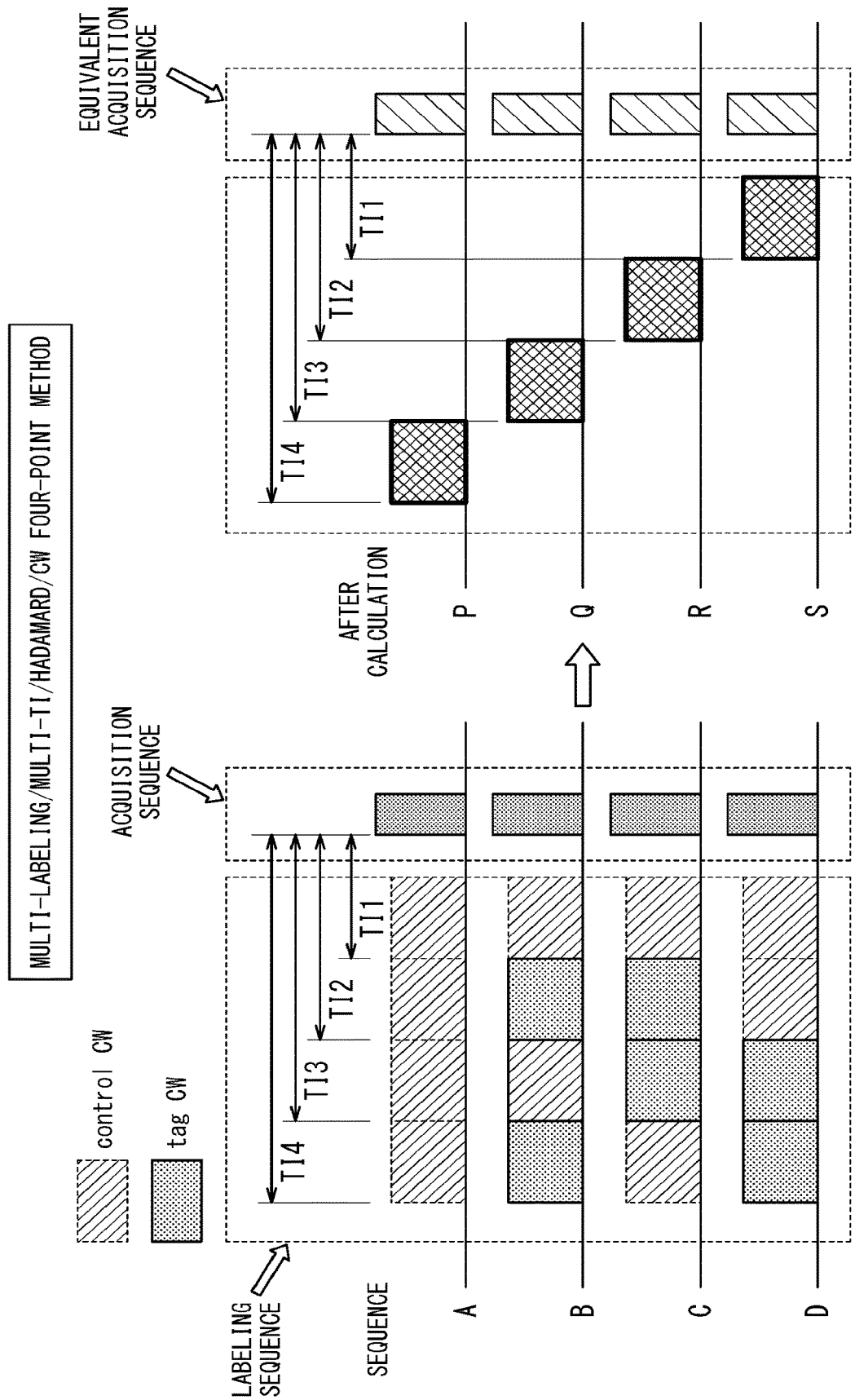
FIG. 25 is a schematic timing chart illustrating pulse sequences of the first modification of the sixth embodiment.

FIG. 25 is a schematic timing chart illustrating relationship between the pulse sequences (A) to (D) of this multi-labeling/multi-TI/Hadamard/CW/4-point method and equivalent pulse sequences which correspond to respective fluid amplitude images P, Q, R, and S obtained by calculation, in a notation similar to FIG. 24.

Also in the first modification of the sixth embodiment, respective fluid amplitude images corresponding to the four waiting times TI1 to TI4 are obtained and respective three directional components of flow velocity in the X-axis, Y-axis, and Z-axis directions are obtained in a manner similar to the sixth embodiment.

In general, the CASL method provides a higher SNR than the PASL method, but the CASL method is disadvantageous over the PASL method in terms of SAR (Specific Absorption Rate).

Second Modification of Sixth Embodiment

The second modification of the sixth embodiment uses eight ASL pulses in each labeling sequence and obtains respective eight fluid amplitude images corresponding to different waiting times TI1 to TI8 and three directional components of flow velocity in the X-axis, Y-axis, and Z-axis directions. This method is hereinafter referred to as the multi-labeling/multi-TI/Hadamard eight-point method.

FIG. 26 is a table illustrating eight pulse sequences (A) to (H) of the multi-labeling/multi-TI/Hadamard eight-point method and the method for calculating images A to H from the respective pulse sequences (A) to (H), in the abbreviated notation.

As shown in the lower part of FIG. 26, eight fluid amplitude image P, Q, R, S, T, U, V, and W are generated by performing addition/subtraction on the eight images A to H. Out of the eight fluid amplitude images, the fluid amplitude image P is a fluid amplitude image corresponding to the waiting time TI8. That is, blood labeled in the region on the upstream side of the imaging region moves into the imaging region during the waiting time TI8, and this labeled blood is emphasized and depicted at the position after this movement in the fluid amplitude image P. Similarly, the fluid amplitude images Q to W respectively correspond to the waiting times TI7 to TI1.

Since the amplitude of the labeled blood in each of the fluid amplitude images is the sum of the amplitudes of the eight images before calculation, the SNR of the labeled blood is higher by √(8/2) than that of the independent two-point method (i.e., the first embodiment).

Three directional components of flow velocity in the X-axis, Y-axis, and Z-axis directions are obtained from the fluid phase images P, Q, and R. The fluid phase image P, Q, and R respectively correspond to the waiting times TI8, TI7, and TI6, and thus these fluid phase images P, Q, and R correspond to a long waiting time, i.e., late phase. In other words, the Hadamard encode in "VENC type" shown in the frame of FIG. 26 corresponds to a "late phase".

When the Hadamard encode in "VENC type" shown outside the frame of FIG. 26 is used, three directional components of flow velocity in the X-axis, Y-axis, and Z-axis directions are obtained from the fluid phase images T, U, and V. The fluid phase images T, U, and V respectively correspond to the waiting times TI4, TI3, and TI2, and thus these fluid phase images T, U, and V correspond to a short waiting time, i.e., early phase. In other words, the Hadamard encode in "VENC type" shown outside the frame of FIG. 26 corresponds to an "early phase".

Third Modification of Sixth Embodiment

FIG. 27 is a table illustrating eight pulse sequences (A) to (H) of the third modification of the sixth embodiment and the method for calculating images A to H from the respective pulse sequences (A) to (H), in the abbreviated notation.

As shown in the lower part of FIG. 27, out of the eight images A to H, images P, Q, R, and S after calculation are generated by performing addition/subtraction on the four images A to D and images T, U, V, and W after calculation are generated by performing addition/subtraction on the four images E to H in the third modification.

In the third modification, it is possible to obtain respective three directional components of flow velocity in the X-axis, Y-axis, and Z-axis directions from two groups which are the first and the second group. The first group includes the fluid phase images P, Q, and R. The second group includes the fluid phase images T, U, and V. Accordingly, each VENC (+) pulse and each VENC (−) pulse in the pulse sequences (A) to (D) can be set so as to correspond to fast flow velocity such as flow velocity of an artery, while each VENC (+) pulse and each VENC (−) pulse in the pulse sequence (E) to (H) are set so as to correspond to slow flow velocity such as flow velocity of a vein.

In the sixth embodiment and the respective modifications of the sixth embodiment, N (N is four or eight) ASL pulses are provided in each acquisition sequence and respective fluid amplitude images corresponding to N different waiting times TI are generated. Number of labeling pulses provided in each acquisition sequence and number of waiting times are not limited to the above-described cases but may be increased to the power of 2 such as 16 and 32.

Seventh Embodiment

Figure 28:
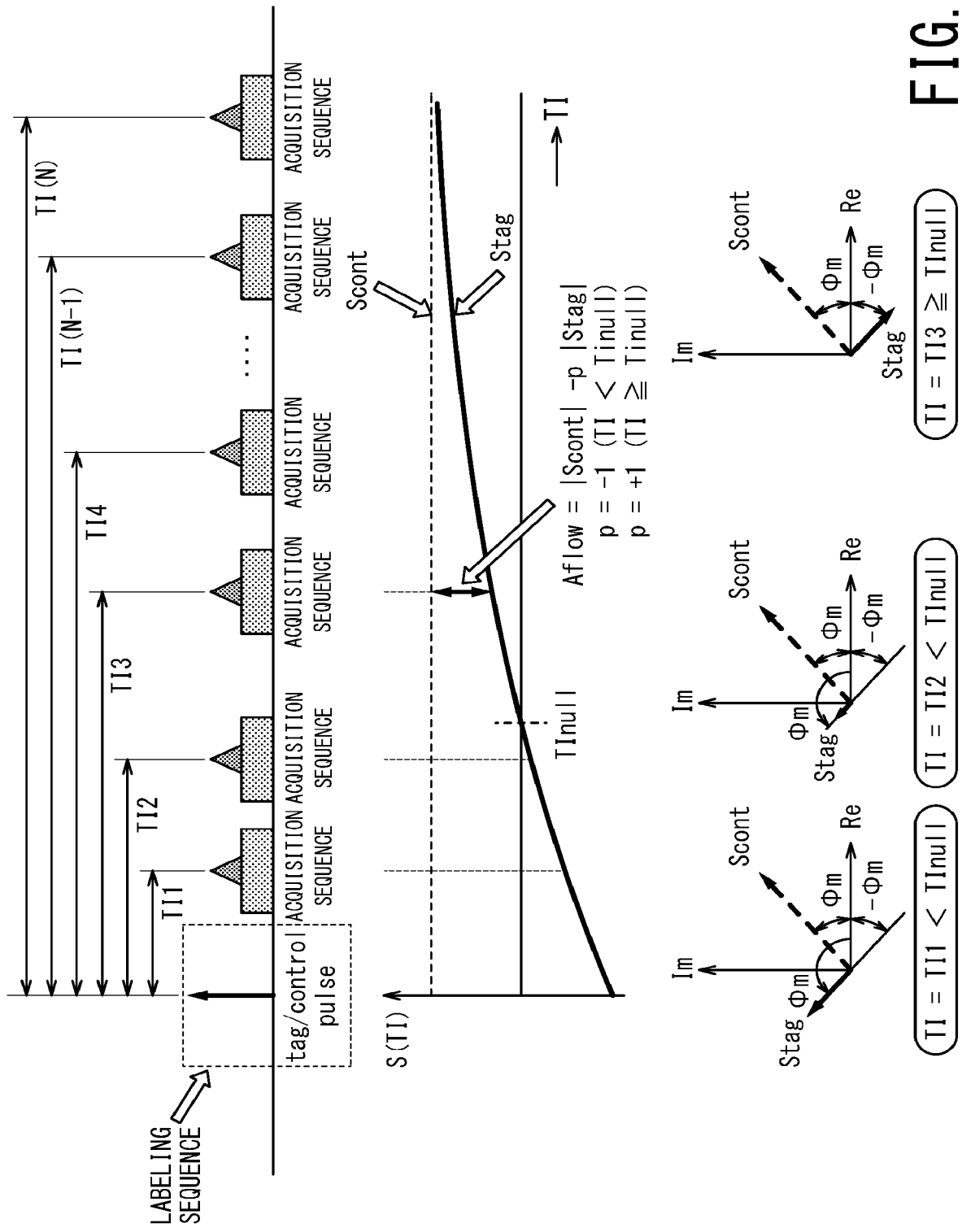
FIG. 28 is the first conceptual diagram illustrating pulse sequences of the seventh embodiment.

FIG. 28 is the first schematic diagram illustrating pulse sequences of the seventh embodiment, change in longitudinal magnetization of blood caused by those pulse sequences, and phase change caused by those pulse sequences.

In the pulse sequences of the seventh embodiment, one ASL pulse (control pulse or tag pulse) is applied in one labeling sequence, and plural acquisition sequences are time-sequentially performed posterior to this labeling sequence as shown in the top part of FIG. 28.

The acquisition sequence closest to the ASL pulse corresponds to the shortest waiting time TI1, and the acquisition sequence farthest from the ASL pulse corresponds to the longest waiting time TI(N). In the case of FIG. 28, the respective acquisition sequences acquire MR signals for generating N fluid amplitude images which correspond to respective waiting times TI1 to TI(N).

In addition, each of the acquisition sequences has the VENC (+) pulse or the VENC (−) pulse and it is possible to generate a fluid phase image from MR signals acquired in each of the acquisition sequences. Further, each of the acquisition sequences may be treated as the acquisition sequence group shown in FIG. 5. In this case, an acquisition sequence group is provided so as to correspond to different waiting times TI1 to TI(N). Each of the acquisition sequence groups includes plural acquisition sequences which correspond to respective phase encodes for generating all or a part of one image.

The second top part of FIG. 28 is a schematic graph illustrating temporal change in longitudinal magnetization of blood caused by each tag pulse applied in the pulse sequences of the seventh embodiment. As described above, when the flip angle of the tag pulse is larger than 90°, the processing of the equation (27) is performed at the time of generating a fluid amplitude image.

In each of the fluid amplitude images corresponding to the respective waiting times TI1 to TI8, blood labeled in the region on the upstream side of the imaging region moves into the imaging region during the waiting time (TI1 to TI8), and the labeled blood is emphasized and depicted at each position after movement.

The bottom part of FIG. 28 illustrates phase motion caused by the VENC (+) pulse or the VENC (−) pulse applied in the pulse sequences of the seventh embodiment. When flow velocity of blood is constant, phase Φm of a fluid phase image is constant regardless of a value of a waiting time.

Figure 29:
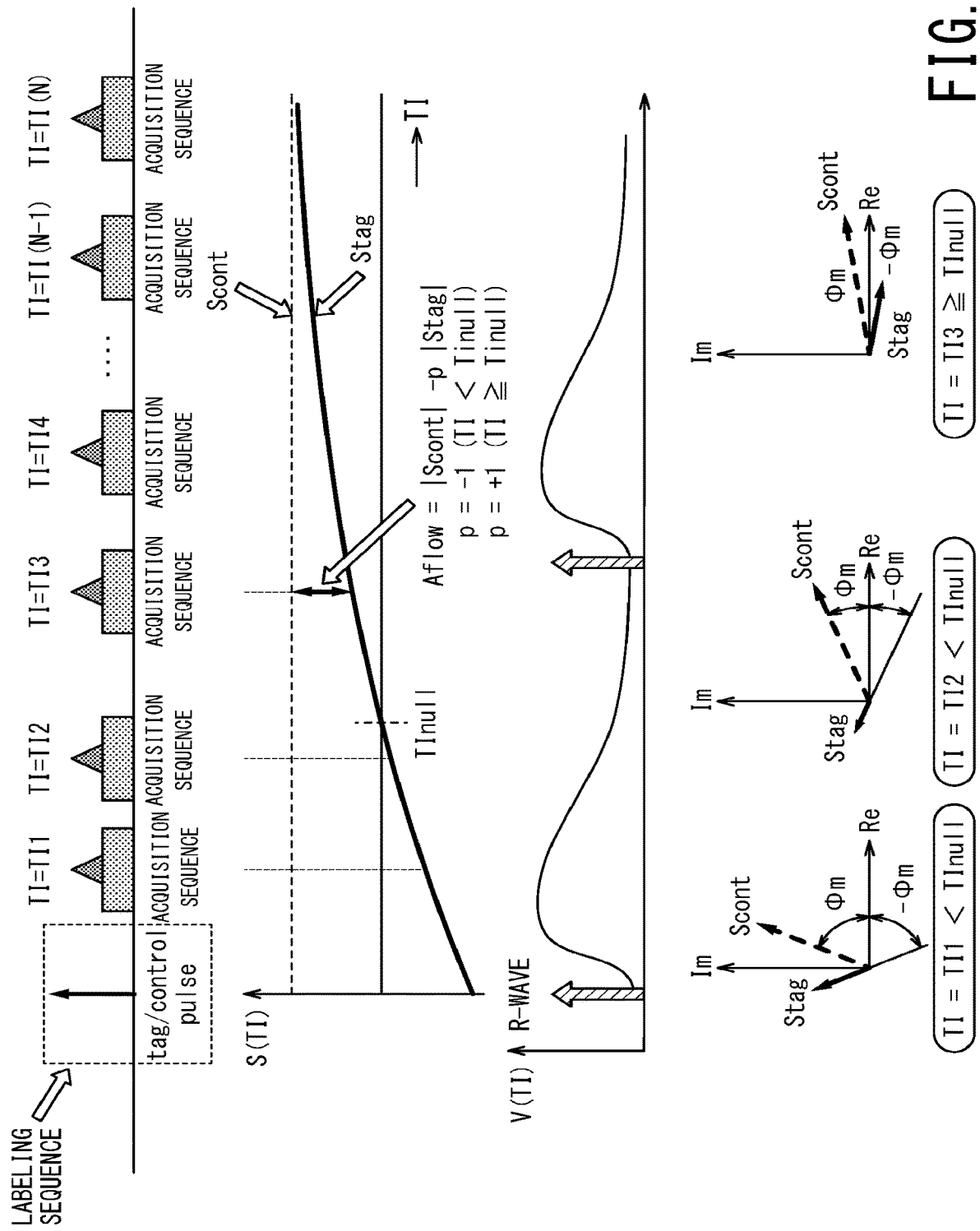
FIG. 29 is the second conceptual diagram illustrating the pulse sequences of the seventh embodiment.

FIG. 29 is the second schematic diagram illustrating pulse sequences of the seventh embodiment, and the top part and the second top part of FIG. 29 are the same as those in FIG. 28. The third top part of FIG. 29 is a schematic graph illustrating blood flow velocity when blood flow velocity is not constant. The bottom part of FIG. 29 illustrates phase motion when blood flow velocity is not constant.

When blood flow velocity is not constant, e.g., when blood flow velocity changes in synchronization with an R-wave as shown in the third top part of FIG. 29, an ASL pulse may be applied in synchronization with an R-wave. In this case, since flow velocity changes depending on length of a waiting time TI, a value of phase Φm of a fluid phase image shows a different value depending on a value of the waiting time.

Eighth Embodiment

In each of the first to seventh embodiments, a fluid amplitude image and a fluid phase image are generated by performing difference calculation or addition/subtraction calculation on two types of images, which are a control image generated from MR signals acquired by a pulse sequence including a control pulse and a tag image generated from MR signals acquired by another pulse sequence including a tag pulse. In the eighth embodiment, a fluid amplitude image and a fluid phase image are generated from a single image, that is, from one tag image or one control image. In this respect, the eighth embodiment is equivalent to a one-point method.

FIG. 30A to FIG. 30D are conceptual diagrams illustrating processing of generating a fluid amplitude image and a fluid phase image from one pulse sequence (A) including one tag pulse under the STAR type. As shown in FIG. 30A, a tag pulse is applied in the region on the upstream side of the imaging region. In addition, as shown in FIG. 30B, the pulse sequence (A) includes one tag pulse and plural acquisition sequences applied subsequent to the tag pulse. The plural acquisition sequences correspond to different waiting times TI.

Since a control image does not exist, an amplitude image of labeled fluid is depicted as contrast difference from stationary part of a tag image.

Incidentally, it can be thought that longitudinal magnetization of blood is sufficiently recovered in an acquisition sequence with a long waiting time. When each pixel signal of an image corresponding to the acquisition sequence with the maximum waiting time is denoted as Stag (TImax), this Stag (TImax) can be used instead of each pixel signal of the control image. Thus, in the one-point method, fluid amplitude Aflow can be calculated from the following equation (28).

$$A\text{flow}=|\text{Stag}(TI\text{max})|-p|\text{stag}(TI)| \qquad \text{Equation (28)}$$

$$p=-1 \ (TI<TI\text{null})$$

$$p=+1 \ (TI\geq TI\text{null})$$

As shown in FIG. 30C, the fluid phase Φm can be obtained from difference from the background phase after the background-phase correction processing (phase is corrected to zero).

In addition, VENC pulses in the one-point method include the VENC (−) pulse in the Z-axis direction as abbreviated in FIG. 30D.

Figure 31B:
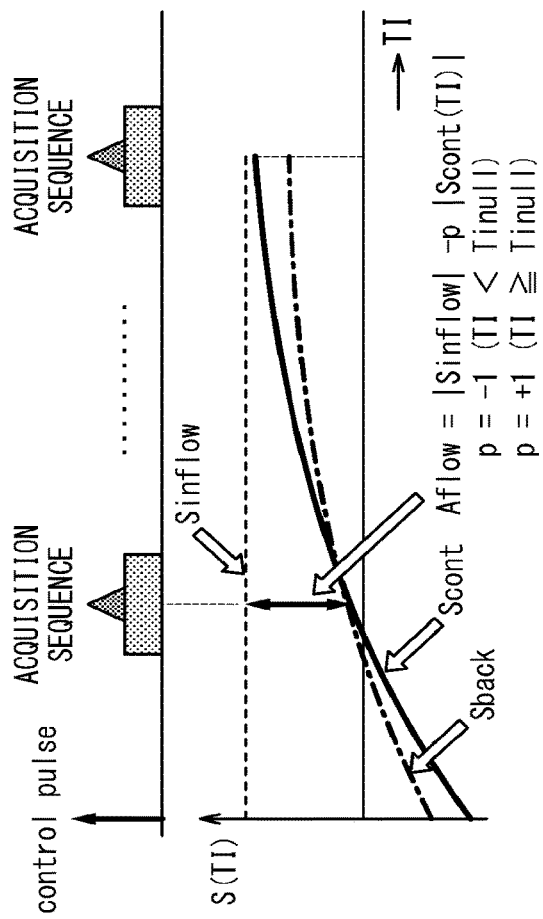
FIG. 31A to FIG. 31D are conceptual diagrams illustrating processing of generating a fluid amplitude image and a fluid phase image from one pulse sequence (A) of the FAIR type.
Figure 31C:
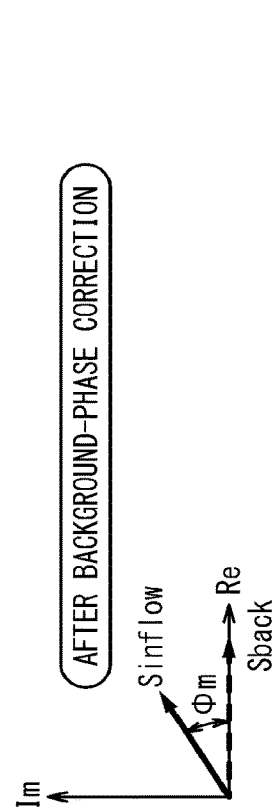
Figure 31D:
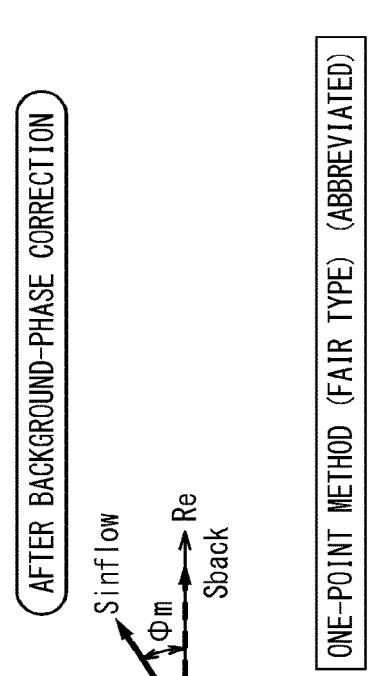
Figure 31A:
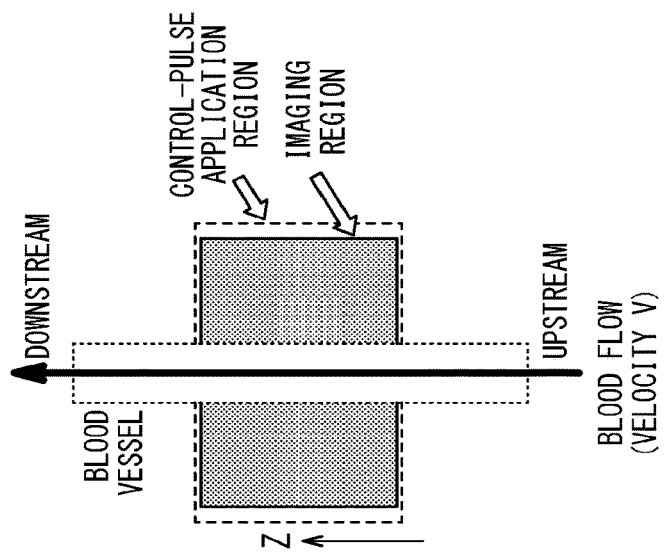

On the other hand, with respect to the imaging of the FAIR type, a fluid amplitude image and a fluid phase image can be generated using only one pulse sequence (A) including one control pulse, as shown in FIG. 31A to FIG. 31D. As shown in FIG. 31A, the control pulse is applied to almost the same region as the imaging region. As shown in FIG. 30B, the pulse sequence (A) includes one control pulse and respective acquisition sequences which correspond to different waiting times TI and are applied subsequent to the control pulse.

The signal Scont (TI) of blood present in the imaging region at the application timing of the control pulse shows change in longitudinal magnetization as shown by the solid line in the lower part of FIG. 30B. In addition, the signal Sback of the background stationary part in the imaging region shows change in longitudinal magnetization as shown by the chain line in the lower part of FIG. 30B.

Since the control pulse is not applied to the blood signal flowing into the imaging region, longitudinal magnetization of the blood signal Sinflow flowing into the imaging region takes a constant value as shown by the dashed line in the upper part of FIG. 30B and does not temporally change.

Thus, in the one-point method of the FAIR type, fluid amplitude Aflow can be calculated from the following equation (29).

$$A\text{flow}=|\text{Sinflow}|-p|\text{Scont}(TI)| \qquad \text{Equation (29)}$$

$$p=-1 \ (TI<TI\text{null})$$

$$p=+1 \ (TI\geq TI\text{null})$$

As shown in FIG. 31C, the fluid phase Φm can be obtained from the difference from the background phase after the background-phase correction processing (phase is corrected to zero).

In addition, VENC pulses of the one-point method in the FAIR type include the VENC (+) pulse in the Z-axis direction as abbreviated in FIG. 31D.

Ninth Embodiment

So far, it has been described that the MRI apparatus 1 of the first to eighth embodiments can execute various pulse sequences having both advantages of the ASL method and the PC method. Further, it has been described that the MRI apparatus 1 of the first to eighth embodiments can generate both of a fluid amplitude image and a flow velocity image from data acquired in a short imaging time.

As described below, the MRI apparatus 1 of each of the ninth to fourteenth embodiments generates an analysis image by fusioning, or by integrating or combining, dynamic information of fluid included in a fluid amplitude image and velocity information included in a flow velocity image, in addition to generating these fluid amplitude image and flow velocity image.

Figure 32:
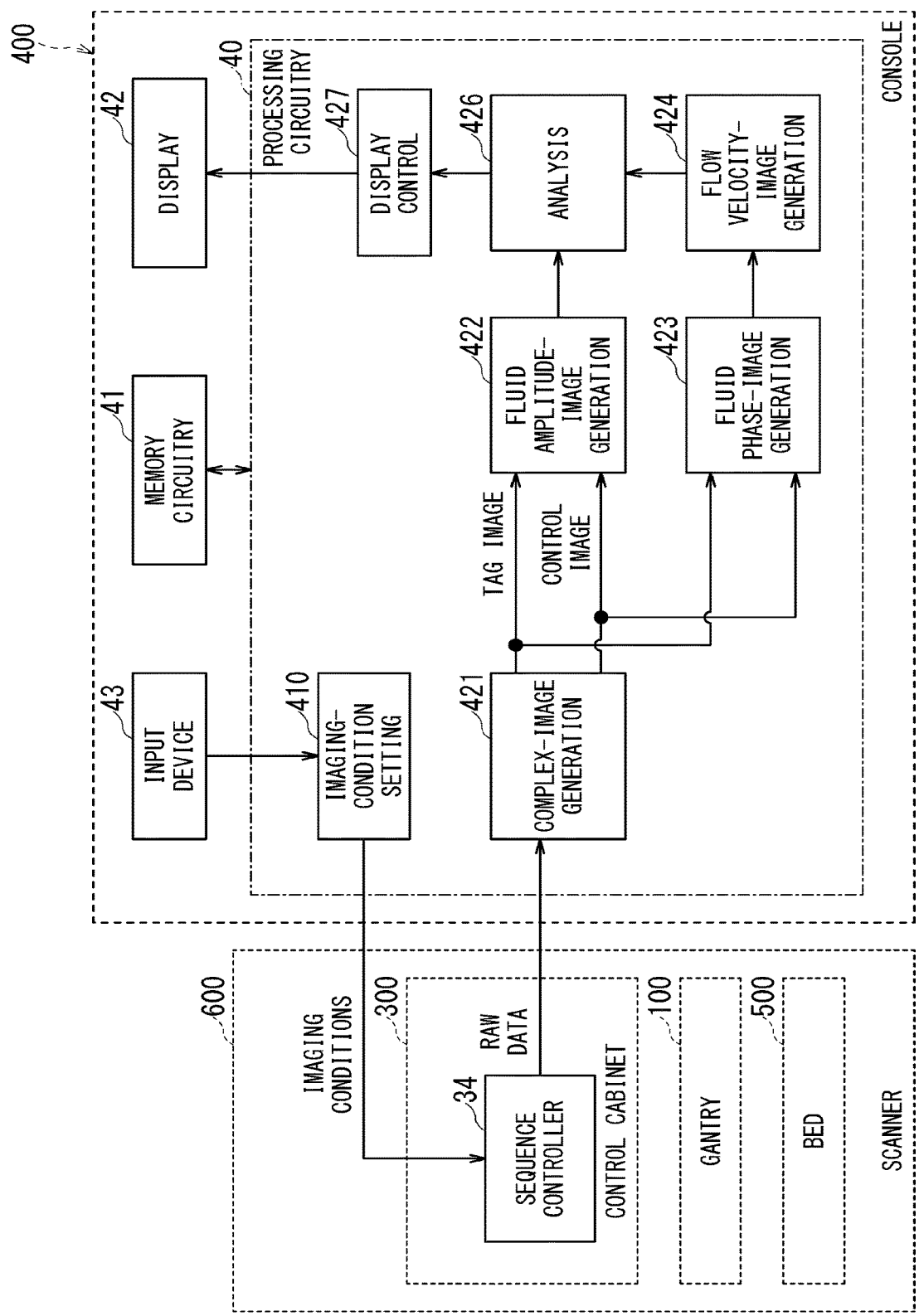
FIG. 32 is a block diagram illustrating components related to image generation in the MRI apparatus of each of the ninth to thirteenth embodiments.

FIG. 32 is a block diagram of the MRI apparatus 1 of each of the ninth to thirteenth embodiments. The MRI apparatus 1 of each of the ninth to thirteenth embodiments shown in FIG. 32 differs from the MRI apparatuses 1 of the first to eighth embodiments shown in FIG. 2 in that the MRI apparatuses 1 of each of the ninth to thirteenth embodiments includes an analysis function 426 and a display control function 427. The processing circuitry 40 implements the analysis function 426 and the display control function 427 by, e.g., causing the processor included in the processing circuitry 40 to execute a predetermined program.

Figure 33:
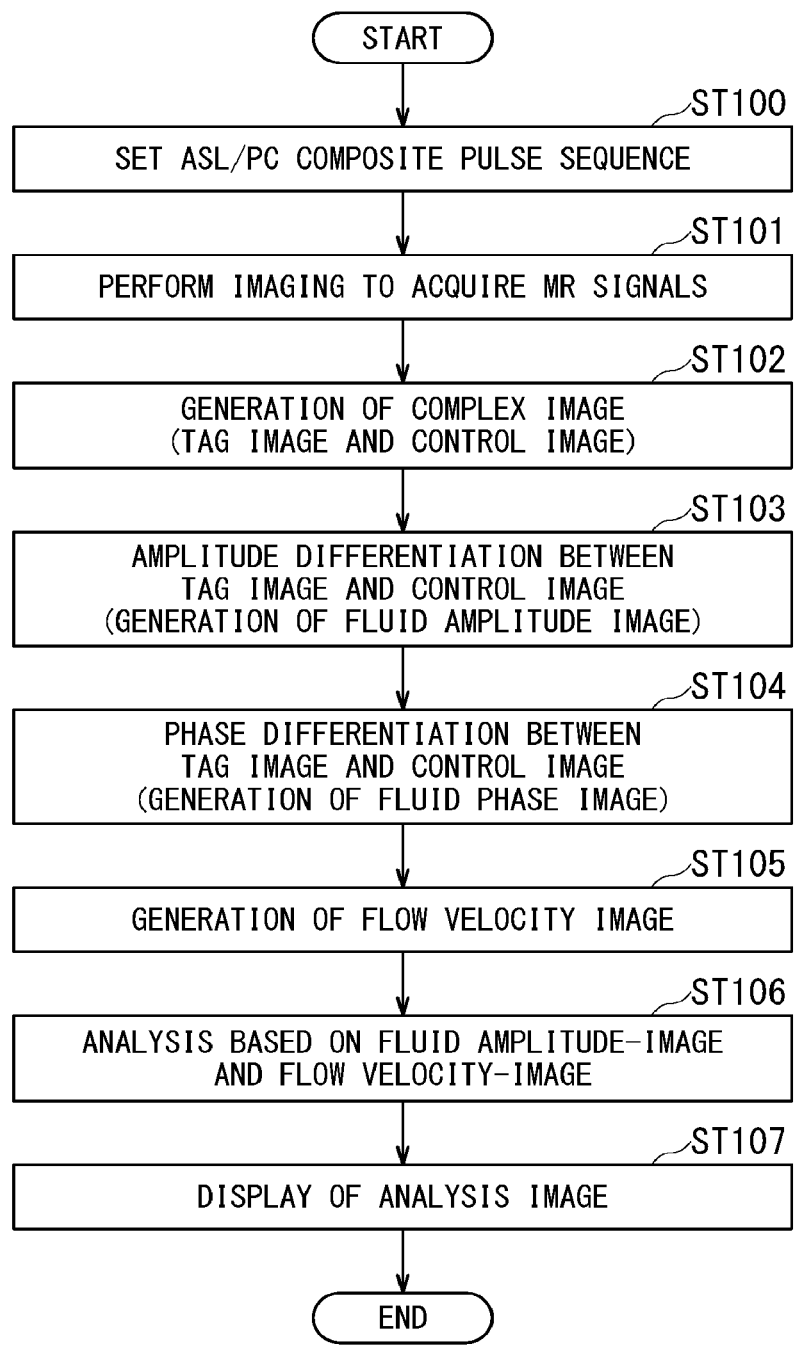
FIG. 33 is a flowchart illustrating an operation performed by the MRI apparatus of each of the ninth to thirteenth embodiments.

FIG. 33 is a flowchart illustrating an operation performed by the MRI apparatus 1 of each of the ninth to thirteenth embodiments. FIG. 33 differs from FIG. 3, which is the flowchart of the MRI apparatuses 1 of the first to eighth embodiments, in that the processing of the MRI apparatus 1 of each of the ninth to thirteenth embodiments further includes processing of the steps ST106 and ST107.

In the step ST106 of FIG. 33, analysis is performed on the basis of a fluid amplitude image and a flow velocity image. The processing of the step ST106 is performed by the analysis function 426 in FIG. 32. The analysis function 426 generates, e.g., a fusion image obtained by fusioning a fluid amplitude image and a flow velocity image as an analysis image.

FIGS. 34A to 34C are conceptual diagrams illustrating a fusion image. FIG. 34A and FIG. 34B are the same as FIG. 9A and FIG. 9B, respectively. The fusion image shown in FIG. 34C can be generated by fusioning the respective contents of FIG. 34A and FIG. 34B. In the fusion image shown in FIG. 34C, the flow velocity direction is only in the Z direction and the number of waiting times TI is one (i.e., the number of the positions of tagged blood is one). Hereinafter, descriptions will be sequentially given of embodiments for generating a fluid amplitude image and a flow velocity image, both of which correspond to plural waiting times TI(n) and respective three flow velocity components in the X-axis, Y-axis, and Z-axis directions.

Figure 35C:
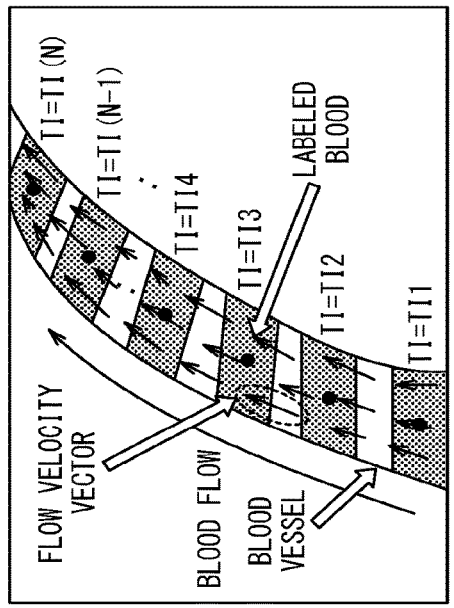
FIG. 35A to FIG. 35C are schematic diagrams illustrating a concept of generating an analysis image in the ninth embodiment.
Figure 35A:
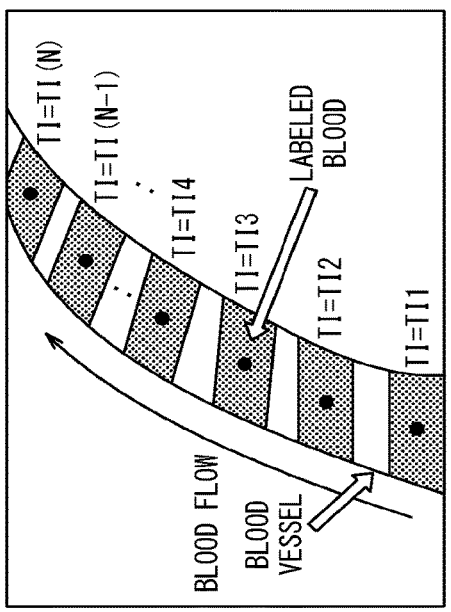
Figure 35B:
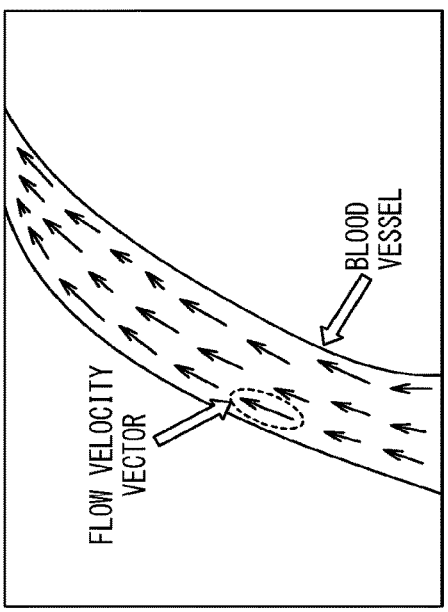

FIG. 35A to FIG. 35C are schematic diagrams illustrating a concept of generating a fusion image in which a fluid amplitude image and a flow velocity image are fusioned as one case of an analysis image generated by the MRI apparatus 1 of the ninth embodiment.

FIG. 35A shows a fluid amplitude image corresponding to plural waiting times TI (n), wherein "n" is a positive integer from 1 to N. The fluid amplitude image shown in FIG. 35A can be generated from, e.g., the images P to S which are calculated from data acquired by the pulse sequences (shown in FIGS. 21 to 25) of the sixth embodiment. Although a pulse sequence corresponding to the four waiting times TI1 to TI4 is described in each of FIGS. 21 to 25, number N of waiting times can be arbitrarily increased to a power of 2 such as 8, 16, and 32 as described above.

For instance, when number N of waiting times is eight, the fluid amplitude image shown in FIG. 35A can be generated from the respective eight images P to W, which correspond to the waiting times TI 1 to TI 8 shown in FIG. 26 and FIG. 27 and are calculated from data acquired by the respective pulse sequences of FIG. 26 and FIG. 27.

In addition, the fluid amplitude image shown in FIG. 35A can also be generated from the image which is calculated from MR signals acquired by the pulse sequences of the seventh embodiment (FIG. 28 and FIG. 29). Although blood is labeled by the tag pulse and then moves during each of the waiting times TI1 to TI (N), plural hatching regions in FIG. 35A correspond to the respective regions of the labeled blood after the movement in the waiting times TI1 to TI(N). This fluid amplitude image accurately depicts how the blood labeled outside the imaging region flows into the imaging region and then moves through a blood vessel. The center of gravity of the labeled blood image can be obtained, and then, the center of the gravity can be shown as each black circle in each hatching region, for example, as shown in FIG. 35A. In this manner, information on motion including the exact position of the labeled blood can be obtained from the fluid amplitude image.

However, it should be noted that, in the fluid amplitude image shown in FIG. 35A, the positions of the labeled fluid moving in the blood vessel are depicted as respective discrete positions corresponding to the waiting times TI1 to TI(N). From those discrete positions of the labeled blood and the waiting times TI1 to TI (N), it may be possible to estimate velocity of the labeling fluid. However, velocity of the labeled fluid estimated in this manner is limited to spatially discrete positions, and thus blood flow velocity of the entire blood vessel region cannot be obtained with high spatial resolution.

FIG. 35B shows a flow velocity image calculated from the flow-velocity phase image which reflects phase information changed by the VENC (+) pulse or the VENC (−) pulse. Velocity information can be obtained as a three-dimensional velocity vector by applying the VENC (+) pulse or VENC (−) pulse in the three directions of the X-axis, Y-axis, and Z-axis. Since phase information is obtained for each pixel in the flow-velocity phase image, it is possible to acquire blood flow velocity of the entire blood vessel region with high spatial resolution in the flow velocity image calculated from the flow-velocity phase image.

Meanwhile, a movement position of blood can be estimated by sequentially integrating velocity vectors of the flow velocity image from the upstream side of the blood vessel. However, the position of the blood estimated in this manner is merely a position estimated from distribution of velocity vectors at a certain time and does not indicate the actual movement position of the labeled blood.

Further, when velocity vectors fluctuate by due to influence such as noise, the noise is also accumulated by the integration processing, and thus there is a possibility that the estimated flow path may include a large error. As a result, there may be a possibility that the estimated flow path of blood protrudes outside the blood vessel.

As described above, when using a fluid amplitude image alone, or when using a flow velocity image alone, there are advantages and disadvantages. Thus, in the ninth embodiment, a fusion image is generated by fusioning a fluid amplitude image and a flow velocity image in order to obtain the respective advantages. FIG. 35C is a schematic diagram illustrating a fusion image generated in the ninth embodiment.

This fusion image is displayed on the display 42, for instance. By using this fusion image, it is possible to analyze how labeled blood actually moves through a blood vessel. It is also possible to simultaneously acquire velocity information of the blood in the blood vessel as velocity vectors with high resolution.

Although each labeled blood corresponding to each of the multiple waiting times TI1 to TI(N) is simultaneously shown in one fusion image in the case of FIG. 35C, the labeled blood corresponding to each of the waiting times TI1 to TI (N) can also be displayed as a moving image while temporally switching them one by one. At this time, respective velocity vectors obtained corresponding to the waiting times TI 1 to TI(N) may also be displayed so as to be superimposed on the respective images of the labeled fluid corresponding to the waiting times TI1 to TI(N), while being sequentially switched.

The processing circuitry 40 may generate a superimposed image by further superimposing a morphological image such as a T1 weighted image and a T2 weighted image on the fusion image and cause the display 42 to display this superimposed image. Additionally or alternatively, the fusion image and the morphological image may be displayed side by side on the display 42.

Tenth Embodiment

Figure 36:
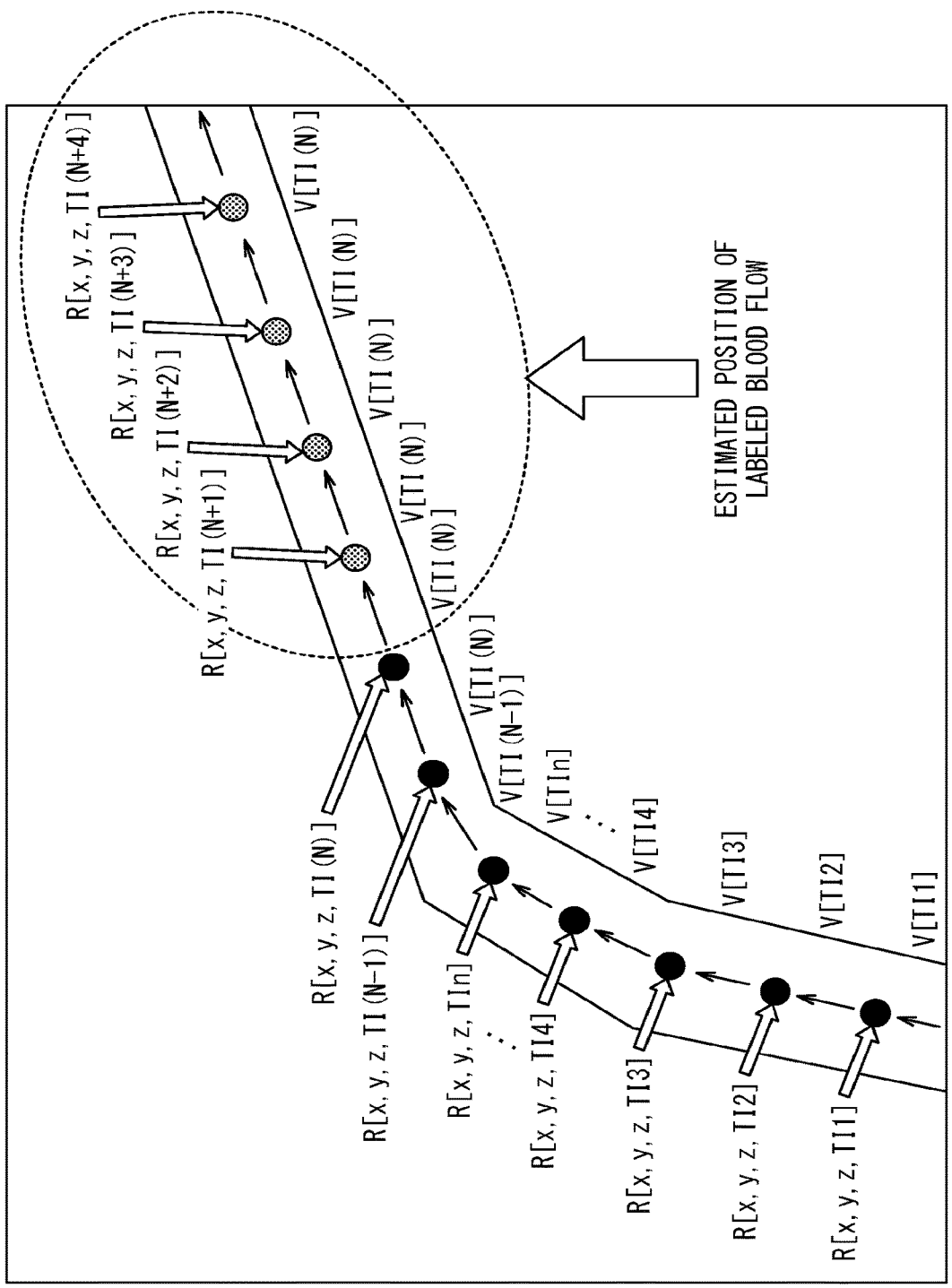
FIG. 36 is a schematic diagram illustrating a concept of generating an analysis image in the tenth embodiment.

FIG. 36 is a schematic diagram illustrating an analysis image generated by the MRI apparatus 1 of the tenth embodiment. The respective positions of the black circles shown in FIG. 36 indicate the positions of the center of gravity of the labeled fluid, which correspond to the respective waiting times TI1 to TI (N) and are obtained from the fluid amplitude image.

Note that the amplitude Aflow of the inflow blood in the fluid amplitude image is difference between the amplitude |Scont| of the control image and the amplitude |Stag| of the tag image, for the case where the waiting time TI is TInull or longer, as shown in the second top part of FIG. 28 or FIG. 29.

Further, it also should be noted that, in the tag image, longitudinal magnetization of inflow blood labeled by the tag pulse recovers with time, and the amplitude |Stag| of the inflow blood of the tag image approaches the amplitude |Scont| of the blood of the unlabeled control image. In other words, when the waiting time is increased to the same degree as longitudinal relaxation time of blood, contrast (i.e., the difference) between the control image and the tag image becomes small, and thus it becomes impossible to depict the inflow blood in the fluid amplitude image. Hence, the waiting time TI by which inflow blood can be depicted in the fluid amplitude image (i.e., the elapsed time from application of the tag pulse) is said to be about 2 to 3 seconds.

The tenth embodiment provides a technique for coping with the above problem. Specifically, in the tenth embodiment, when TI (N) is defined as the maximum waiting time at which inflow blood can be depicted using the actual fluid amplitude image, the position of the labeling fluid corresponding to the maximum waiting time TI (N) or more can be estimated by treating the position of the labeled fluid at the maximum waiting time TI (N) as a starting point, and further by using the velocity vector obtained from the flow velocity phase image (e.g., using the flow velocity vector V[TI (N)] at the maximum waiting time TI(N)). In the analysis image shown in FIG. 36, the positions of the labeled fluid estimated from velocity vectors such as R[x, y, z, TI(N+1)] and R[x, y, z, TI(N+2)] are indicated by gray circles.

According to the tenth embodiment, the positions (or movement) of such labeled fluid, which correspond to long waiting time TI(s), and thus is difficult to accurately depict the positions only with a fluid amplitude image due to restriction of longitudinal relaxation time, can be estimated by using velocity information of a flow velocity image Eleventh Embodiment In the eleventh embodiment, a fusion image in which both of an artery and a vein are depicted is generated as an analysis image. FIG. 37A is a schematic diagram illustrating arteries depicted from a fluid amplitude image as a preliminary step of generating a fusion image. In FIG. 37A, the arteries are indicated by oblique-line hatching regions.

Figure 37B:
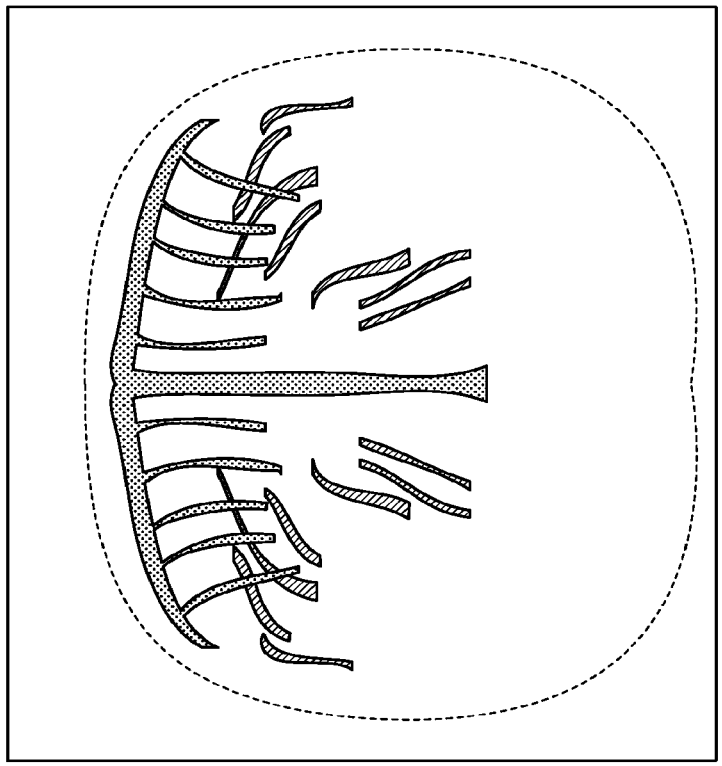
FIG. 37B is a schematic diagram illustrating peripheral arteries and veins depicted from the flow velocity image also as the preliminary step of generating a fusion image in the eleventh embodiment.
Figure 37A:
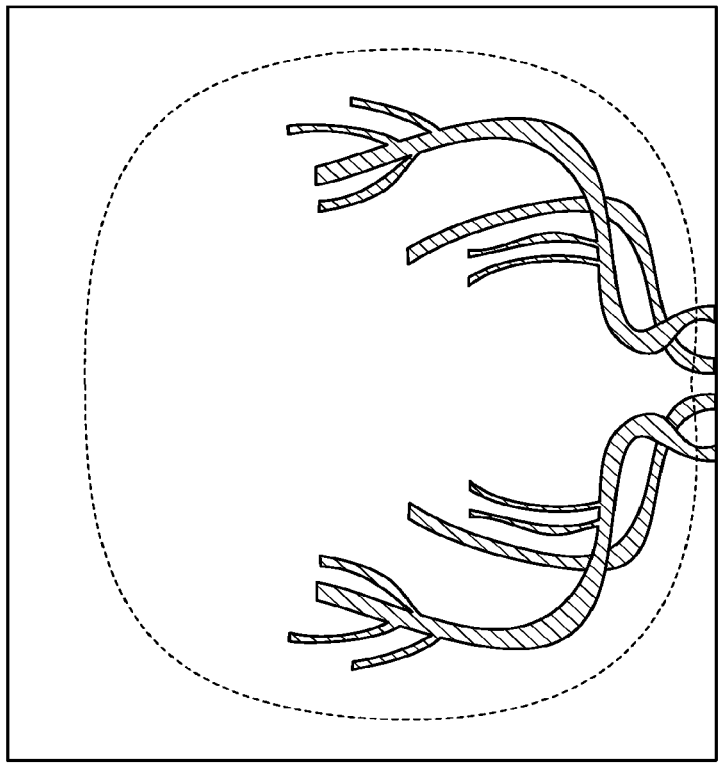
FIG. 37A is a schematic diagram illustrating arteries depicted from a fluid amplitude image as a preliminary step of generating a fusion image in the eleventh embodiment.

FIG. 37B (b) is a schematic diagram illustrating peripheral arteries and veins depicted from the flow velocity image also as the preliminary step of generating a fusion image. In FIG. 37B, the peripheral arteries are indicated by oblique-line hatching regions and the veins are indicated by with dotted hatching regions.

As described above, in the fluid amplitude image, it is possible to depict labeled blood (i.e., blood of the artery labeled in the region on the upstream side of the imaging region, in this case) up to the range of a predetermined waiting time TI. The arteries depicted in this manner are shown in FIG. 37A. However, it is not possible to depict peripheral arteries corresponding to a loner waiting time TI than a predetermined waiting time TI from the fluid amplitude image.

By contrast, it is possible to extract a peripheral artery or a vein, which have small flow velocity, from the flow velocity image or the fluid phase image by setting magnitude of the VENC (+) pulse or the VENC (+) pulse to low level. Although the peripheral arteries and the veins are distinguished by different types of hatching in FIG. 37B for convenience, the image of FIG. 37B is obtained by depicting slow flow velocity within a predetermined range. Actually, in this stage of the process, it is not possible to distinguish peripheral arteries from veins. That is, in reality, blood vessels corresponding to slow bloodstream-velocity are depicted in FIG. 37B without distinction between peripheral arteries and veins.

Figure 38B:
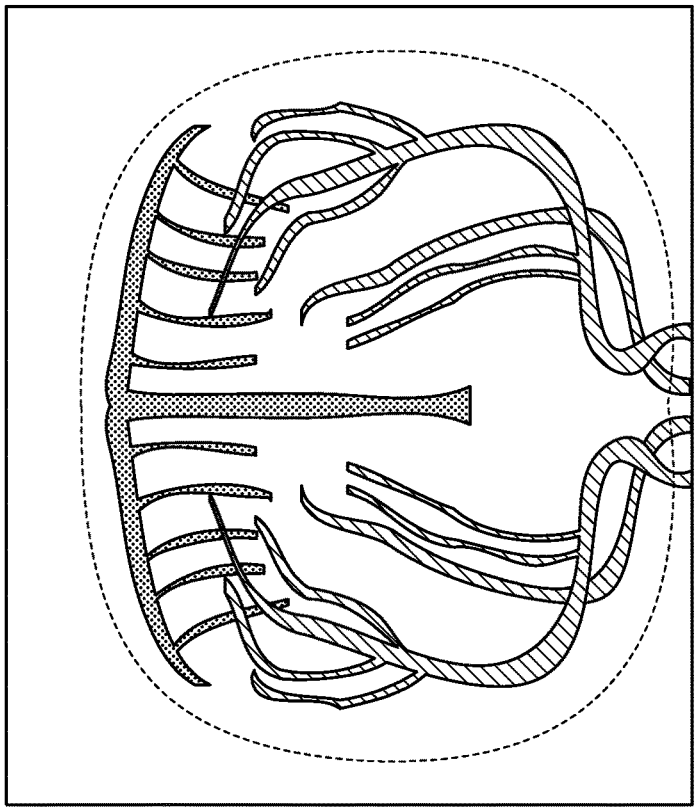
FIG. 38B is a schematic diagram illustrating a fusion image in which arteries and veins are distinguished from each other in the eleventh embodiment.
Figure 38A:
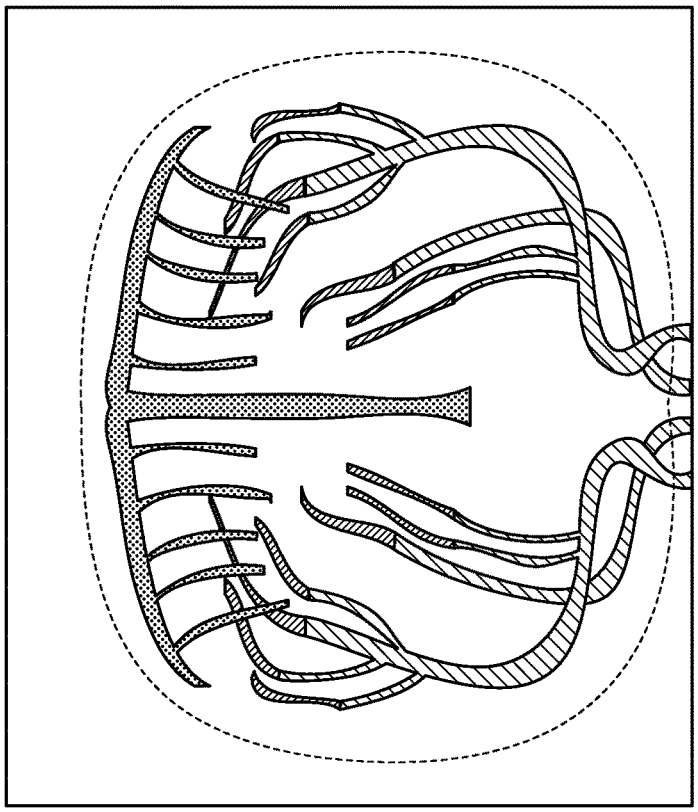
FIG. 38A is a schematic diagram illustrating a fusion image obtained by fusing the image of FIG. 37A and the image of FIG. 37B in the eleventh embodiment.

FIG. 38A is a schematic diagram illustrating a fusion image which is obtained by simply combining the image of arteries (FIG. 37A) obtained from the fluid amplitude image with the image of peripheral arteries and veins (FIG. 37B) obtained from the flow velocity image.

On the other hand, FIG. 38B is a schematic diagram illustrating a fusion image in which the arteries and the veins are distinguished from each other by performing processing of separating arteries from veins on the basis of spatial continuity of blood vessels. Specifically, spatial continuity between the blood vessels (i.e., arteries) depicted in FIG. 37A and the blood vessels depicted in FIG. 37B is determined. Out of the blood vessels depicted in FIG. 37B, each blood vessel being spatially continuous with any artery depicted in FIG. 37A is determined as an artery (i.e., a peripheral artery) and the rest (i.e., each blood vessel which is not spatially contiguous with any artery depicted FIG. 37A) is determined as veins.

In this manner, it is possible to generate a fusion image in which arteries (blood vessels indicated by oblique-line hatching regions in FIG. 38B) and veins (blood vessels indicated by dotted-hatching region in FIG. 38B) are distinguished from each other.

Twelfth Embodiment

Figure 39A:
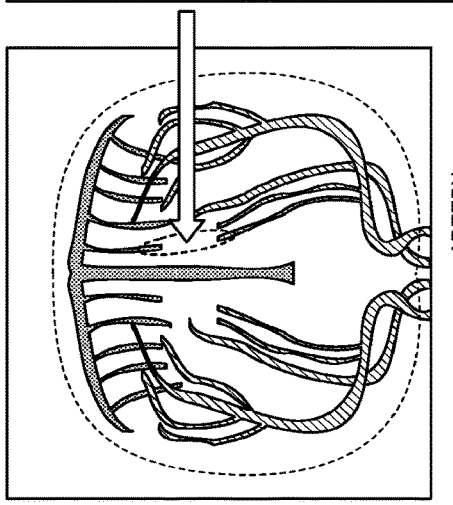
FIG. 39A to FIG. 39C are schematic diagrams illustrating a concept of generating an analysis image in the twelfth embodiment.
Figure 39B:
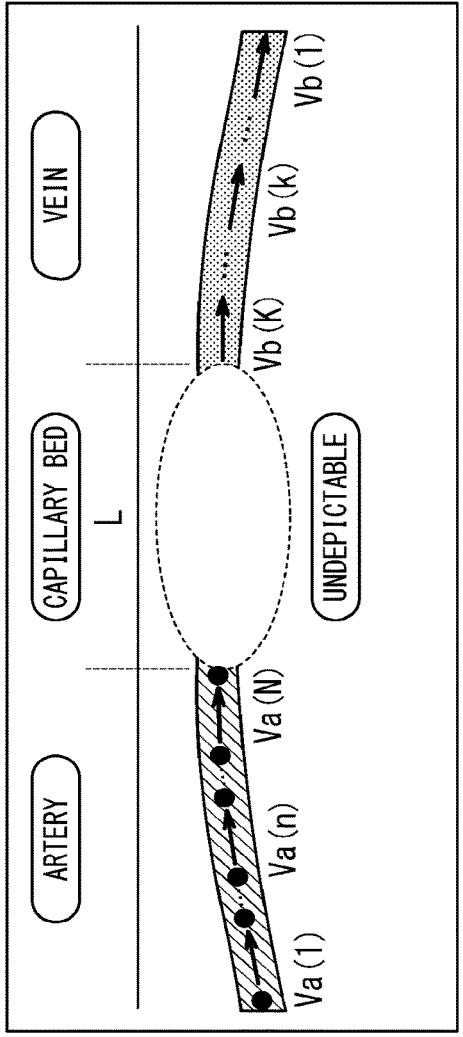
Figure 39C:
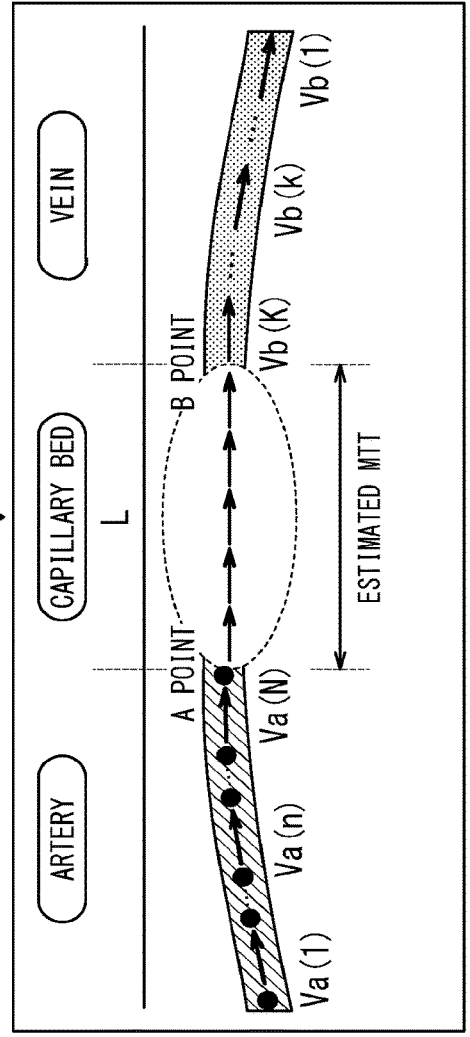

FIGS. 39A to 39C illustrate analysis images generated by the MRI apparatus 1 of the twelfth embodiment.

In general, blood flows from a main artery through an arteriole into a capillary bed. Blood flowed out of the capillary bed flows through narrow veins to a vein.

Generally, it is difficult to depict capillary vessels under normal imaging conditions due to restriction of spatial resolution and restriction of data acquisition performed by an MRI apparatus such as low SNR. Additionally, it is also difficult to measure a time for passing through the capillary bed, i.e., a time needed for blood to flow from the exit of an arteriole into the entrance of a venule through the capillary (hereinafter this passage time is referred to as a TT (Transit Time)). Although a TT is usually about 5 seconds to 10 seconds, a TT is further prolonged in the case of disease such as occlusion and stenosis. The reason why measuring the TT makes difficult will be further described as follows.

As described above, longitudinal magnetization of blood labeled by a tag pulse recovers due to longitudinal relaxation after application of the tag pulse. Thus, a waiting time TI (i.e., the elapsed time from application of the tag pulse) by which inflow blood can be depicted in a fluid amplitude image based on the ASL method is about 2 to 3 seconds. Hence, as long as the arrival time needed for blood to reach an inlet of the capillary bed from an application timing of the tag pulse is approximately 2 to 3 seconds, it is possible to obtain velocity information of arteries to the inlet of the capillary bed by analyzing the fluid amplitude image. However, it is difficult to obtain velocity information of blood inside a capillary bed from the fluid amplitude image due to restriction of spatial resolution and restriction such as SNR, and it is difficult to calculate a TT.

As described above, the fluid phase image based on the PC method is not influenced by restriction of a recovery time due to longitudinal relaxation. Thus, by analyzing the fluid phase image, it is possible to obtain velocity information of blood of veins on the downstream side of the outlet of the capillary bed. However, even if the fluid phase image is used, it is difficult to obtain velocity information inside the capillary bed due to restriction of spatial resolution and restriction such as low SNR. Thus, it is also difficult to calculate a TT from only the information of the fluid amplitude image.

That is, with the ASL method alone or the PC method alone, it is difficult to measure a transit time TT of a capillary bed.

In view of the above-described problem, the MRI apparatus 1 of the twelfth embodiment combines velocity information obtained from a fluid amplitude image based on the ASL method and velocity information obtained from a fluid phase image based on the PC method, and this combination makes it possible to estimate an average transit time TT through which blood passes from the inlet to the outlet of the capillary bed (hereinafter, this average transit time TT is referred to as a MTT (Mean Transit Time)). Hereinbelow, a description will be given of a method for estimating a MTT by referring to FIG. 39A to FIG. 39C.

FIG. 39A is the same as FIG. 38B, and FIG. 39B is an enlarged view of the elliptic part indicated by the broken line in FIG. 39A.

As described above, it is difficult to depict a capillary bed itself. However, when the tag pulse is applied to a region on the downstream side of a capillary bed (i.e., on the side of an artery), the artery from the applied position to the inlet the capillary bed can be depicted by using a fluid amplitude image obtained on the basis of the ASL method.

By using pulse sequences which can set plural waiting times TI as shown in FIG. 21 to FIG. 31D, it is possible to determine respective positions R(1) to R (n) of labeled blood corresponding to the multiple waiting times TI (1) to TI (n), wherein "n" is a positive integer from 1 to N. Then, it is possible to calculate respective velocity values Va (1) to Va (n) of blood corresponding to the plural waiting times TI (1) to TI (n) from the positions R (1) to R (n) of the labeled blood, wherein "n" is also positive integer from 1 to N. For instance, the blood velocity Va (n) can be calculated on the basis of difference between two positions R (n−1) and R(n) of adjacent labeled blood.

In the meanwhile, it is possible to calculate velocity Vb (k) of venous blood flowing out from the outlet of the capillary bed for each position k of the vein by analyzing the flow velocity image (or fluid phase image) obtained on the basis of the PC method, wherein "k" is a positive integer from 1 to K. A flow velocity image can be generated for each of plural waiting times TI (n). However, venous flow can be regarded as substantially steady flow, and thus velocity Vb (k) can be regarded as substantially constant at each position k between time phases (i.e., between plural waiting times TI (n)). Thus, an average <Vb (k)> of the velocity values Vb1 to Vb(k) at respective positions k with respect to the plural waiting times TI (n) may be treated as the velocity of the venous blood (Vb(k)=<Vb(k)>). By taking the average, SNR of each velocity of the venous blood (Vb(k) can be enhanced.

Next, length L of a capillary bed is estimated. For instance, as shown in FIG. 39C, the position of the point A, which is the inlet of the capillary bed, is calculated from the fluid amplitude image. Further, the position of the point B, which is the outlet of the capillary bed, is calculated from the flow velocity image. Then, length L of the capillary bed can be estimated from the difference between the position of the point A and the position of the point B.

It can be assumed that the blood passing through the capillary bed is nearly steady flow. In other words, it can be assumed that the velocity Va(N) at the point A and the velocity Vb(K) at the point B are almost the same in magnitude and direction. Thus, the average transit time MTT of blood passing through the capillary bed can be calculated from any one of the following three equations.

$$MTT=L/Va(N) \text{ or}$$

$$MTT=L/Vb(K) \text{ or}$$

$$MTT=L/[\{(Va(N)+Vb(K)\}/2]$$

For instance, when L=4 mm and Va(N)=Vb(K)=1 mm/sec, MTT=4 second.

According to the MRI apparatus 1 of the twelfth embodiment as described above, it is possible to estimate the average passage time MTT of the capillary bed, which cannot be calculated from information obtained only from the conventional ASL method or information obtained only from the conventional PC method.

Further, according to the MRI apparatus 1 of the twelfth embodiment, it is also possible to provide a fusion image in which pseudo velocity vectors are depicted inside the capillary bed as shown in FIG. 39C.

For instance, inside of the capillary bed can be depicted by searching for the inside from the point B on the vein side toward the point A on the artery side and using the velocity vector Vb(K). Additionally or alternatively, the inside of the capillary bed can be depicted by searching for the inside from the point A on the artery side toward the point B on the vein side and using the velocity vector Va(N). In the case of simulating labeled blood flowing through a vein in a pseudo manner, it is better to use the VENC (−) pulse or the VENC (+) pulse, intensity of which is coincide with flow velocity of the vein.

Thirteenth Embodiment

Figure 40C:
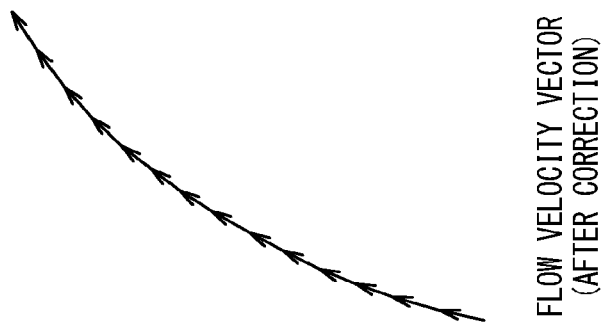
FIG. 40C is a schematic diagram illustrating a flow velocity vector after correction in the thirteenth embodiment.
Figure 40B:
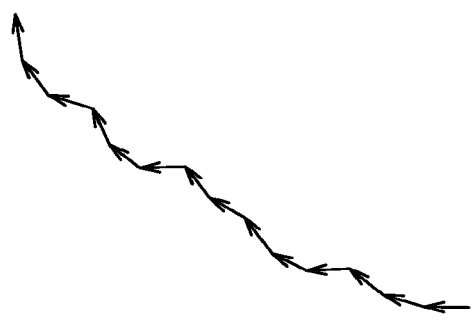
FIG. 40B is a schematic diagram illustrating a flow velocity vector before correction in the thirteenth embodiment.
Figure 40A:
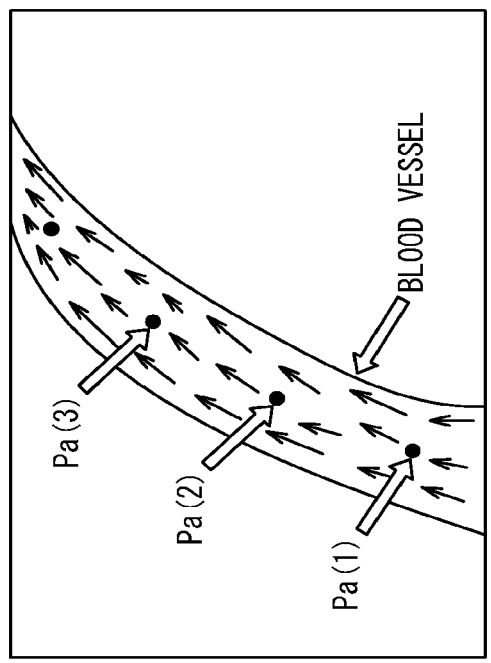
FIG. 40A is a schematic diagram illustrating positions of labeled fluid calculated from a fluid amplitude image and flow velocity vectors calculated from a flow velocity image in the thirteenth embodiment.

The MRI apparatus 1 of the thirteenth embodiment provides a method of correcting flow-velocity vector information (or flow-path information) obtained from a flow velocity image by using positional information of labeled fluid obtained from a fluid amplitude image. FIGS. 40A to 40C are schematic diagrams illustrating the concept of this method.

The black circles in FIG. 40A denote the position of labeled fluid (such as Pa (1), Pa (2), Pa (3)) obtained from the fluid amplitude image. FIG. 41B illustrates flow velocity vectors (or flow path) before correction, and FIG. 40C illustrates flow velocity vectors (or flow path) after correction.

As described above, the position of the labeled fluid obtained from the fluid amplitude image is relatively accurate. Thus, a displacement direction between two adjacent labeled fluid positions is obtained with high accuracy, although its spatial resolution may be coarse. On the other hand, the flow velocity vectors before correction obtained from the flow velocity image have high spatial resolution, but are susceptible to influence such as noise, and thus their directions and magnitude fluctuate from the true values.

Considering the above, the velocity-vector correction method described below will qualitatively provide such a method that each velocity vector is corrected so as to be strongly pulled in the displacement direction of a labeled-fluid position. Hereinafter, a more specific correction method will be described for a two-dimensional case.

Here, Ra(i, j) is defined as the displacement direction of the labeled-fluid position Pa(n) closest to the pixel position i, j) at which the velocity vector is being measured. In this definition, Ra(i, j) is vector quantity and "n" is a positive integer from 1 to N. Further, Rh (m, n) is defined as the direction from the center pixel in the m×n size kernel in the real space filter. This Rh(m, n) is also vector quantity.

Norm N(m, n, I, j) represented by the following equation (30) is determined from the inner product of Ra(i, j) and Rh(m, n).

$$N(m,n,i,j) = \langle R_h(m,n), R_a(i,j) \rangle / \{\|R_h(m,n)\| \cdot \|R_a(i,j)\|\} \quad \text{Equation (30)}$$

The norm N(m, n, i, j) shows the maximum value 1 in the direction parallel to the displacement direction of the labeled-fluid position and becomes zero in the direction perpendicular to the displacement direction.

Next, by taking the product of the kernel $H_0$(m, n) for a isotropic smoothing filter and the norm N (m, n, i, j), the filter kernel $H_1$(m, n, J), which has directionality, is calculated on the basis of the following equation (31).

$$H_1(m,n,i,j) = \langle H_0(m,n), N(m,n,i,j) \rangle \quad \text{(Equation 31)}$$

The filter kernel $H_1$ (m, n, i, j) having the directionality is obtained for each pixel position (i, j) at which a velocity vector is measured.

Next, the corrected velocity vector Vcor(i, j) is calculated from the following equation (32) by taking the convolution of the velocity vector V(i, j) before correction and the filter kernel $H_1$(m, n, i, j) having the directionality.

$$V_{cor}(i,j) = H_1(m,n,i,j) \otimes V(i,j) \quad \text{Equation (32)}$$

Distribution of the corrected velocity vectors is obtained by correcting the velocity vectors for each pixel position on the basis of the equation (32). Afterward, by tracing the velocity vectors with the use of each corrected velocity vector Vcor(i, j), smoothly continuous velocity vectors (i.e., smooth flow-path information) can be obtained as shown in FIG. 40C.

FIG. 41 illustrates the kernel $H_0$(m, n) for an isotropic smoothing filter, the norm N(m, n, i, j), and the filter kernel $H_1$(m, n, i, j) having directionality, each of which having a size of 3×3 matrix.

When the displacement direction Ra(i, j) of the labeled-fluid position is 45° like the case 1, the elements along the right oblique direction (45° direction) of the norm N(m, n, j) becomes 1. Along with this, the elements along the right oblique direction (45° direction) of the filter kernel $H_1$(m, n, j) having directionality are also enhanced.

When the displacement direction Ra(i, j) of the labeled-fluid position is 90° like the case 2, the elements along the vertical direction (90° direction) of the norm N(m, n, i, j) becomes 1. Along with this, the elements along the vertical direction (90° direction) of the filter kernel $H_1$ (m, n, i, j) having directionality are also enhanced.

The closer to the displacement direction of the labeled-fluid position, the stronger the smoothing effect of the above correction method becomes. Conversely, the smoothing effect of the above correction method becomes weak in the direction perpendicular to the displacement direction of the labeled-fluid position. For the case of isotropic smoothing, there is a possibility of being blurred in all the directions. However, according to the above-described smoothing method using the filter kernel having directionality, the possibility is increased that each velocity vector becomes aligned in the displacement direction, which is obtained from the labeled fluid position and shows high accuracy.

Further, since noise is dominant in a velocity component in a stationary tissue portion, calculation time can be shortened by extracting only the blood vessel region from the fluid amplitude image and performing the above-described correction processing only on the extracted blood vessel region.

Fourteenth Embodiment

The fourteenth embodiment is configured as an image analysis apparatus 400a which receives data from the MRI apparatus 1 of each of the above-described embodiments and performs image analysis on the received data.

Figure 42:
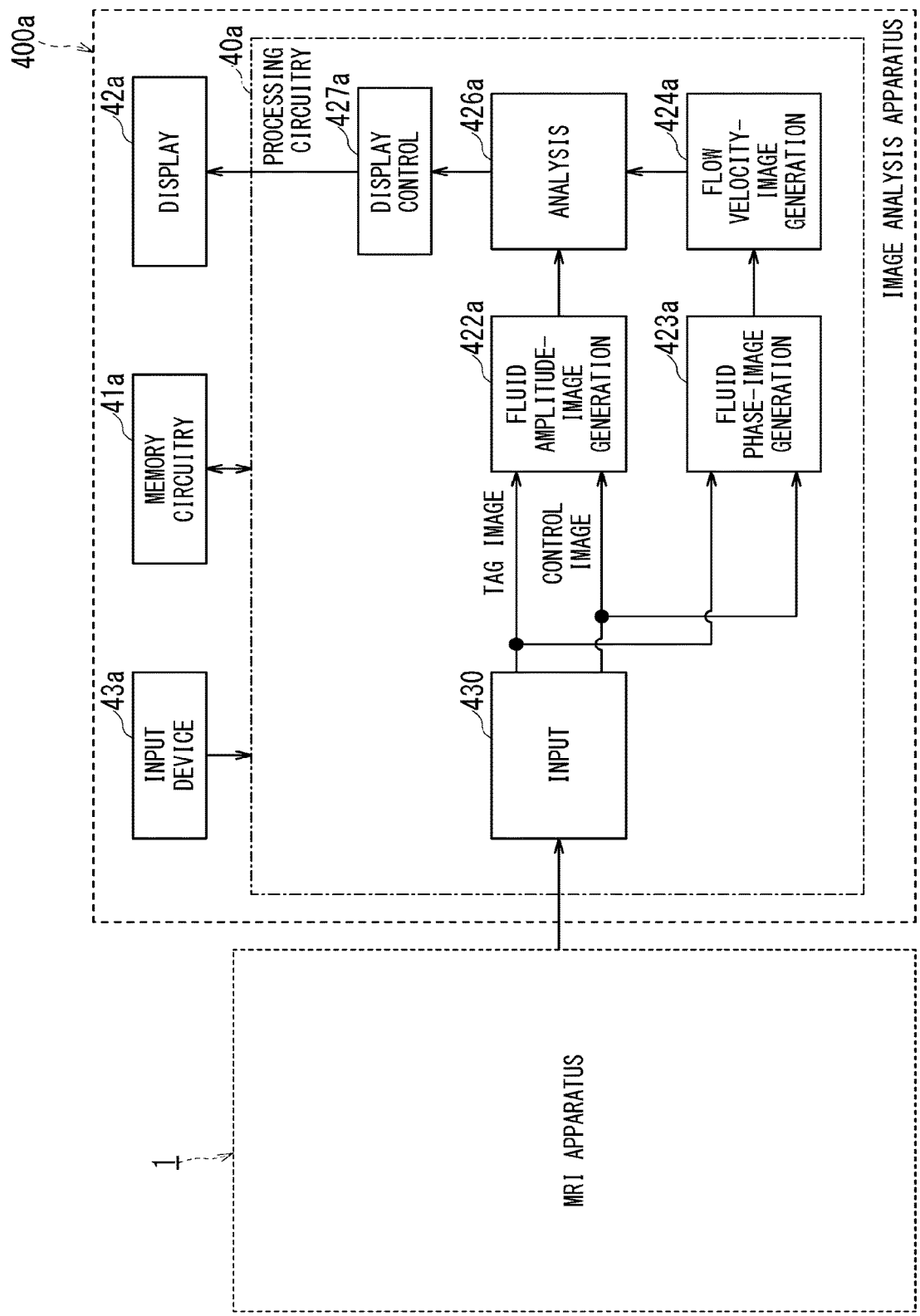
FIG. 42 is a block diagram illustrating configuration of the image analysis apparatus of the fourteenth embodiment.

FIG. 42 is a block diagram illustrating configuration of the image analysis apparatus 400a of the fourteenth embodiment. The image analyzing apparatus 400a is configured as a computer equipped with processing circuitry 40a, memory circuitry 41a, a display 42a, and an input device 43a.

The processing circuitry 40a, the memory circuitry 41a, the display 42a, and the input device 43a are almost the same as the processing circuitry 40, the memory circuitry 41, the display 42, and the input device 43 of the console 400 of the MRI apparatus 1 in FIG. 2 and FIG. 32 in terms of configuration and function, respectively. Thus, duplicate description thereof is omitted.

The processing circuitry 40a implements an input function 430, a fluid-amplitude-image generation function 422a, a fluid-phase-image generation function 423a, a flow-velocity-image generation function 424a, an analysis function 426a, and a display control function 427a.

Excluding the input function 430, all of the above functions 422a, 423a, 424a, 426a, and 427a are respectively the same as the fluid-amplitude-image generation function 422, the fluid-phase-image generation function 423, the flow-velocity-image generation function 424, the analysis function 426, and the display control function 427 in FIG. 2 and FIG. 32, and duplicate description is omitted.

The input function 430 receives, as input, data of each tag image and each control image, both of which are complex images generated by the MRI apparatus 1. The input function 430 provides the data of each tag image and each control image to the fluid-amplitude-image generation function 422a and the fluid-phase-image generation function 423a. The fluid-amplitude-image generation function 422a, the fluid-phase-image generation function 423a, the flow-velocity-image generation function 424a, the analysis function 426a, and the display control function 427a perform the processing of the steps ST103 to ST107 in FIG. 3 and FIG. 33. Since the processing of each of the steps ST103 to ST107 has already been described, duplicate description is omitted.

When a fluid amplitude image and a fluid phase image (or a flow velocity image) are generated in the MRI apparatus 1, the input function 430 may acquire data of these images and provides those data to the analysis function 426a.

As described above, the MRI apparatus 1 of each embodiment can obtain advantages of both of the ASL method and the PC method for the same imaging target in a short imaging time.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Hereinafter, some examples of various aspects of MRI apparatuses and image analysis apparatuses according to each of the above embodiments and their modifications will be described.

<Aspect 1>

An MRI apparatus comprising:

a scanner equipped with at least a static magnetic field magnet configured to generate a static magnetic field, a gradient coil configured to apply gradient pulses, and an RF coil configured to apply RF pulses to an object and receive magnetic resonance signals from the object; and processing circuitry configured to set at least one pulse sequence which includes a labeling sequence and an acquisition sequence to be applied posterior to the labeling sequence, the labeling sequence including a tag pulse for changing magnitude of longitudinal magnetization of fluid of the object, the acquisition sequence including a velocity-encode pulse for changing a phase of transverse magnetization of the fluid in accordance with velocity of the fluid, generate an amplitude image of the fluid and a phase image of the fluid from magnetic resonance signals which the scanner acquires by applying the at least one pulse sequence to the object, and generate an analysis image by fusing dynamic information of the fluid included in the amplitude image and velocity information of the fluid included in the phase image.

<Aspect 2>

The MRI apparatus according to the Aspect 1, further comprising a display, wherein the processing circuitry is configured to cause the display to display the analysis image.

<Aspect 3>

The MRI apparatus according to the Aspect 1, wherein the processing circuitry is configured to set the at least one pulse sequence (a) in such a manner that the at least one pulse sequence includes a plurality of pulse sequences, respective waiting times of which are interval from application of the tag pulse to start of the acquisition sequence and are different from each other, or (b) in such a manner that the at least one pulse sequence includes a plurality of acquisition sequences applied subsequent to the tag pulse and respective waiting times from the tag pulse to each of the plurality of acquisition sequences are different from each other.

<Aspect 4>

The MRI apparatus according to the Aspect 3, wherein the processing circuitry is configured to generate a plurality of amplitude images corresponding to the respective waiting times and a plurality of phase images corresponding to the respective waiting times, calculate positions of labeled fluid labeled by the tag pulse corresponding to the respective waiting times from the plurality of amplitude images as dynamic information, calculate a velocity vector or a streamline of the fluid from the plurality of phase images, and generate the analysis image by superimposing the velocity vector or the streamline on respective positions of the labeled fluid.

<Aspect 5>

The MRI apparatus according to the Aspect 2, wherein the processing circuitry is configured to cause the display to display a morphological image including a TI weighted image in such a manner that the morphological image is superimposed on the analysis image or is displayed in parallel with the analysis image.

<Aspect 6>

The MRI apparatus according to the Aspect 3, wherein the processing circuitry is configured to calculate each position of labeled fluid from an inflow position of the labeled fluid into an imaging region to a predetermined position in the imaging region by using the amplitude image, and estimate each position of the labeled fluid further moved from the predetermined position by using flow velocity calculated from the phase image.

<Aspect 7>

The MRI apparatus according to the Aspect 6, wherein a target region for the processing circuitry to calculate each position of the labeled fluid by using the amplitude image is an artery region up to a capillary bed, and a target region for the processing circuitry to estimate each position of the labeled fluid by using the flow velocity is a vein region flowing out from the capillary bed.

<Aspect 8>

The MRI apparatus according to the Aspect 7, wherein the processing circuitry is configured to estimate an average transit time by using a first flow velocity obtained from the amplitude image and a second flow velocity obtained from the phase image, the average transit time being a time needed for blood to pass through a capillary bed.

<Aspect 9>

The MRI apparatus according to the Aspect 6, wherein a target region for the processing circuitry to calculate each position of the labeled fluid by using the amplitude image is such a region that the waiting time corresponds to a period shorter than a recovery time in which magnitude of longitudinal magnetization generated by the tag pulse can be measured.

<Aspect 10>

The MRI apparatus according to the Aspect 1, wherein the processing circuitry is configured to generate an image of an artery from the amplitude image and generate an image of a blood vessel having slow flow velocity from the phase image.

<Aspect 11>
The MRI apparatus according to the Aspect 10,
wherein the processing circuitry is configured to
distinguish a blood vessel having slow flow velocity into a peripheral artery and a vein from spatial continuity between the artery and the blood vessel having slow flow velocity, and
generate a fusion image, in which the artery and the vein are distinguished, as the analysis image.

<Aspect 12>
The MRI apparatus according to the Aspect 1,
wherein the processing circuitry is configured to correct fluctuation of a velocity vector included in the phase image by using positional information of the labeled fluid in the amplitude image.

<Aspect 13>
The MRI apparatus according to the Aspect 11,
wherein the processing circuitry is configured to correct fluctuation of a velocity vector included in the phase image by using a filter kernel and smoothing the velocity vector, the filter kernel being strongly smoothed in a displacement direction of a position of the labeled fluid.

<Aspect 14>
An image analysis apparatus comprising:
an input circuit configured to receive image data acquired by at least one pulse sequence which includes a labeling sequence and an acquisition sequence to be applied posterior to the labeling sequence, the labeling sequence including a tag pulse for changing magnitude of longitudinal magnetization of fluid of an object, the acquisition sequence including a velocity-encode pulse for changing a phase of transverse magnetization of the fluid in accordance with velocity of the fluid; and
processing circuitry configured to
generate an amplitude image of the fluid and a phase image of the fluid from the image data, and
generate an analysis image by fusing dynamic information of the fluid included in the amplitude image and velocity information of the fluid included in the phase image.

What is claimed is:
1. An MRI apparatus comprising:
a scanner equipped with at least a static magnetic field magnet configured to generate a static magnetic field, a gradient coil configured to apply gradient pulses, and an RF coil configured to apply RF pulses to an object and receive magnetic resonance signals from the object; and
processing circuitry configured to
set at least one pulse sequence which includes a labeling pulse for labeling fluid in the object, an excitation pulse applied after the labeling pulse, and a bipolar or unipolar velocity encoding gradient pulse for encoding velocity information of the fluid, the bipolar or unipolar velocity encoding pulse being applied after the excitation pulse, and
generate an image of the fluid from the magnetic resonance signals which the scanner acquires by performing the at least one pulse sequence.

2. The MRI apparatus according to claim 1,
wherein the processing circuitry is configured to
generate a complex image by reconstructing the magnetic resonance signals,
generate an amplitude image using amplitude information included in the complex image, and
generate a phase image using phase information included in the complex image.

3. The MRI apparatus according to claim 1,
wherein the labeling pulse includes a tag pulse which changes magnitude of longitudinal magnetization of the fluid; and
the tag pulse is one of an inversion pulse for inverting the longitudinal magnetization of the fluid, a saturation pulse for making a longitudinal magnetization component of the fluid zero, and an RF pulse for rotating the longitudinal magnetization by a predetermined flip angle.

4. The MRI apparatus according to claim 1, wherein
the at least one pulse sequence comprises a first pulse sequence and a second pulse sequence;
the labeling pulse comprises a tag pulse and a control pulse, the tag pulse changing magnitude of longitudinal magnetization of the fluid, and the control pulse being applied to a region different from an application region of the tag pulse;
the first pulse sequence includes a first labeling sequence and a first acquisition sequence, the first labeling sequence including the tag pulse, the first acquisition sequence including a velocity-encode gradient pulse of positive or negative polarity;
the second pulse sequence includes a second labeling sequence and a second acquisition sequence, the second labeling sequence including the control pulse, the second acquisition sequence including a velocity-encode gradient pulse which has polarity opposite to polarity of the velocity-encode gradient pulse of the first acquisition sequence; and
the processing circuitry is configured to generate an amplitude image and a phase image from a difference image between a first image and a second image, the first image being reconstructed from the magnetic resonance signals acquired by the first pulse sequence, and the second image being reconstructed from the magnetic resonance signals acquired by the second pulse sequence.

5. The MRI apparatus according to claim 4,
wherein the processing circuitry is configured to set the first pulse sequence and the second pulse sequence in such a manner that the velocity-encode gradient pulse of each of the first pulse sequence and the second pulse sequence is applied in a blood flow direction of the object.

6. The MRI apparatus according to claim 1, wherein
the at least one pulse sequence comprises a first pulse sequence, a second pulse sequence, a third pulse sequence, a fourth pulse sequence, a fifth pulse sequence, and a sixth pulse sequence;
the labeling pulse includes a tag pulse and a control pulse, the tag pulse changing magnitude of longitudinal magnetization of the fluid, and the control pulse being applied to a region different from an application region of the tag pulse;
each of the first, second, and third pulse sequences includes in common a first labeling sequence containing the tag pulse and a positive-polarity acquisition sequence, and the positive-polarity acquisition sequence of each of the first, second, and third pulse sequences respectively includes a velocity-encode pulse of positive polarity applied only in an X-axis direction, a velocity-encode pulse of positive polarity applied only in a Y-axis direction, and a velocity-encode pulse of positive polarity applied only in a Z-axis direction;

each of the fourth, fifth, and sixth pulse sequences includes in common a second labeling sequence containing the control pulse and a negative-polarity acquisition sequence, and the negative-polarity acquisition sequence of each of the fourth, fifth, and sixth pulse sequences respectively includes a velocity-encode pulse of negative polarity applied only in the X-axis direction, a velocity-encode pulse of negative polarity applied only in the Y-axis direction, and a velocity-encode pulse of negative polarity applied only in the Z-axis direction; and the processing circuitry is configured to generate an amplitude image and a phase image from a first difference image, a second difference image, and a third difference image, the phase image being an image expressed by velocity vectors each of which includes three spatial components, the first difference image being a difference image between a first image acquired from the first pulse sequence and a fourth image acquired from the fourth pulse sequence, the second difference image being a difference image between a second image acquired from the second pulse sequence and a fifth image acquired from the fifth pulse sequence, and the third difference image being a difference image between a third image acquired from the third pulse sequence and a sixth image acquired from the sixth pulse sequence.

7. The MRI apparatus according to claim 1, wherein the at least one pulse sequence comprises a first pulse sequence, a second pulse sequence, a third pulse sequence, a fourth pulse sequence, a fifth pulse sequence, and a sixth pulse sequence;

the labeling pulse includes a tag pulse and a control pulse, the tag pulse changing magnitude of longitudinal magnetization of the fluid, and the control pulse being applied to a region different from an application region of the tag pulse; and each of the first, second, and third pulse sequences includes in common a first labeling sequence containing the tag pulse and a negative-polarity acquisition sequence, and the negative-polarity acquisition sequence of each of the first, second, and third pulse sequences respectively includes a velocity-encode pulse of negative polarity applied only in an X-axis direction, a velocity-encode pulse of negative polarity applied only in a Y-axis direction, and a velocity-encode pulse of negative polarity applied only in a Z-axis direction;

each of the fourth, fifth, and sixth pulse sequences in common includes a second labeling sequence containing the control pulse and a positive-polarity acquisition sequence, and the positive-polarity acquisition sequence of each of the fourth, fifth, and sixth pulse sequences respectively includes a velocity-encode pulse of positive polarity applied only in the X-axis direction, a velocity-encode pulse of positive polarity applied only in the Y-axis direction, and a velocity-encode pulse of positive polarity applied only in the Z-axis direction; and the processing circuitry is configured to generate an amplitude image and a phase image from a first difference image, a second difference image, and a third difference image, the phase image being an image expressed by velocity vectors each of which includes three spatial components, the first difference image being a difference image between a first image acquired from the first pulse sequence and a fourth image acquired from the fourth pulse sequence, the second difference image being a difference image between a second image acquired from the second pulse sequence and a fifth image acquired from the fifth pulse sequence, and the third difference image being a difference image between a third image acquired from the third pulse sequence and a sixth image acquired from the sixth pulse sequence.

8. The MRI apparatus according to claim 1, wherein the at least one pulse sequence comprises a first pulse sequence, a second pulse sequence, a third pulse sequence, and a fourth pulse sequence;

the labeling pulse includes a tag pulse and a control pulse, the tag pulse changing magnitude of longitudinal magnetization of the fluid, and the control pulse being applied to a region different from an application region of the tag pulse;

an acquisition sequence of each of the first to fourth pulse sequences includes respective three velocity-encode pulses of positive or negative polarity applied in X-axis, Y-axis, and Z-axis directions under a Hadamard encode method, and each of two of the first to fourth pulse sequences includes a first labeling sequence containing the tag pulse while each of a rest of the first to fourth pulse sequences includes a second labeling sequence containing the control pulse, and the processing circuitry is configured to generate an amplitude image and a phase image from a first image, a second image, a third image, and a fourth image, the first to fourth images being generated from magnetic resonance signals acquired by the first to fourth pulse sequences, respectively, and the phase image being an image expressed by velocity vectors each of which includes three spatial components.

9. The MRI apparatus according to claim 1, wherein the at least one pulse sequence includes a pulse sequence in which rephasing gradient pulse is applied after the excitation pulse, a first magnetic resonance signal is acquired after application of the rephasing gradient pulse, a velocity-encode pulse is applied after acquisition of the first magnetic resonance signal, and a second magnetic resonance signal is acquired after application of the velocity-encode pulse; and the processing circuitry is configured to generate an amplitude image from the first magnetic resonance signal and generate a phase image from the second magnetic resonance signal.

10. The MRI apparatus according to claim 1, wherein the at least one pulse sequence comprises a plurality of pulse sequences;

the labeling pulse includes a tag pulse and a control pulse, the tag pulse changing magnitude of longitudinal magnetization of the fluid, and the control pulse being applied to a region different from an application region of the tag pulse, each of the plurality of pulse sequences includes a labeling sequence and an acquisition sequence, the labeling sequence including plural tag pulses or plural control pulses, and the acquisition sequence including three velocity-encode pulses of positive or negative polarity applied in X-axis, Y-axis, and Z-axis directions, respectively, and a waiting time between start of the acquisition sequence and an application timing of each of the plural tag pulses or plural control pulses is set to a value different for each tag pulse or control pulse, and the processing circuitry is configured to generate plural amplitude images and a phase image by performing addition/subtraction on respective plural images acquired by the plurality of pulse sequences, the plural amplitude images being different in moving time of the fluid from an application region of the tag pulse from each other, and the phase image being an image expressed by velocity vectors each of which includes three spatial components.

11. The MRI apparatus according to claim 1,
wherein the at least one pulse sequence comprises a pulse sequence which includes a labeling sequence and a plurality of acquisition sequences applied posterior to the labeling sequence;
the labeling pulse includes a tag pulse and a control pulse, the tag pulse changing magnitude of longitudinal magnetization of the fluid, and the control pulse being applied to a region different from an application region of the tag pulse; and
a waiting time between an application timing of the tag pulse in the labeling sequence and start of each of the plurality of acquisition sequences is set to a value different for each acquisition sequence, and
the processing circuitry is configured to generate plural amplitude images and a phase image from respective plural images acquired by the plurality of acquisition sequences, the plural amplitude images being different in moving time of the fluid from an application region of the tag pulse from each other.

12. The MRI apparatus according to claim 1, wherein
the labeling pulse includes a tag pulse and a control pulse, the tag pulse changing magnitude of longitudinal magnetization of the fluid, and the control pulse being applied to a region different from an application region of the tag pulse; and
the processing circuitry is configured to set the at least one pulse sequence (a) in such a manner that the tag pulse is applied to a region on an upstream side of an imaging region and the control pulse is applied to a region on a downstream side of the imaging region or (b) in such a manner that the tag pulse is applied to a sum region of the imaging region and an upstream side of the imaging region and the control pulse is applied to the imaging region.

13. An MRI apparatus comprising:
a scanner equipped with at least a static magnetic field magnet configured to generate a static magnetic field, a gradient coil configured to apply gradient pulses, and an RF coil configured to apply RF pulses to an object and receive magnetic resonance signals from the object; and
processing circuitry configured to
set a first pulse sequence which includes a tag pulse and a first excitation pulse applied after the tag pulse and a second pulse sequence which includes a control pulse and a second excitation pulse applied after the control pulse, wherein the first pulse sequence includes a first velocity encoding gradient pulse for encoding velocity information of fluid, the first velocity encoding gradient pulse being applied after the first excitation pulse, and the second pulse sequence includes a second velocity encoding gradient pulse for encoding velocity information of the fluid, the second velocity encoding gradient pulse being applied after the second excitation pulse, and
generate an image of the fluid from the magnetic resonance signals which the scanner acquires by performing the first and the second pulse sequences.

14. The MRI apparatus comprising according to claim 13, wherein the first velocity encoding gradient pulse in the first pulse sequence and the second velocity encoding gradient pulse in the second pulse sequence are of different types.

15. The MRI apparatus comprising according to claim 14, wherein the first velocity encoding gradient pulse and the second velocity encoding gradient pulse are of different polarities.

16. The MRI apparatus comprising according to claim 13, wherein the tag pulse is applied for labeling the fluid in the object, while the control pulse is applied for suppressing a magnetization transfer (MT) effect.

* * * * *